(12) United States Patent
Koyama

(10) Patent No.: US 8,120,557 B2
(45) Date of Patent: Feb. 21, 2012

(54) LIGHT EMITTING DEVICE AND ELECTRONIC APPLIANCE

(75) Inventor: Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 118 days.

(21) Appl. No.: 12/760,598

(22) Filed: Apr. 15, 2010

(65) Prior Publication Data

US 2010/0201721 A1    Aug. 12, 2010

Related U.S. Application Data

(63) Continuation of application No. 12/025,072, filed on Feb. 4, 2008, now Pat. No. 7,719,498, which is a continuation of application No. 10/858,387, filed on Jun. 2, 2004, now Pat. No. 7,336,035, which is a continuation of application No. 10/077,830, filed on Feb. 20, 2002, now Pat. No. 6,753,654.

(30) Foreign Application Priority Data

Feb. 21, 2001 (JP) ................................. 2001-045644

(51) Int. Cl.
*G09G 3/32* (2006.01)

(52) U.S. Cl. ......... 345/82; 345/76; 345/690; 315/169.1; 315/169.3

(58) Field of Classification Search ................ 315/169.1, 315/169.3; 345/76, 77, 82, 690; 257/59
See application file for complete search history.

(56) References Cited

U.S. PATENT DOCUMENTS

| | | | |
|---|---|---|---|
| 4,996,523 A | 2/1991 | Bell et al. |
| 5,684,365 A | 11/1997 | Tang et al. |
| 5,952,789 A | 9/1999 | Stewart et al. |
| 5,990,629 A | 11/1999 | Yamada et al. |
| 6,023,259 A | 2/2000 | Howard et al. |
| 6,091,203 A | 7/2000 | Kawashima et al. |
| 6,246,180 B1 | 6/2001 | Nishigaki |
| 6,307,322 B1 | 10/2001 | Dawson et al. |
| 6,351,077 B1 | 2/2002 | Koyama |
| 6,351,078 B1 | 2/2002 | Wang et al. |
| 6,380,876 B1 | 4/2002 | Nagao |

(Continued)

FOREIGN PATENT DOCUMENTS

EP         365445 A3    4/1990

(Continued)

OTHER PUBLICATIONS

Bae et al.; "A Novel Pixel Design for an Active Matrix Organic Light Emitting Diode Display"; SID 2000; pp. 358-361, 2000.

(Continued)

*Primary Examiner* — Tho G Phan
(74) *Attorney, Agent, or Firm* — Fish & Richardson P.C.

(57) ABSTRACT

The present invention is to provide a light emitting device capable of obtaining a certain luminance without influence by the temperature change, and a driving method thereof. A current mirror circuit formed by using a transistor is provided for each pixel. The first transistor and the second transistor of the current mirror circuit are connected such that the drain currents thereof are maintained at proportional values regardless of the load resistance value. Thereby, a light emitting device capable of controlling the OLED driving current and the luminance of the OLED by controlling the drain current of the first transistor at a value corresponding to a video signal in a driving circuit, and supplying the drain current of the second transistor to the OLED, is provided.

16 Claims, 31 Drawing Sheets

U.S. PATENT DOCUMENTS

| | | |
|---|---|---|
| 6,452,341 B1 | 9/2002 | Yamauchi et al. |
| 6,486,606 B1 | 11/2002 | Ting |
| 6,496,130 B2 | 12/2002 | Nagao |
| 6,556,176 B1 | 4/2003 | Okuyama et al. |
| 6,686,858 B2 | 2/2004 | Nagao |
| 6,753,654 B2 | 6/2004 | Koyama |
| 6,765,549 B1 | 7/2004 | Yamazaki et al. |
| 6,765,560 B1 | 7/2004 | Ozawa |
| 6,777,712 B2 | 8/2004 | Sanford et al. |
| 6,859,193 B1 | 2/2005 | Yumoto |
| 7,042,426 B2 | 5/2006 | Shin |
| 7,046,240 B2 * | 5/2006 | Kimura ............... 345/212 |
| 7,122,970 B2 | 10/2006 | Ono et al. |
| 7,180,245 B2 * | 2/2007 | Yamazaki et al. ......... 315/169.3 |
| 7,193,591 B2 * | 3/2007 | Yumoto ............... 345/82 |
| 7,193,594 B1 | 3/2007 | Yamazaki et al. |
| 7,317,434 B2 | 1/2008 | Lan et al. |
| 7,336,251 B2 * | 2/2008 | Osada ............... 345/92 |
| 7,834,556 B2 * | 11/2010 | Yamamoto et al. ......... 315/169.1 |
| 8,026,877 B2 * | 9/2011 | Osame et al. ............... 345/82 |
| 2001/0055828 A1 | 12/2001 | Kaneko et al. |
| 2002/0135313 A1 | 9/2002 | Koyama |
| 2002/0180369 A1 | 12/2002 | Koyama |
| 2003/0062524 A1 | 4/2003 | Kimura |
| 2003/0189206 A1 | 10/2003 | Koyama |
| 2004/0129933 A1 | 7/2004 | Nathan et al. |
| 2006/0027807 A1 | 2/2006 | Nathan et al. |
| 2006/0054893 A1 | 3/2006 | Nathan et al. |
| 2006/0267908 A1 | 11/2006 | Yamazaki et al. |

FOREIGN PATENT DOCUMENTS

| | | |
|---|---|---|
| EP | 717446 A2 | 6/1996 |
| EP | 1037192 A2 | 9/2000 |
| EP | 1039440 A4 | 9/2000 |
| EP | 1054512 B1 | 11/2000 |
| EP | 1130565 A1 | 9/2001 |
| EP | 1724927 A1 | 11/2006 |
| JP | 2148687 U | 6/1990 |
| JP | 4328791 A | 11/1992 |
| JP | 8234683 A | 9/1996 |
| JP | 10214060 A | 8/1998 |
| JP | 10319908 A | 12/1998 |
| JP | 11282419 A | 10/1999 |
| JP | 2000040924 A | 2/2000 |
| JP | 2000056847 A | 2/2000 |
| JP | 2000105574 A | 4/2000 |
| JP | 2000122608 A | 4/2000 |
| JP | 2000138572 A | 5/2000 |
| JP | 2000221942 A | 8/2000 |
| JP | 2000267164 A | 9/2000 |
| JP | 2000276108 A | 10/2000 |
| JP | 2000330527 A | 11/2000 |
| JP | 2001005410 A | 1/2001 |
| JP | 2001006484 | 1/2001 |
| JP | 200136408 | 2/2001 |
| JP | 200142822 | 2/2001 |
| JP | 2001042826 A | 2/2001 |
| JP | 2001147659 A | 5/2001 |
| JP | 2004531751 A | 10/2004 |
| WO | WO9965012 A3 | 3/2000 |
| WO | WO0106484 A1 | 1/2001 |
| WO | WO0191095 A1 | 11/2001 |
| WO | WO02067327 A2 | 8/2002 |

OTHER PUBLICATIONS

Baldo et al.; "Highly efficient phosphorescent emission from organic electroluminescent devices"; Nature, vol. 395; pp. 151-154; Sep. 10, 1998.

Baldo et al.; "Very high-efficiency green organic light-emitting devices based on electrophosphorescence"; Applied Physics Letters, vol. 75(1); pp. 4-6; Jul. 5, 1999.

Sedra/Smith; MOS Differential Amplifiers; Micro-Electronics Circuits Chapter 6.7; pp. 447-456; Saunders College Publishing 1991.

Tsutsui et al.; "High Quantum Efficiency in Organic Light-Emitting Devices with Iridium-Complex as a Triplet Emissive Center"; Japan Journal of Applied Physics, vol. 38; pp. L1502-L1504; Part 2, No. 12B; Dec. 15, 1999.

Yumoto et al.; "Pixel-Driving Methods for Large-Sized Poly-Si AM-OLED Displays"; Asia Display / IDW '01; pp. 1395-1398; 2001.

\* cited by examiner

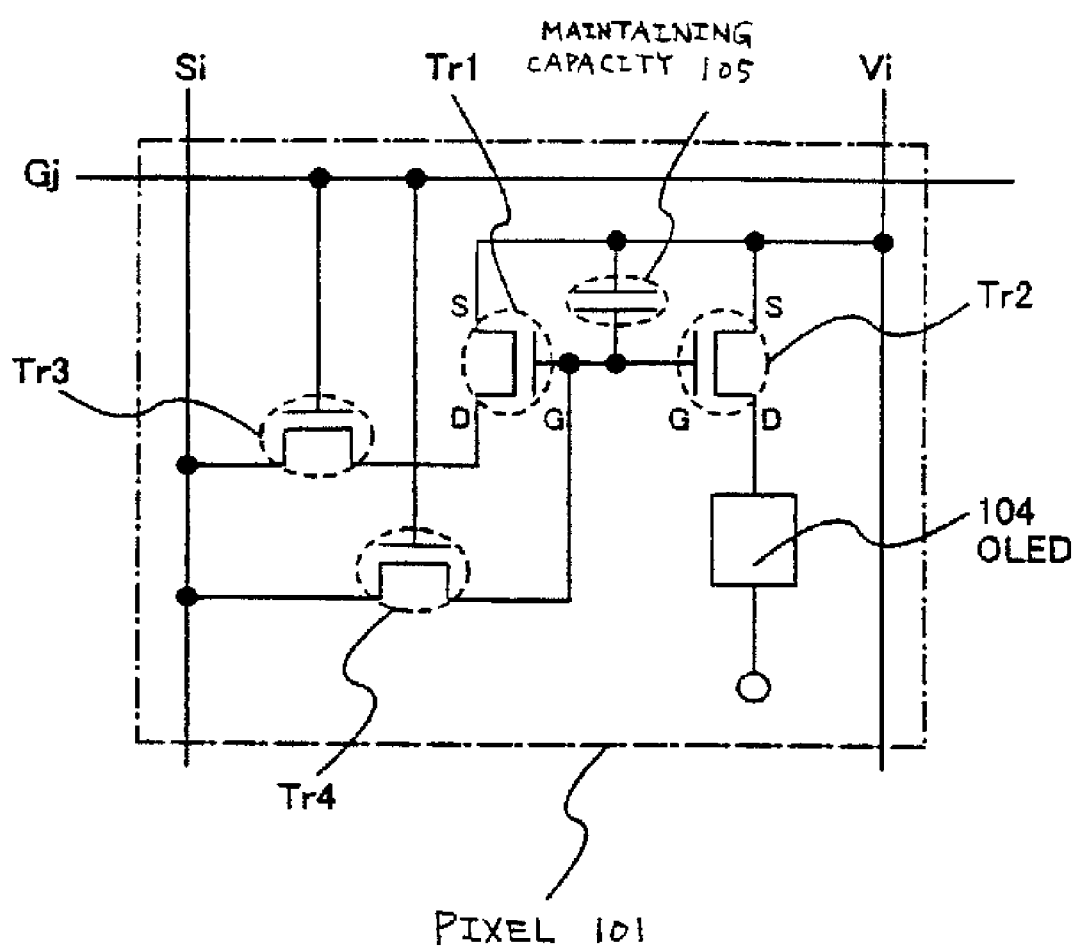

FIG. 3A WRITING PERIOD Ta
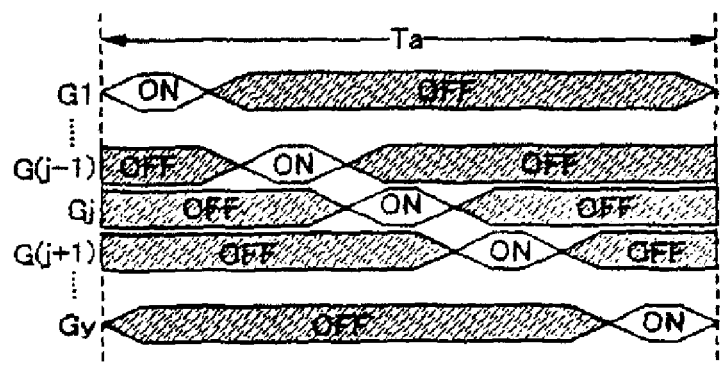
FIG. 3B DISPLAY PERIOD Td

FIG. 4A  WRITING PERIOD $T_a$
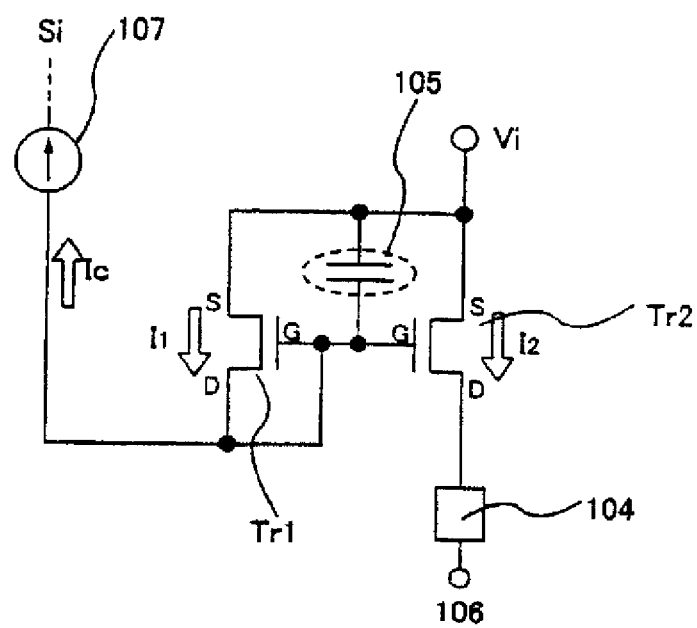
FIG. 4B  DISPLAY PERIOD $T_d$
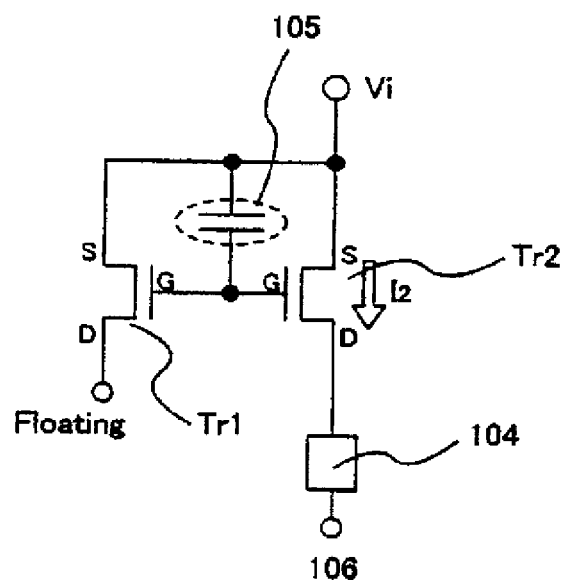

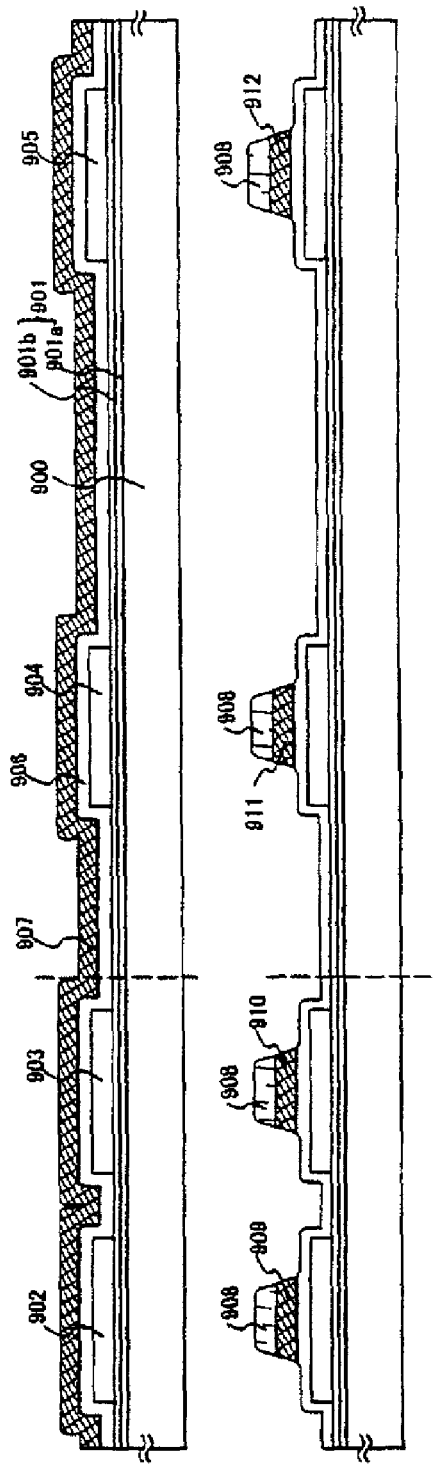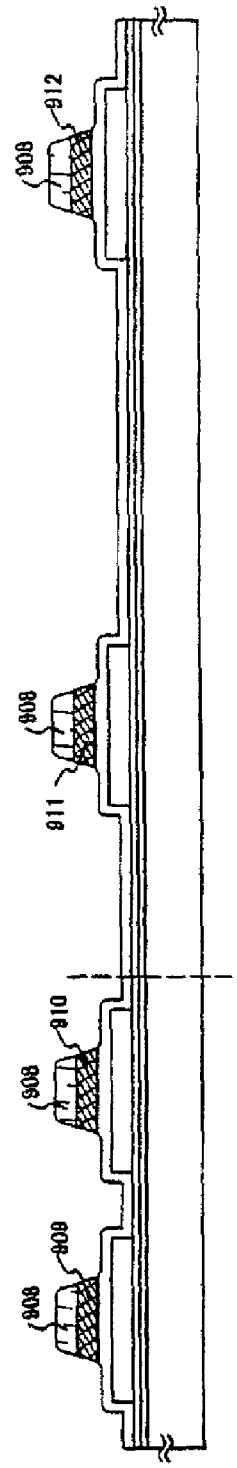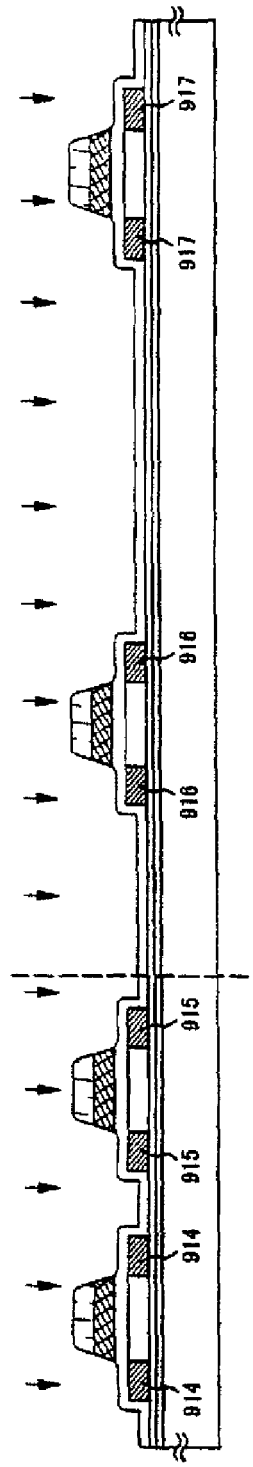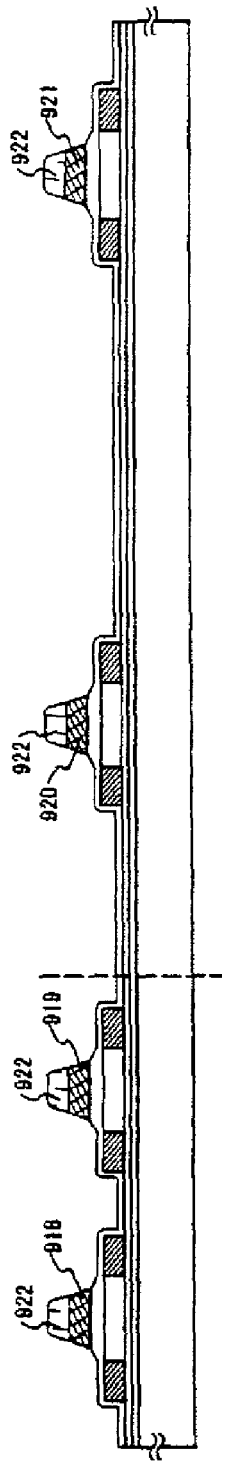

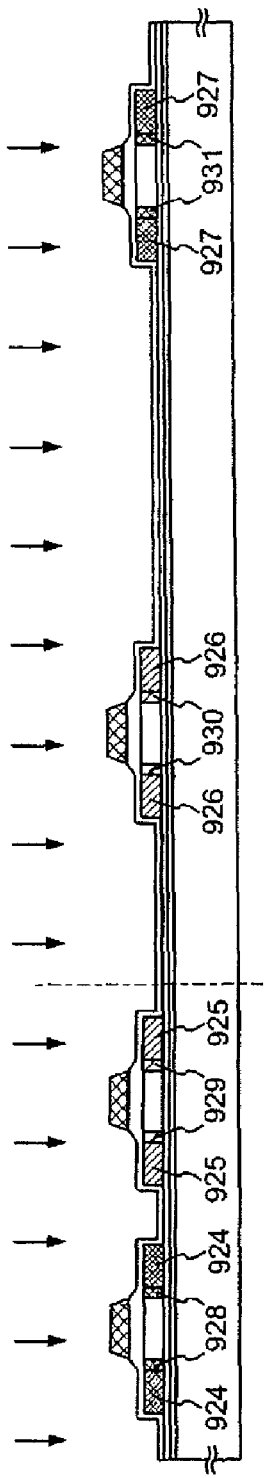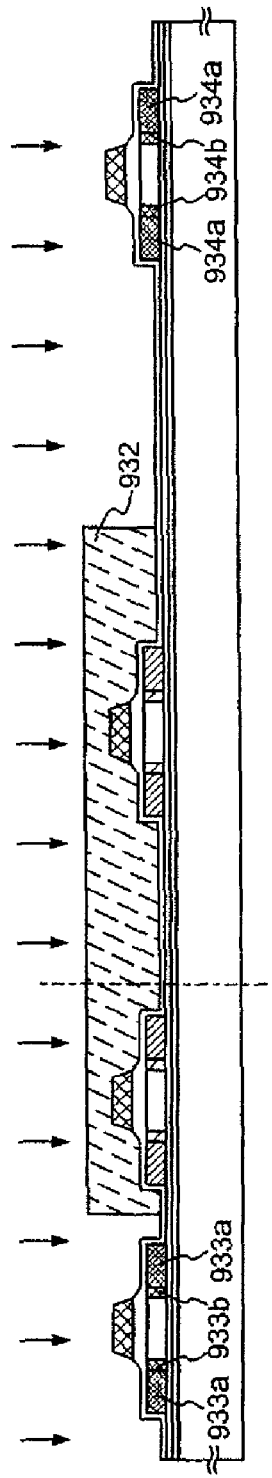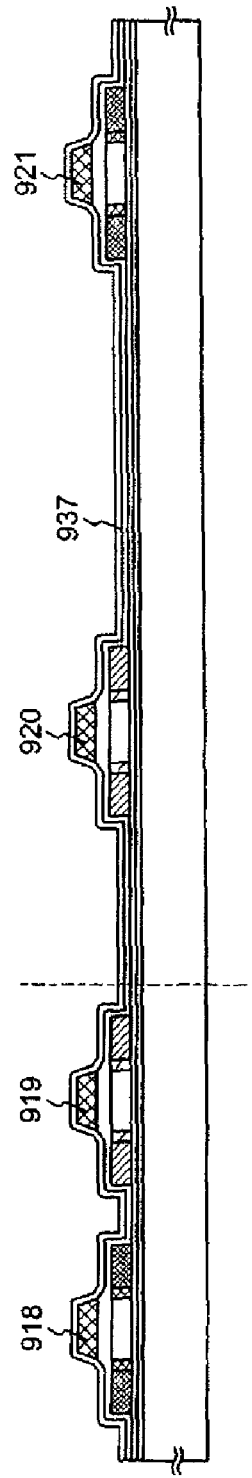

LIGHT EMITTING DEVICE AND ELECTRONIC APPLIANCE

CROSS-REFERENCE TO RELATED APPLICATIONS

This application is a continuation of U.S. application Ser. No. 12/025,072, filed Feb. 4, 2008, now allowed, which is a continuation of U.S. application Ser. No. 10/858,387, filed Jun. 2, 2004, now U.S. Pat. No. 7,336,035, which is a continuation of U.S. application Ser. No. 10/077,830, filed Feb. 20, 2002, now U.S. Pat. No. 6,753,654, which claims the benefit of a foreign priority application filed in Japan as Serial No. 2001-045644 on Feb. 21, 2001, all of which are incorporated by reference.

BACKGROUND OF THE INVENTION

1. Field of the Invention

The present invention relates to an OLED panel having an organic OLED (OLED: organic light emitting device) formed on a substrate, sealed between the substrate and a cover material. Moreover, it relates to an OLED module having an IC, or the like including a controller packaged on the OLED panel. In this specification, both the OLED panel and the OLED module are referred to as the light emitting device. Furthermore, the present invention relates to an electronic appliance using the light emitting device.

2. Description of the Related Art

The OLED itself emits a light so as to provide a high visibility so that backlighting necessary for a liquid crystal display device (LCD) is not required, and thus it is suitable for providing a thin shape as well as the view angle is not limited. Therefore, recently, alight emitting device using an OLED attracts the attention as the display device for replacing the CRT and the LCD.

The OLED has a layer including an organic compound (organic light emitting material) for obtaining a luminescence (electroluminescence) to be generated by the application of the electric field (hereinafter referred to as an organic light emitting layer), an anode layer, and a cathode layer. The luminescence in an organic compound include the light emission (fluorescence) at the time of returning from the singlet excitation state to the ground state, and the light emission (phosphorescence) at the time of returning from the triplet excitation state to the ground state. In the light emitting device of the present invention, either one of the above-mentioned light emissions may be used, or both of the light emissions may be used as well.

In this specification, all the layers provided between the anode and the cathode of the OLED are defined to be an organic light emitting layer. Specifically, the organic light emitting layers include a light emitting layer, a positive hole injecting layer, an electron injecting layer, a positive hole transporting layer, an electron transporting layer, or the like. Basically, the OLED has a structure with the anode, the light emitting layer, and the cathode successively. In addition to the structure, it may have a structure with the anode, the positive hole injecting layer, the light emitting layer, and the cathode, or a structure with the anode, the positive hole injecting layer, the light emitting layer, the electron transporting layer, the cathode, or the like in this order.

It has been problematic at the time of putting the light emitting device into practice that the luminance of the OLED is lowered according to deterioration of the organic light emitting material.

The organic light emitting material is weak with respect to the moisture content, the oxygen, the light, and the heat so that deterioration is promoted thereby. Specifically, the deterioration rate depends on the structure of the device for driving the light emitting device, the characteristics of the organic light emitting material, the material of the electrode, the condition in the production step, the driving method for the light emitting device, or the like.

Even in the case the voltage applied on the organic light emitting layer is constant, if the organic light emitting layer is deteriorated, the luminance of the OLED is lowered so that the displayed image is not sharp. In this specification, a voltage applied to the organic light emitting layer from a pair of electrodes is defined to be an OLED driving voltage (Ve1).

Moreover, in a color display method using three kinds of the OLEDs corresponding to R (red), G (green), and B (blue), the organic light emitting material comprising the organic light emitting layer differs depending on the color corresponding to the OLED. Therefore, the organic light emitting layers may deteriorate by different rates according to the corresponding color. In this case, the luminance of the OLED differs per each color so that an image having a desired color cannot be displayed on the light emitting device.

Furthermore, the temperature of the organic light emitting layer depends on the heat of the external atmosphere, temperature of the heat generated by the OLED panel itself, or the like. In general, the OLED has the flowing current value changed according to the temperature. FIG. 26 shows the change of the voltage current characteristics of the OLED with the temperature of the organic light emitting layer changed. In the case the voltage is constant, if the temperature of the organic light emitting layer is raised, the OLED driving current is enlarged. Since the OLED driving current and the luminance of the OLED have a proportional relationship, the higher the OLED driving current is, the higher the luminance of the OLED is. Accordingly, since the luminance of the OLED is changed depending on the temperature of the organic light emitting layer, it is difficult to display a desired gradient so that the current consumption of the light emitting device is enlarged according to the temperature rise.

Moreover, in general, since the degree of the change of the OLED driving current by the temperature change differs depending on the kind of the organic light emitting material, the luminance of the OLEDs of each color may change independently by the temperature in the color display. In the case the luminance of each color is not balanced, desired color cannot be displayed.

SUMMARY OF THE INVENTION

Accordingly, in view of the above-mentioned circumstances, an object of the present invention is to provide a light emitting device capable of obtaining a constant luminance regardless of the organic light emitting layer deterioration or the temperature change, and further capable of providing a desired color display.

The present inventor has paid attention to the fact that the OLED luminance decline by the deterioration is smaller in the latter case in comparison between the light emission with the OLED driving voltage maintained constantly (the former case) and the light emission with the current flowing in the OLED maintained constantly (the latter case). In this specification, the current flowing in the OLED is referred to as the DIED driving current (Ie1). Then, it is considered that the change of the OLED luminance by the OLED deterioration can be prevented by controlling the OLED luminance not by the voltage but by the current.

Specifically, in the present invention, a current mirror circuit comprising a transistor is provided in each pixel so that the OLED driving current is controlled using the current mirror circuit. Then, the first transistor and the second transistor of the current mirror circuit are connected such that the drain currents thereof can be maintained at the substantially equal value regardless of the load resistance value.

In this specification, a size of a current is an absolute value of a current.

The first transistor has the drain current thereof controlled by a signal line driving circuit. Since the size of the drain current $I_1$ is provided always equal to the size of the drain current $I_2$ of the second transistor regardless of the load resistance value, as a result, the drain current $I_2$ of the second transistor is controlled by the signal line driving circuit.

The second transistor is connected such that the drain current $I_2$ thereof flows into the OLED. Therefore, the value of the OLED driving current flowing in the OLED is controlled not by the load resistance but by the signal driving circuit. In other words, the OLED driving current can be controlled at a desired value regardless of the difference of the transistor characteristics, deterioration of the OLED, or the like.

In the present invention, according to the above-mentioned configuration, decline of the luminance of the OLED can be restrained even in the case the organic light emitting layer is deteriorated, and as a result, a sharp image can be displayed. Moreover, in the case of a color display light emitting device using the OLED corresponding to each color, even in the case the organic light emitting layers of the OLED are deteriorated by different rates per each corresponding color, a desired color can be displayed by preventing deterioration of the balance of the luminance among the colors.

Furthermore, even in the case the temperature of the organic light emitting layer is influenced by the external atmosphere temperature, the heat generated by the OLED panel itself, or the like, the OLED driving current can be controlled at a desired value. Therefore, since the OLED driving current and the luminance of the OLED are proportional, change of the luminance of the OLED can be restrained, and further, increase of the current consumption according to the temperature rise can be prevented. Moreover, in the case of a color display light emitting device, since change of the luminance of the OLED of each color can be restrained regardless of the temperature change, deterioration of the balance of the luminance among the colors can be prevented so that a desired color can be displayed.

Furthermore, in general, since the degree of the change of the OLED driving current in the temperature change differs depending on the kind of the organic light emitting material, the luminance of the OLED of each color can be changed independently in the color display. However, according to the light emitting device of the present invention, since a desired luminance can be obtained regardless of the temperature change, deterioration of the balance of the luminance among the colors can be prevented so that a desired color can be displayed.

Moreover, in an ordinary light emitting device, since the wiring for supplying the current to each pixel itself has a resistance, the potential thereof is slightly lowered depending on the length of the wiring. The potential decline differs largely depending also on the image to be displayed. In particular, in the case the ratio of pixels of a high gradient number is high in a plurality of pixels having the current supplied from the same wiring, the current flowing in the wiring is increased so that the potential decline becomes conspicuous. In the case the potential is lowered, since the voltage applied on the OLED Of each pixel becomes small, the current supplied to each pixel becomes small. Therefore, even in the case a constant gradient is to be displayed in a predetermined pixel, if the gradient number of the other pixel having the current supplied from the same wiring is changed, the current supplied to the predetermined pixel is changed thereby so that the gradient number is changed as a result. However, according to the light emitting device of the present invention, since the OLED current can be corrected by obtaining the measured value and the reference value for each image to be displayed, a desired gradient number can be displayed by the correction even in the case the image to be displayed is changed.

In the light emitting device of the present invention, the transistor to be used for the pixel may be a transistor using a single crystal silicon, or a thin film transistor using a polycrystalline silicon or an amorphous silicon.

BRIEF DESCRIPTION OF THE DRAWINGS

FIG. 2 is a circuit diagram of a pixel of the light emitting device of the present invention.

FIGS. 3A and 3B are timing charts of signals to be inputted in scanning lines.

FIGS. 4A and 4B are schematic diagrams of pixels in driving.

FIGS. 9A to 9D are diagrams showing a production method for a light emitting device of the present invention.

FIGS. 10A to 10C are diagrams showing a production method for a light emitting device of the present invention.

DESCRIPTION OF THE PREFERRED EMBODIMENTS

Embodiment 1

Figure 1:
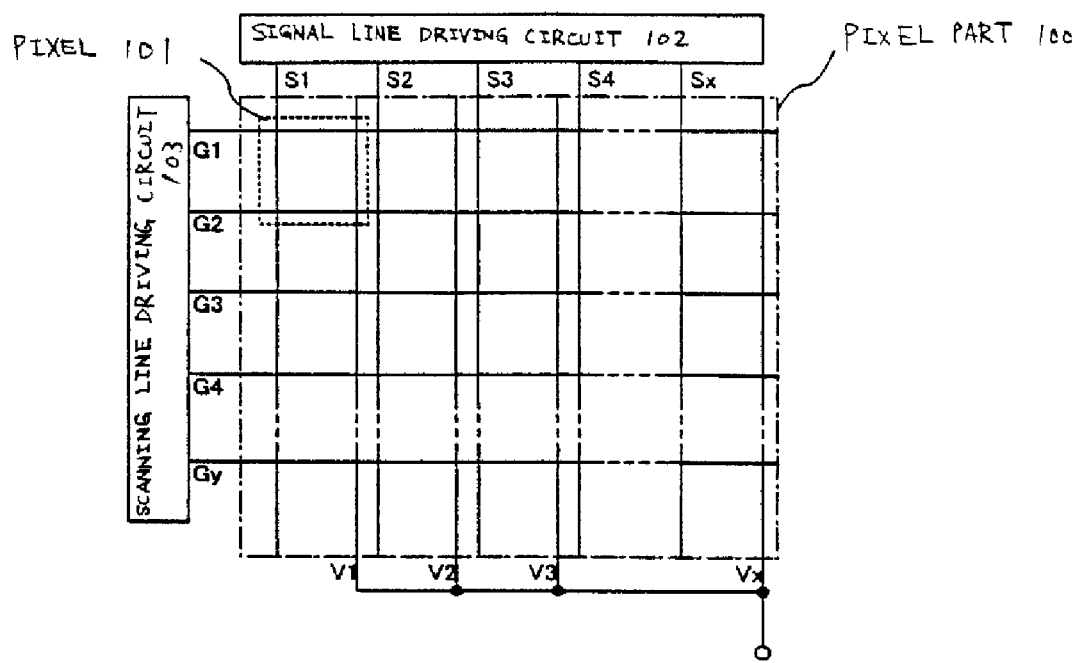
FIG. 1 is an upper surface block diagram of a light emitting device of the present invention.

FIG. 1 is a block diagram showing the configuration of an OLED panel of the present invention. The numeral 100 is a pixel part, with a plurality of pixels 101 formed in a matrix-like form. Moreover, the numeral 102 is a signal line driving circuit, and the numeral 103 is a scanning line driving circuit.

Although the signal line driving circuit 102 and the scanning line driving circuit 103 are formed on the same substrate as the pixel part 100 in FIG. 1, the present invention is not limited to the configuration. It is possible that the signal line driving circuit and the scanning line driving circuit 103 are formed on a substrate different from that of the pixel part 100, and connected with the pixel part 100 via a connector such as an FPC. Moreover, although the signal line driving circuit 102 and the scanning line driving circuit 103 are provided one by one in FIG. 1, the present invention is not limited to the configuration. The number of the signal line driving circuit 102 and the scanning line driving circuit 103 can be set optionally by the designer.

In this specification, the connection denotes electric connection.

Moreover, in FIG. 1, signal lines S1 to Sx, power source lines V1 to Vx, and scanning lines G1 to Gy are provided in the pixel part 100. The numbers of the signal line and the power source line are not always same. Moreover, another different wiring may be provided in addition to these wirings.

The power source lines V1 to Vx are maintained at a predetermined potential. Although the configuration of a light emitting device for displaying a monochrome image is shown in FIG. 1, the present invention can be adopted in a light emitting device for displaying a color image. In that case, the amount of the potentials in the power source lines V1 to Vx need not be maintained equally, and it may differ for each corresponding color.

The configuration of the pixel 101 shown in FIG. 1 is shown in detail in FIG. 2. The pixel 101 shown in FIG. 2 has a signal line Si (one of the S1 to Sx), a scanning line Gj (one of the G1 to Gy), and a power source line Vi (one of the V1 to Vx).

Moreover, the pixel 101 has at least a transistor Tr1 (the first current driving transistor or the first transistor), a transistor Tr2 (the second current driving transistor or the second transistor), a transistor Tr3 (first switching transistor or the third transistor), a transistor Tr4 (second switching transistor or the fourth transistor), an OLED 104 and a maintaining capacity 105.

The gate electrodes of the transistor Tr3 and the transistor Tr4 are both connected with the scanning line Gj.

One of the source area and the drain area of the transistor Tr3 is connected with the signal line Si, and the other one is connected with the drain area of the transistor Tr1. Moreover, one of the source area and the drain area of the transistor Tr4 is connected with the signal line Si, and the other one is connected with the gate electrode of the transistor Tr1.

The gate electrodes of the transistor Tr1 and the transistor Tr2 are connected with each other. Moreover, the source areas of the transistor Tr1 and the transistor Tr2 are both connected with the power source line Vi.

The drain area of the transistor Tr2 is connected with a pixel electrode of the OLED 104. The OLED 104 has an anode and a cathode. In this specification, in the case the anode is used as the pixel electrode (first electrode), the cathode is referred to as the counter electrode (second electrode), and in the case the cathode is used as the pixel electrode, the anode is referred to as the counter electrode.

The potential of the power source line Vi (power source potential) is maintained at a constant level. Moreover, the potential of the counter electrode is maintained at a constant level as well.

The transistor Tr3 and the transistor Tr4 may either be an n channel type TFT or a p channel type TFT. However, the polarity of the transistor Tr3 and the transistor Tr4 is same.

Moreover, the transistor Tr1 and the transistor Tr2 may either be an n channel type TFT or a p channel type TFT. However, the polarity of the transistor Tr1 and the transistor Tr2 is same. In the case the anode is used as the pixel electrode and the cathode is used as the counter electrode, the transistor Tr1 and the transistor Tr2 are used as the p channel type TFT. In contrast, in the case the anode is used as the counter electrode and the cathode is used as the pixel electrode, the transistor Tr1 and the transistor Tr2 are used as the n channel type TFT.

The maintaining capacity 105 is formed between the gate electrodes of the transistor Tr1 and the transistor Tr2 and the power source line Vi. Although the maintaining capacity 105 is provided for maintaining more securely the voltage (gate voltage) between the gate electrodes of the transistor Tr1 and the transistor Tr2 and the source area, it is not always necessarily provided.

Next, the drive of the light emitting device of the present invention will be explained with reference to FIG. 3 and FIG. 4. The drive of the light emitting device of the present invention can be explained for a writing period Ta and a display period Td. In FIG. 3, the timing chart for each scanning line is shown. The period with the scanning line selected, in other words, the period with all the TFTs having the scanning line connected with a gate electrode in the on state is referred to as ON. In contrast, the period of the scanning line not selected, in other words, the period with all the TFTs having the scanning line connected with a gate electrode in the off state is referred to as OFF. Moreover, FIG. 4 is a diagram schematically showing the connection of the transistor Tr3 and the transistor Tr4 in the writing period Ta and the display period Td.

As shown in FIG. 3A, in the writing period Ta, the scanning lines G1 to Gy are selected successively. Then, based on the potential of a video signal inputted to the signal line driving circuit 102, a constant current Ic flows each between the signal lines S1 to Sx and the power source lines V1 to Vx. In this specification, the current Ic is referred to as a signal current.

FIG. 4A is a schematic diagram of the pixel 101 of the case the constant current Ic flows in the signal line Si in the writing period Ta. The numeral 106 is a connection terminal for the power source for providing the potential to the counter electrode. Moreover, the numeral 107 denotes a constant current source of the signal line driving circuit 102.

Since the transistor Tr3 and the transistor Tr4 are in the on state, in the case a constant current Ic is provided in the signal line Si, the constant current Ic flows between the drain area and the source area of the transistor TR1. At the time, the size of the current Ic is controlled in the constant current source 107 such that the transistor Tr1 is operated in a saturated area. In the saturated area, with the premise that $V_{GS}$ is a potential difference between the gate electrode and the source area (gate voltage), μ is the mobility of the transistor, $C_o$ is the gate capacity per unit area, W/L is the ratio of the channel width W and the channel length L in the channel formation area, $V_{TH}$ is the threshold, μ is the mobility, and $I_1$ is the drain current of the transistor Tr1, the following formula 1 can be satisfied.

$$I_1 = \mu C_o W/L (V_{GS} - V_{TH})^2 / 2 \quad \text{[Formula 1]}$$

In the formula 1, all of μ, $C_o$, W/L, and $V_{TH}$ are a fixed value determined by each transistor. Moreover, the drain current I1 of the transistor TR1 is maintained at constant Ic by the constant current source 107. Therefore, as it is apparent from the formula 1, the gate voltage $V_{GS}$ of the transistor Tr1 is determined by the current value Ic.

The gate electrode of the transistor Tr2 is connected with the gate electrode of the transistor Tr1. Moreover, the source area of the transistor Tr2 is connected with the source area of the transistor Tr1. As a result, the gate voltage of the transistor Tr1 becomes the gate voltage of the transistor Tr2. Therefore, the drain current $I_2$ of the transistor Tr2 is maintained in the same size as the drain current of the transistor Tr1. That is, $I_2$=Ic.

The drain current $I_2$ of the transistor Tr2 flows into the OLED 104. Therefore, the OLED driving current has the same size as that of the constant current Ic determined in the constant current source 107.

The OLED 104 emits a light by a luminance corresponding to the size of the OLED driving current. In the case the OLED driving current is extremely close to 0, or the OLED driving current flows in the counter bias direction, the OLED 104 does not emit a light.

When selection of all the scanning lines G1 to Gy is finished, and the above-mentioned operation is executed for pixels in all the lines, the wiring period Ta is finished. When the writing period Ta is finished, the display period Td is started.

FIG. 3B is a timing chart for a scanning line in the display period Td. In the display period Td, none of the scanning lines G1 to Gy is selected.

FIG. 4B is a schematic diagram of a pixel in the display period Td. The transistor Tr3 and the transistor Tr4 are in the off state. Moreover, the source area of the transistor Tr3 and the transistor Tr4 are connected with the power source line Vi so as to be maintained at a constant potential (power source potential).

In the display period Td, the drain area of the transistor Tr1 is in the so-called floating state without supply of a potential from another wiring, a power source, or the like. In contrast, in the transistor Tr2, $V_{GS}$ determined in the writing period Ta is maintained as it is. Therefore, the drain current $I_2$ value of the transistor Tr2 is still maintained at Ic. Therefore, in the display period Td, the OLED 104 emits a light by a luminance corresponding to the size of the OLED driving current determined in the writing period Ta.

In the case of a driving method using an analog video signal (analog driving method), the Ic size is determined according to the analog video signal so that the OLED 104 emits a light by a luminance corresponding to the size of the IC so as to display a gradient. In this case, the frame period comprising a writing period Ta and a display period Td so that an image is displayed in the frame period.

Figure 5:
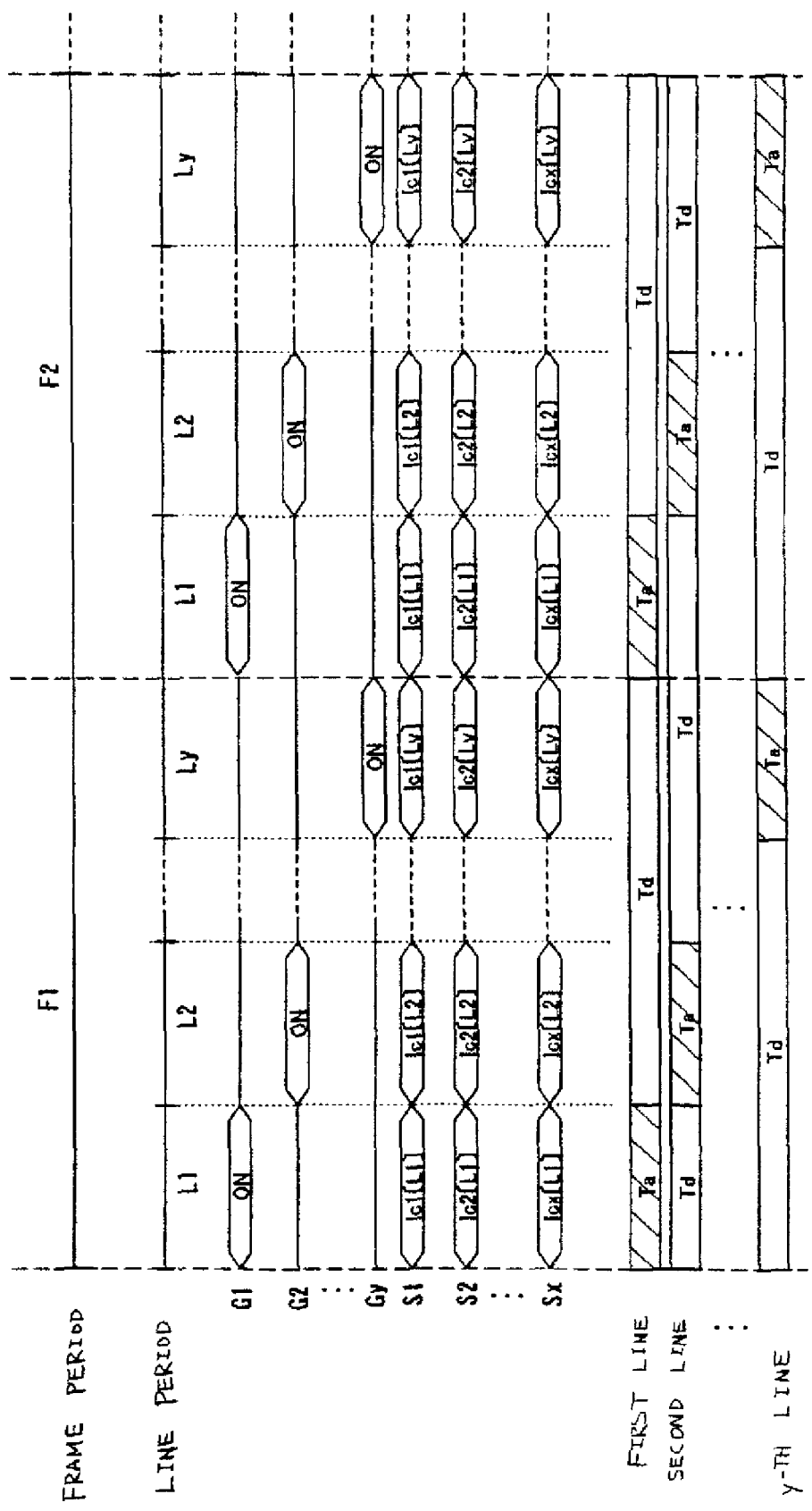
FIG. 5 is a chart showing the timing of a writing period and a display period appearing in an analog driving method.

FIG. 5 shows an example of a timing chart in the analog driving method. One period has y sets of line periods. In each line period, each scanning line is selected. In each line period, a constant current IC (Ic1 to Icx) flows in each signal line. In FIG. 5, the signal current value flowing in each signal line in the line period Lj (j=1 to y) is represented as Ic1 [Lj] to Icx [Lj].

The timing of starting the writing period Ta and the display period Td differs in each line so that the timings of appearance of the writing period of each line do not coincide. When the display period Td is finished in all the pixels, an image is displayed.

In contrast, in the case of a time gradient driving method using a digital video signal (digital driving method), an image can be displayed by repeated appearance of the writing period Ta and the display period Td in one frame period. In the case of displaying an image by an n bit video signal, at least n sets of the writing periods and n sets of the display periods are provided in one frame period. N sets of the writing periods (Ta1 to Tan) and n sets of the display periods (Td1 to Tdn) correspond to each bit of the video signal.

Figure 6:
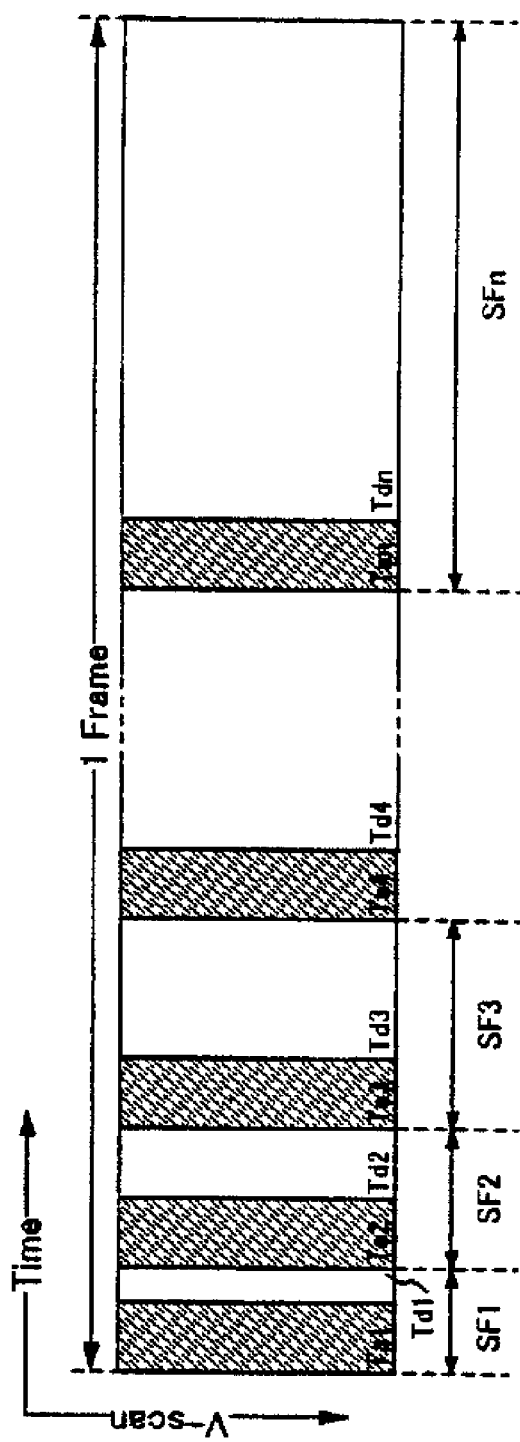
FIG. 6 is a chart showing the timing of a writing period and a display period appearing in a digital driving method.

FIG. 6 shows the timing of appearance of n sets of the writing periods (Ta1 to Tan) and n sets of the display periods (Td1 to Tdn) in one frame period. The lateral axis represents the time and the vertical axis represents the position of the scanning line of the pixel.

After the writing period Tam (m is an optional number from 1 to n), the display period corresponding to the same bit number, in this case. Tdm appears. Total of the writing period Ta and the display period Td is called a sub frame period SF. The sub frame period having the writing period Tam and the display period Tdm corresponding to the m-th bit is SFm.

The length of the sub frame periods SF1 to SFn satisfies SF1:SF2: . . . :SFn=$2^0:2^1: \ldots :2^{n-1}$.

For improvement of the image quality in display, a sub frame period with a long display period may be divided in some. Since a specific dividing method is disclosed in Japanese Patent Laid Open Application (JP-A) No. 2000-267164, it can be referred to.

In the driving method shown in FIG. 6, the gradient is displayed by controlling the sum of the display period length with light emission in one frame period.

In the present invention, according to the above-mentioned configuration, decline of the luminance of the OLED can be restrained even in the case the organic light emitting layer is deteriorated, and as a result, a sharp image can be displayed. Moreover, in the case of a color display light emitting device using an OLED corresponding to each color, a desired color can be displayed by preventing collapse of the luminance balance of each color even in the case the organic light emitting layers of the OLED are deteriorated by different rates per each corresponding color.

Moreover, even in the case the temperature of the organic light emitting layer is influenced by the external atmosphere temperature, the heat generated by the OLED panel itself, or the like, the OLED driving current can be controlled at a desired value. Therefore, since the OLED driving current and the OLED luminance are proportional, change of the OLED luminance can be restrained as well as increase of the current consumption according to the temperature rise can be prevented. Moreover, in the case of the color display light emitting device, since the luminance change of the OLED of each color can be restrained without influence by the temperature change, collapse of the luminance balance of each color can be prevented, and thus a desired color can be displayed.

Furthermore, since the OLED driving current change degree by the temperature in general differs depending on the kind of the organic light emitting material, the OLED luminance of each color in the color display may be changed independently by the temperature. However, according to the light emitting device of the present invention, since a desired luminance can be obtained without influence by the temperature change, collapse of the luminance balance of each color can be prevented so that a desired color can be displayed.

Moreover, since the wiring for supplying a current to each pixel itself has a resistance in a common light emitting device, the potential thereof is slightly lowered depending on the wiring length. The potential decline differs largely also by the image to be displayed. In particular, in the case the ratio of pixels with a high gradient number is large in a plurality of the pixels having a current supplied from the same wiring, the current flowing in the wiring becomes large so that the potential decline appears significantly. Since the voltage on each OLED of each pixel becomes small in the case of the potential decline, the current supplied to each pixel becomes small. Therefore, even if a constant gradient is to be displayed in a predetermined pixel, if the gradient number of the other pixel having the current supplied from the same wiring is changed, the current supplied to the predetermined pixel is changed accordingly, and consequently, the gradient number is changed as well. However, according to the light emitting device of the present invention, since the OLED current can be corrected by obtaining the measured value and the reference value for each image to be displayed, a desired gradient number can be displayed by correction even in the case the image to be displayed is changed.

Embodiment 2

In this embodiment, a configuration of the pixel 101 shown in FIG. 1 different from that of FIG. 2 will be explained.

Figure 7:
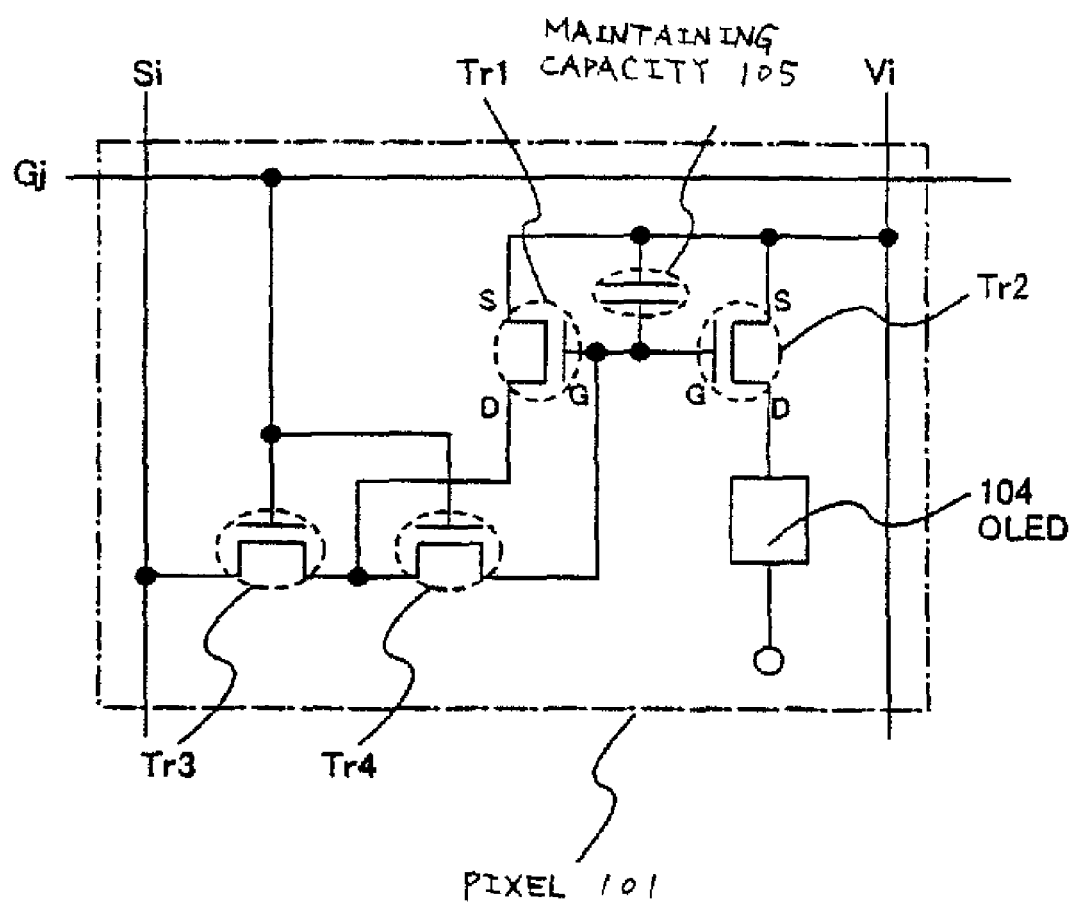
FIG. 7 is a circuit diagram of a pixel of the light emitting device of the present invention.

FIG. 7 shows the configuration of the pixel of this embodiment. The pixel 101 shown in FIG. 7 has a signal line Si (one from S1 to Sx), a scanning line Gj (one from G1 to Gy), and a power source line Vi (one from V1 to Vx).

Moreover, the pixel 101 comprises at least a transistor Tr1 (first current driving transistor), a transistor Tr2 (second current driving transistor), a transistor Tr3 (first switching transistor), a transistor Tr4 (second switching transistor), an OLED 104 and a maintaining capacity 105.

The gate electrodes of the transistor Tr3 and the transistor Tr4 are both connected with the scanning line Gj.

One of the source area and the drain area of the transistor Tr3 is connected with the signal line Si, and the other one is connected with the drain area of the transistor Tr1. Moreover, one of the source area and the drain area of the transistor Tr4 is connected with the drain area of the transistor Tr1, and the other one is connected with the gate electrode of the transistor Tr1.

The gate electrodes of the transistor Tr1 and the transistor Tr2 are connected with each other. Moreover, the source areas of the transistor Tr1 and the transistor Tr2 are both connected with the power source line Vi.

The drain area of the transistor Tr2 is connected with a pixel electrode of the OLED 104. The potential of the power source line Vi (power source potential) is maintained at a constant level. Moreover, the potential of the counter electrode is maintained at a constant level as well.

The transistor Tr3 and the transistor Tr4 may either be an n channel type TFT or a p channel type TFT. However, the polarity of the transistor Tr3 and the transistor Tr4 is same.

Moreover, the transistor Tr1 and the transistor Tr2 may either be an n channel type TFT or a p channel type TFT. However, the polarity of the transistor Tr1 and the transistor Tr2 is same. In the case the anode is used as the pixel electrode and the cathode is used as the counter electrode, it is preferable that the transistor Tr1 and the transistor Tr2 are used as the p channel type TFT. In contrast, in the case the anode is used as the counter electrode and the cathode is used as the pixel electrode, it is preferable that the transistor Tr1 and the transistor Tr2 are used as the n channel type TFT.

The maintaining capacity 105 is formed between the gate electrodes of the transistor Tr1 and the transistor Tr2 and the power source line Vi. Although the maintaining capacity 105 is provided for maintaining more securely the voltage (gate voltage) between the gate electrodes of the transistor Tr1 and the transistor Tr2 and the source area, it is not always necessarily provided.

The operation of the light emitting device having the pixel shown in FIG. 7 can be explained for the writing period Ta and the display period Td as in the case of the pixel shown in FIG. 2. Furthermore, since the operation of the pixel in the writing period Ta and the display period Td is same as the case of the pixel shown in FIG. 2 so that the explanation for FIG. 3 and FIG. 4 in the first embodiment can be referred to, explanation is not given here.

Embodiment 3

In this embodiment, a configuration of the pixel 101 shown in FIG. 1 different from that of FIG. 2 and FIG. 7 will be explained.

Figure 8:
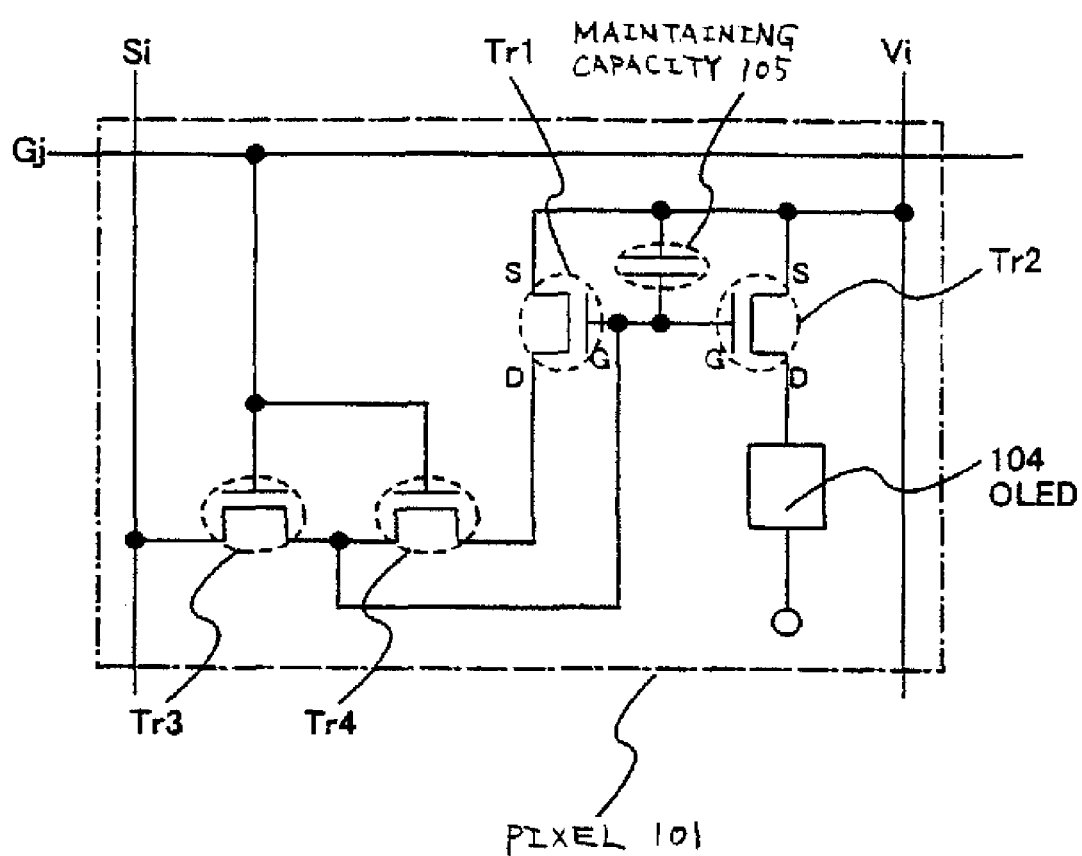
FIG. 8 is a circuit diagram of a pixel of the light emitting device of the present invention.

FIG. 8 shows the configuration of the pixel of this embodiment. The pixel 101 shown in FIG. 8 has a signal line Si (one from S1 to Sx), a scanning line Gj (one from G1 to Gy), and a power source line Vi (one from V1 to Vx).

Moreover, the pixel 101 comprises at least a transistor Tr1 (first current driving transistor), a transistor Tr2 (second current driving transistor), a transistor Tr3 (first switching transistor), a transistor Tr4 (second switching transistor), an OLED 104 and a maintaining capacity 105.

The gate electrodes of the transistor Tr3 and the transistor Tr4 are both connected with the scanning line Gj.

One of the source area and the drain area of the transistor Tr3 is connected with the signal line Si, and the other one is connected with the gate electrode of the transistor Tr1. Moreover, one of the source area and the drain area of the transistor Tr4 is connected with the drain area of the transistor Tr1, and the other one is connected with the gate electrode of the transistor Tr1.

The gate electrodes of the transistor Tr1 and the transistor Tr2 are connected with each other. Moreover, the source areas of the transistor Tr1 and the transistor Tr2 are both connected with the power source line Vi.

The drain area of the transistor Tr2 is connected with a pixel electrode of the OLED 104. The potential of the power source line Vi (power source potential) is maintained at a constant level. Moreover, the potential of the counter electrode is maintained at a constant level as well.

The transistor Tr3 and the transistor Tr4 may either be an n channel type TFT or a p channel type TFT. However, the polarity of the transistor Tr3 and the transistor Tr4 is same.

Moreover, the transistor Tr1 and the transistor Tr2 may either be an n channel type TFT or a p channel type TFT. However, the polarity of the transistor Tr1 and the transistor Tr2 is same. In the case the anode is used as the pixel electrode and the cathode is used as the counter electrode, it is preferable that the transistor Tr1 and the transistor Tr2 are used as the p channel type TFT. In contrast, in the case the anode is used as the counter electrode and the cathode is used as the pixel electrode, it is preferable that the transistor Tr1 and the transistor Tr2 are used as the n channel type TFT.

The maintaining capacity 105 is formed between the gate electrodes of the transistor Tr1 and the transistor Tr2 and the power source line Vi. Although the maintaining capacity 105 is provided for maintaining more securely the voltage (gate voltage) between the gate electrodes of the transistor Tr1 and the transistor Tr2 and the source area, it is not always necessarily provided.

The operation of the light emitting device having the pixel shown in FIG. 8 can be explained for the writing period Ta and the display period Td as in the case of the pixel shown in FIG. 2. Furthermore, since the operation of the pixel in the writing period Ta and the display period Td is same as the case of the pixel shown in FIG. 2 so that the explanation for FIG. 3 and FIG. 4 in the first embodiment can be referred to, explanation is not given here.

EXAMPLES

Hereinafter, examples of the present invention will be explained.

Example 1

An example of a production method for a light emitting device according to the present invention will be explained with reference to FIGS. 9 to 13. Here, a method for simultaneously producing the transistor Tr2 and the transistor Tr4 shown in FIG. 2 and the TFT of the driving part provided in the periphery of the pixel part will be explained in detail in according to the steps as the representative. The transistor Tr1 and the transistor Tr3 can also be produced according to the production method far the transistor Tr2 and the transistor Tr4. Moreover, the pixel shown in FIGS. 7, 8 and 30 can also be produced by the production steps shown in this example.

First, in this example, a substrate 900 made of a glass, such as a barium borosilicate glass, and an alumino borosilicate glass represented by #7059 glass and #1737 glass of Corning Incorporated, was used. As the substrate 900, any substrate having a light transmittivity can be used so that a quarts substrate may be used as well. Moreover, a plastic substrate having a heat resistance durable in a process temperature of this example can be used as well.

Next, as shown in FIG. 9A, a base film 901 comprising an insulated film, such as a silicon oxide film, a silicon nitride film, and a silicon nitride oxide film was formed on the substrate 900. Although a two layer structure was employed as the base film 901 in this example, a single layer film of the above-mentioned insulated film, or a structure with two or more layers laminated can be used as well. As the first layer of the base film 901, a silicon nitride oxide film 901a produced by a plasma CVD method using an $SiH_4$, an $NH_3$, and an $N_2O$ as the reaction gas, was formed by 10 to 200 nm (preferably 50 to 100 nm). In this example, the silicon nitride oxide film 901a of a 50 nm film thickness (composition ratio Si=32%, O=27%, N=24%, H=17%) was formed. Next, as the second layer of the base film 901, a silicon nitride oxide film 901b produced by a plasma CVD method using an $SiH_4$, and an $N_2O$ as the reaction gas, was formed by 50 to 200 nm (preferably 100 to 150 nm). In this example, the silicon nitride oxide film 901b of a 100 nm film thickness (composition ratio Si=32%, O=59%, N=7%, H=2%) was formed.

Next, semiconductor layers 902 to 905 were formed on the base film 901. The semiconductor layers 902 to 905 were formed by patterning into a desired shape a crystalline semiconductor film obtained by producing a semiconductor film having an amorphous structure by a known means (a sputtering method, an LPCVD method, a plasma CVD method, or the like), and executing a known crystallization process (a laser crystallization method, a thermal crystallization method, a thermal crystallization method using a catalyst such as a nickel). The semiconductor layers 902 to 905 are formed by a 25 to 80 nm (preferably 30 to 60 nm) thickness. The material for the crystalline semiconductor films is not particularly limited, but it is formed preferably with a silicon or a silicon germanium ($Si_xGe_{1-x}$ (X=0.0001 to 0.02)) alloy. In this example, after forming a 55 nm amorphous silicon film using the plasma CVD method, a solution containing a nickel is maintained on the amorphous silicon film. After executing dehydration (500° C., 1 hour) to the amorphous silicon film, a thermal crystallization (550° C., 4 hours) was executed, and further, a laser annealing process was executed for improving the crystallization was executed for forming a crystalline silicon film. According to a patterning process of the crystalline silicon film using a photolithography method, the semiconductor layers 902 to 905 were formed.

Moreover, it is also possible to dope a slight amount of an impurity element (boron or phosphorus) to the semiconductor layers 902 to 905 after formation of the semiconductor layers 902 to 905 for controlling the threshold value of the TFT.

Moreover, in the case of producing a crystalline semiconductor film by the laser crystallization method, a pulse oscillation type or continuous light emitting type excimer laser, an YAG laser, or an $YVO_4$ laser can be used. In the case of using these lasers, it is preferable to use a method of linearly collecting a laser beam outputted from a laser oscillator by an optical system and directing the same to the semiconductor films. The crystallization condition can be selected optionally by the operator, and in the case of using an excimer laser, the pulse oscillation frequency was set at 300 Hz, and the laser energy density was set at 100 to 400 mJ/cm$^2$ (as the representative, 200 to 300 mJ/cm$^2$). Furthermore, in the case of using an YAG laser, it is preferable to set the pulse oscillation frequency using the second harmonic at 30 to 300 kHz, and the laser energy density at 300 to 600 mJ/cm$^2$ (as the representative, 350 to 500 mJ/cm$^2$). Furthermore, it is preferable to direct a laser beam collected linearly in a 100 to 1,000 μm width, for example, 400 μm to the substrate entire surface, with an overlapping ratio of the linear laser beam at 50 to 90%.

Next, a gate insulated film 906 for covering the semiconductor layers 902 to 905 was formed. The gate insulated film 906 was formed with an insulated film containing a silicon by a 40 to 150 nm thickness using the plasma CVD method or the sputtering method. In this example, a silicon nitride oxide film (composition ratio Si=32%, O=59%, N=7%, H=2%) was formed by a 110 nm thickness by the plasma CVD method. Of course the gate insulated film is not limited to the silicon nitride oxide film, and a single layer or a laminated structure of an insulated film containing another silicon can be adopted as well.

Moreover, in the case a silicon oxide film is used, it can be used by mixing a TEOS (tetraethyl orthosilicate) and an $O_2$ by the plasma CVD method, and executing electric discharge with a 40 Pa reaction pressure, a 300 to 400° C. substrate temperature, and a 0.5 to 0.8 W/cm$^2$ high frequency (13.56 MHz) power density. According to the silicon oxide film accordingly produced, good characteristics as a gate insulated film can be obtained by thermal annealing at 400 to 500° C. thereafter.

Then, a heat resistant conductive layer 907 for forming a gate electrode on the gate insulated film 906 was formed by a 200 to 400 nm (preferably 250 to 350 nm) thickness. The heat resistant conductive layer 907 can be formed in a single layer or as needed as a laminated structure comprising a plurality of layers such as two layers and three layers. The heat resistant conductive layer contains an element selected from the group consisting of a Ta, a Ti, and a W, an alloy containing the elements as a component, or an alloy film as a combination of the elements. The heat resistant conductive layer is formed by a sputtering method or a CVD method. In order to achieve a low resistance, it is preferable to reduce the concentration of a contained impurity. In particular, it is preferable to have the oxygen concentration of 30 ppm or less. In this example, the W film was formed by a 300 nm thickness. The W film can be formed by a sputtering method with a W used as a target, or it can be formed also by a method using a tungsten hexafluoride ($WF_6$). In either case, in order to use as a gate electrode, a low resistance should be achieved, and it is preferable to have the W film resistivity at 20 $\mu\Omega$cm or less. Although a low resistivity can be achieved in the W film by enlarging the crystal grains, in the case a large amount of an impurity element such as an oxygen is contained in the W, the crystallization is prohibited so as to have a high resistivity. Thereby, in the case of the sputtering method, by forming the W film using a W target of a 99.9999% purity with sufficient attention paid for avoiding inclusion of impurities from the gas phase at the time of film formation, a 9 to 20 $\mu\Omega$cm resistivity can be realized.

In contrast, in the case a Ta film is used for the heat resistant conductive layer 907, similarly, it can be formed by the sputtering method. For the Ta film, an Ar is used as the sputtering gas. Moreover, by adding an appropriate amount of a Xe or a Kr in the gas at the time of sputtering, peel off of the film can be prevented by alleviating the internal stress of the film to be formed. The resistivity of the Ta film of an a phase is about 20 $\mu\Omega$cm so that it can be used as the gate electrode, but the resistivity of the Ta film of a β phase is about 180 $\mu\Omega$cm so that it cannot be suitable for the gate electrode. Since a TaN film has a crystal structure close to the α phase, by forming the TaN film as the base for the Ta film, the Ta film of the α phase can be obtained easily. Moreover, although it is not shown in the figure, it is effective to form a silicon film with a phosphorus (P) doped by about a 2 to 20 nm thickness below the heat resistant conductive layer 907. Thereby, improvement of the close contact property of the conductive film to be formed thereon and oxidation prevention can be achieved as well as diffusion of an alkaline metal element contained in the heat resistant conductive layer 907 by a slight amount to the gate insulated film 906 of the first shape can be prevented. In either case, it is preferable to have the resistivity of the heat resistant conductive layer 907 in a range of 10 to 50 $\mu\Omega$cm.

Next, a mask 908 of a resist is formed using the photolithography technique. Then, the first etching process is executed. In this example, it is executed with a plasma formed by using an ICP etching device, a $Cl_2$ and a $CF_4$ as the etching gas, and introducing an RF (13.56 MHz) power of 3.2 W/cm² by a 1 Pa pressure. By introducing the RF (13.56 MHz) power of 224 mW/cm² also to the substrate side (specimen stage), a substantially negative self bias voltage is applied. In this condition, the W film etching rate is about 100 nm/min. For the first etching process, the time needed for just etching the W film was estimated based on the etching rate, and the etching time increased by 20% therefrom was set to be the etching time.

By the first etching process, conductive layers 909 to 912 having the first tapered shape are formed. The conductive layers 909 to 912 were formed with the tapered part angle of 15 to 30°. In order to etch without leaving a residue, an over etching of increasing the etching time by a ratio of about 10 to 20% was applied. Since the selection ratio of the silicon nitride oxide film (gate insulated film 906) with respect to the W film is 2 to 4 (representatively 3), the surface with the silicon nitride oxide film exposed can be etched by about 20 to 50 nm by the over etching process (FIG. 9B).

Then, by executing the first doping process, the one conductive type impurity element is added to the semiconductor layer. Here, an impurity element addition step for applying the n type was executed. With the mask 908 with the first shape conductive layer formed left as it is, impurity elements for providing the n type by self aligning were added using the conductive layers 909 to 912 having the first tapered shape by the ion doping method. In order to add the impurity elements for providing the n type reaching to the semiconductor layer through the tapered part at the end part of the gate electrode and the gate insulated film 906 disposed therebelow, the dose amount is set to be $1\times10^{13}$ to $5\times10^{14}$ atoms/cm², and the acceleration voltage at 80 to 160 keV. As the impurity elements for providing the n type, elements belonging to the group, typically a phosphorus (P) or an arsenic (As) can be used, but here a phosphorus was used. According to the ion doping method, in the first impurity areas 914 to 914, the impurity element for providing the n type was added in a concentration range of $1\times10^{20}$ to $1\times10^{21}$ atomic/cm³. (FIG. 9C)

In this step, depending on the doping condition, the impurity may be placed below the first shape conductive layers 909 to 912 so that the first impurity areas 914 to 914 can be superimposed on the first shape conductive layers 909 to 912.

Next, as shown in FIG. 9D, the second etching process is executed. Similarly, the etching process is executed with the ICP etching device using a gas mixture of a $CF_4$ and a $Cl_2$ as the etching gas, a 3.2 W/cm² (13.56 MHz) RF power, a 45 mW/cm² (13.56 MHz) bias power, and a 1.0 Pa pressure. Thereby, conductive layers 918 to 921 having the second shape formed by the condition can be provided. A tapered part is formed on the end part thereof, with a tapered shape with the thickness increased from the end part to inward. Compared with the first etching process, owing to a lower bias power applied to the substrate side, the ratio of the isotropic etching is increased so that the tapered part angle becomes 30 to 60°. The end part of the mask 908 is cut by etching so as to provide a mask 922. Moreover, in the step of FIG. 9D, the surface of the gate insulated film 906 is etched by about 40 nm.

Then, the impurity element for providing the n type is doped with a dose amount smaller than that of the first doping process in a high acceleration voltage condition. For example, the operation is executed with a 70 to 120 KeV acceleration voltage and a $1\times10^{13}$/cm² dose amount so as to form the first impurity areas 924 to 927 having a larger impurity concentration and the second impurity areas 928 to 931 in contact with the first impurity areas 924 to 927. In this step, depending on the doping condition, the impurity may be placed below the second shape conductive layers 918 to 921 so that the second impurity areas 928 to 931 can be superimposed on the second shape conductive layers 918 to 921. The impurity concentration in the second impurity area is set to be $1\times10^{16}$ to $1\times10^{18}$ atoms/cm³. (FIG. 10A)

Then, as shown in (FIG. 10B), impurity areas 933 (933a, 933b) and 934 (934a, 934b) of an opposite conductive type with respect to the one conductive type are formed in the semiconductor layers 902, 905 for forming the p channel type TFT. Also in this case, by adding an impurity element for providing the p type with the second shape conductive layers 918, 921 used as a mask, an impurity area is formed by self aligning. At the time, the semiconductor layers 903, 904 for forming the n channel type TFT has a resist mask 932 formed so as to cover the entire surface. The impurity areas 933, 934 formed here is formed by the ion doping method using a diborane ($B_2H_6$). The concentration of the impurity element for providing the p type of the impurity areas 933, 934 is set to be $2 \times 10^{20}$ to $2 \times 10^{21}$ atoms/cm$^3$.

However, the impurity areas 933, 934 can be regarded specifically as two areas containing the impurity element for providing the n type. The third impurity areas 933a, 934a contain the impurity element for providing the n type by a $1 \times 10^{20}$ to $1 \times 10^{21}$ atoms/cm$^3$ concentration, and the fourth impurity areas 933b, 934b contain the impurity element for providing the n type by a $1 \times 10^{17}$ to $1 \times 10^{20}$ atoms/cm$^3$ concentration. However, by having the concentration of the impurity element for providing the p type of the impurity areas 933b, 934b at $1 \times 10^{19}$ atoms/cm$^3$ or more, and having the concentration of the impurity element for providing the p type in the impurity areas 933a, 934a by 1.5 to 3 times as much as the concentration of the impurity element for providing the n type, any problem cannot be generated for the function as the source area and the drain area of the p channel type TFT in the third impurity area Thereafter, as shown in FIG. 10C, the first interlayer insulated film 937 is formed on the conductive layers 918 to 921 having the second shape and the gate insulated film 906. The first interlayer insulated film 937 can be formed with a silicon oxide film, a silicon nitride oxide film, a silicon nitride film, or a laminated film of a combination thereof. In either case, the first interlayer insulated film 937 is made of an inorganic insulated material. The film thickness of the first interlayer insulated film 937 is set to be 100 to 200 nm. In the case a silicon oxide film is used as the first interlayer insulated film 937, it can be formed by mixing a TEOS and an $O_2$ are the plasma CVD method, and executing electric discharge with a 40 Pa reaction pressure, a 300 to 400° C. substrate temperature, and a 0.5 to 0.8 W/cm$^2$ high frequency (13.56 MHz) power density. Moreover, in the case a silicon nitride oxide film is used as the first interlayer insulated film 937, a silicon nitride oxide film produced from an $SiH_4$, an $NH_3$, and an $N_2O$, or a silicon nitride oxide film produced from an $SiH_4$, and an $N_2O$ by the plasma CVD method can be used. As the production condition in this case, a 20 to 200 Pa reaction pressure, a 300 to 400° C. substrate temperature, and a 0.1 to 1.0 W/cm$^2$ high frequency (60 MHz) power density can be provided. Moreover, as the first interlayer insulated film 937, a hydrogenated silicon nitride oxide film produced from an $SiH_4$, an $N_2O$, and an $H_2$ can be adopted as well. Similarly, a silicon nitride film can be produced from an $SiH_4$, and an $NH_3$ as well.

Then, a process for activating the impurity element for providing the n type or the p type added by each concentration is executed. This step is executed by the thermal annealing method using a furnace annealing furnace. In addition thereto, the laser annealing method, or a rapid thermal annealing method (RTA method) can be adopted as well. The thermal annealing method is executed in a nitrogen atmosphere of 1 ppm or less, preferably 0.1 ppm or less at 400 to 700° C., representatively 500 to 600° C. In this embodiment a heat treatment was executed at 550° C. for 4 hours. Moreover, in the case a plastic substrate having a low heat resistance temperature is used for the substrate 900, it is preferable to adopt the laser annealing method.

Following the activation step, a step for hydrogenating the semiconductor layer by executing a heat treatment at 300 to 450° C. for 1 to 12 hours with the atmosphere gas changed to an atmosphere containing 3 to 100% of a hydrogen, is executed. This is a step for finishing the end of a dangling bond of $10^{16}$ to $10^{18}$/cm$^3$ in the semiconductor layer by a thermally excited hydrogen. As another means for the hydrogenation, the plasma hydrogenation (using a hydrogen excited by a plasma) can be executed. In either case, it is preferable to have the defect density in the semiconductor layers 902 to 905 to $10^{16}$/cm$^3$ or less. Therefore, a hydrogen can be provided by about 0.01 to 0.1 atomic %.

Then, the second interlayer insulated film 939 made of an organic insulated material is formed by a 1.0 to 2.0 μm average thickness. As the organic resin material, a polyimide, an acrylic, a polyimide, a polyimide amide, a BCB (benzocyclobutene), or the like can be used. For example, in the case a polyimide of a type thermally polymerizable after application on the substrate is used, it is formed by baking at 300° C. by a clean oven. Moreover, in the case an acrylic is used, it can be formed by using a two liquid type, mixing a main material and a hardener, applying the same on the substrate entire surface using a spinner, executing a preliminary heating operation at 50° C. for 60 seconds by a hot plate, and further baking at 250° C. for 60 minutes by a clean oven.

By forming the second interlayer insulated film 939 accordingly with an organic insulated material, the surface can be preferably flat. Moreover, since the organic resin material in general has a low dielectric constant, the parasitic capacity can be reduced. However, since it has a moisture absorbing property and thus it is not suitable as a protection film, it can be used preferably in a combination with a silicon oxide film, a silicon nitride oxide film, a silicon nitride film, or the like formed as the first interlayer insulated film 937.

Thereafter, a resist mask of a predetermined pattern is formed, and a contact hole reaching to the source area or the drain area formed in each semiconductor layer is formed. The contact hole is formed by the dry etching method. In this case, first the second interlayer insulated film 939 made of an organic resin material is etched using a gas mixture of a $CF_4$, an $O_2$, and an He as the etching gas, and then subsequently the first interlayer insulated film 937 is etched using a $CF_4$, and $O_2$ as the etching gas. Furthermore, in order to improve the selection ratio with respect to the semiconductor layer, a contact hole can be formed by etching the gate electrode 906 of the third shape with the etching gas changed to a $CHF_3$.

Then, source wirings 940 to 943 and drain wirings 944 to 946 are formed by forming a conductive metal film by the sputtering method or the vacuum deposition method, patterning with a mask, and etching. In this specification, both the source wirings and the drain wirings are referred to as connection wirings. Although it is not shown in the figure, in this specification, the connection wirings are formed as a laminated film of a Ti film of a 50 nm film thickness, and an alloy film (an alloy film of an Al and a Ti) of a 500 nm film thickness.

Figure 11A:
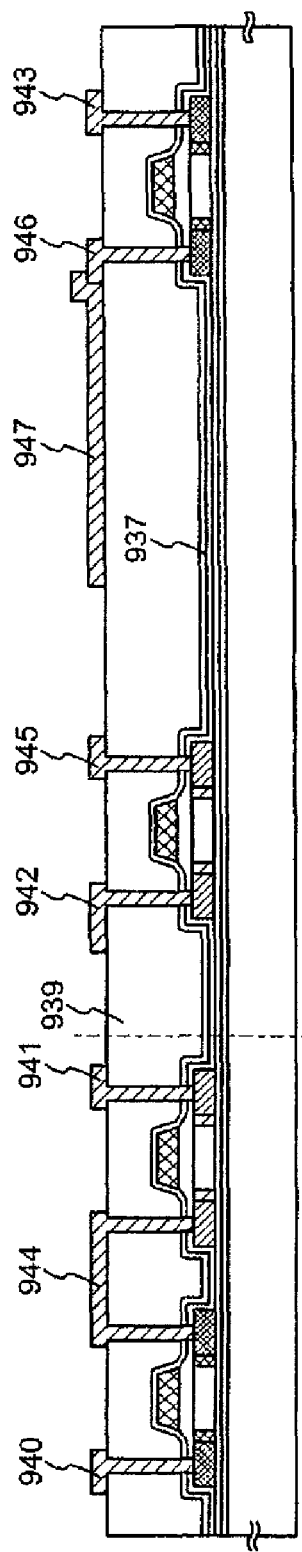
FIGS. 11A and 11B are diagrams showing a production method for a light emitting device of the present invention.

Next, a pixel electrode 947 is formed by providing a transparent conductive film thereon by a 80 to 120 nm thickness, and patterning (FIG. 11A). In this example, an indium-tin oxide (ITO) film or a transparent conductive film having 2 to 20[%] of a zinc oxide (ZnO) added to an indium oxide is used as the transparent electrode.

Moreover, the pixel electrode 947 can be connected electrically with the drain area of the transistor Tr2 by forming the same superimposed and connected with the drain wiring 946.

Figure 12:
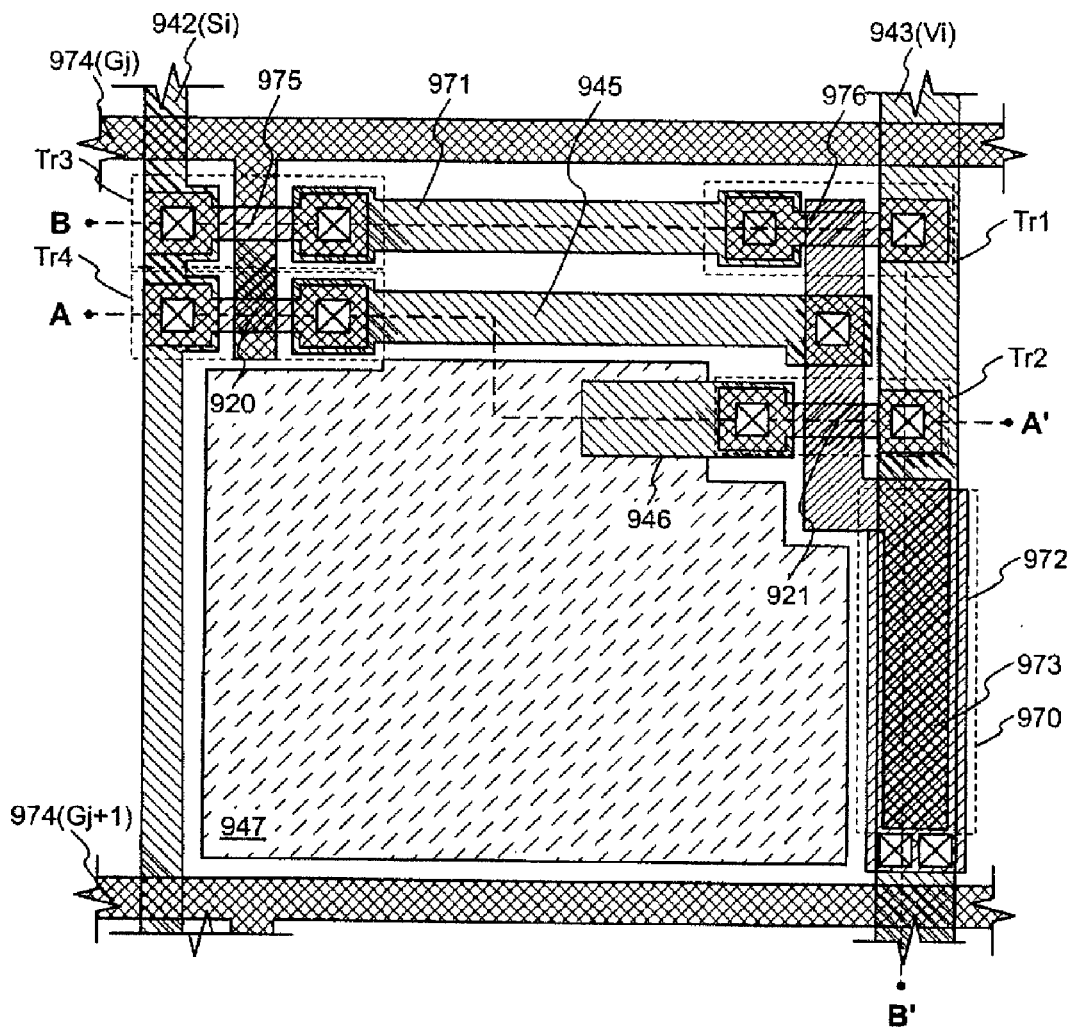
FIG. 12 is a top view of a pixel of a light emitting device of the present invention.

FIG. 12 is a top view of the pixel at the time of finishing the step of FIG. 11A. In order to clarify the position of the wiring and the position of the semiconductor layer, the insulated films and the interlayer insulated films are omitted. The cross-sectional view taken on A-A' in FIG. 12 corresponds with the part shown in A-A' in FIG. 11A.

Figure 13:
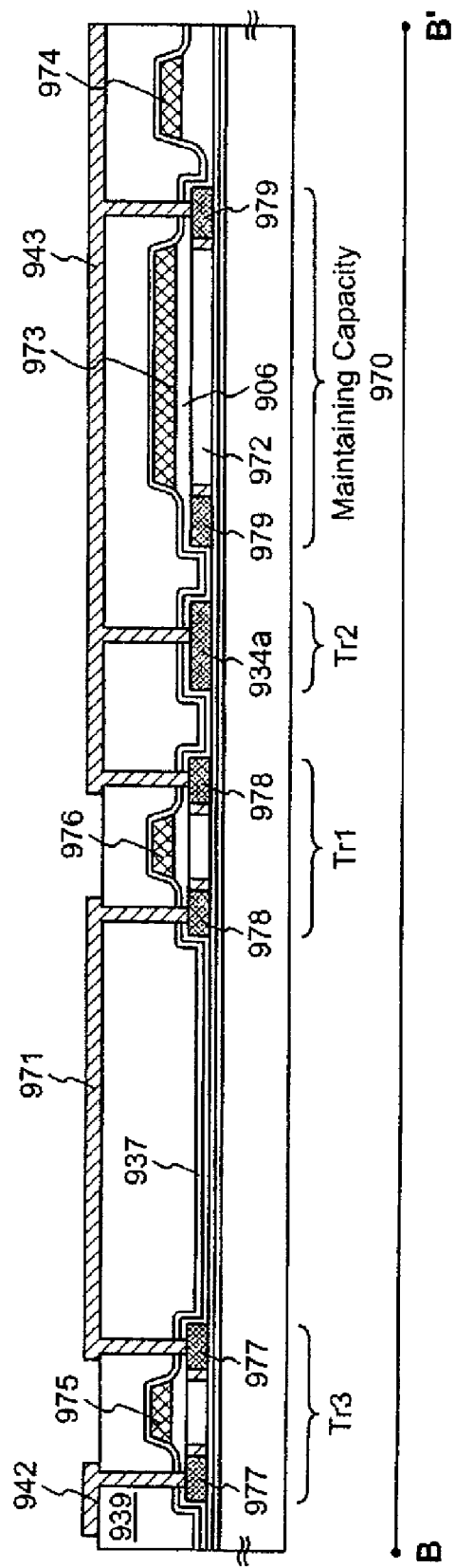
FIG. 13 is a cross-sectional view of a pixel of the light emitting device of the present invention.

FIG. 13 is a cross-sectional view taken on B-B' in FIG. 12. The transistor Tr3 has a gate electrode 975 as a part of the scanning line 974, with the gate electrode 975 connected also with the gate electrode 920 of the transistor Tr4. Moreover, the impurity area 977 of the semiconductor layer of the transistor Tr3 is connected with a connection wiring 942 serving as the signal line on one side and with the connected with a connection wiring 971 on the other side.

The transistor Tr1 has a gate electrode 976 as a part of the capacity wiring 973, with the gate electrode 976 connected also with the gate electrode 921 of the transistor Tr2. Moreover, the impurity area 978 of the semiconductor layer of the transistor Tr1 is connected with a connection wiring 971 on one side and with the connected with a connection wiring 943 serving as the power source line Vi on the other side.

The connection wiring 943 is connected also with the impurity area 934a of the transistor Tr2. Moreover, the numeral 970 is a maintaining capacity, having the semiconductor layer 972, the gate insulated film, 906 and the capacity wiring 973. The impurity area 979 of the semiconductor layer 972 is connected with the connection wiring 943.

Figure 11B:
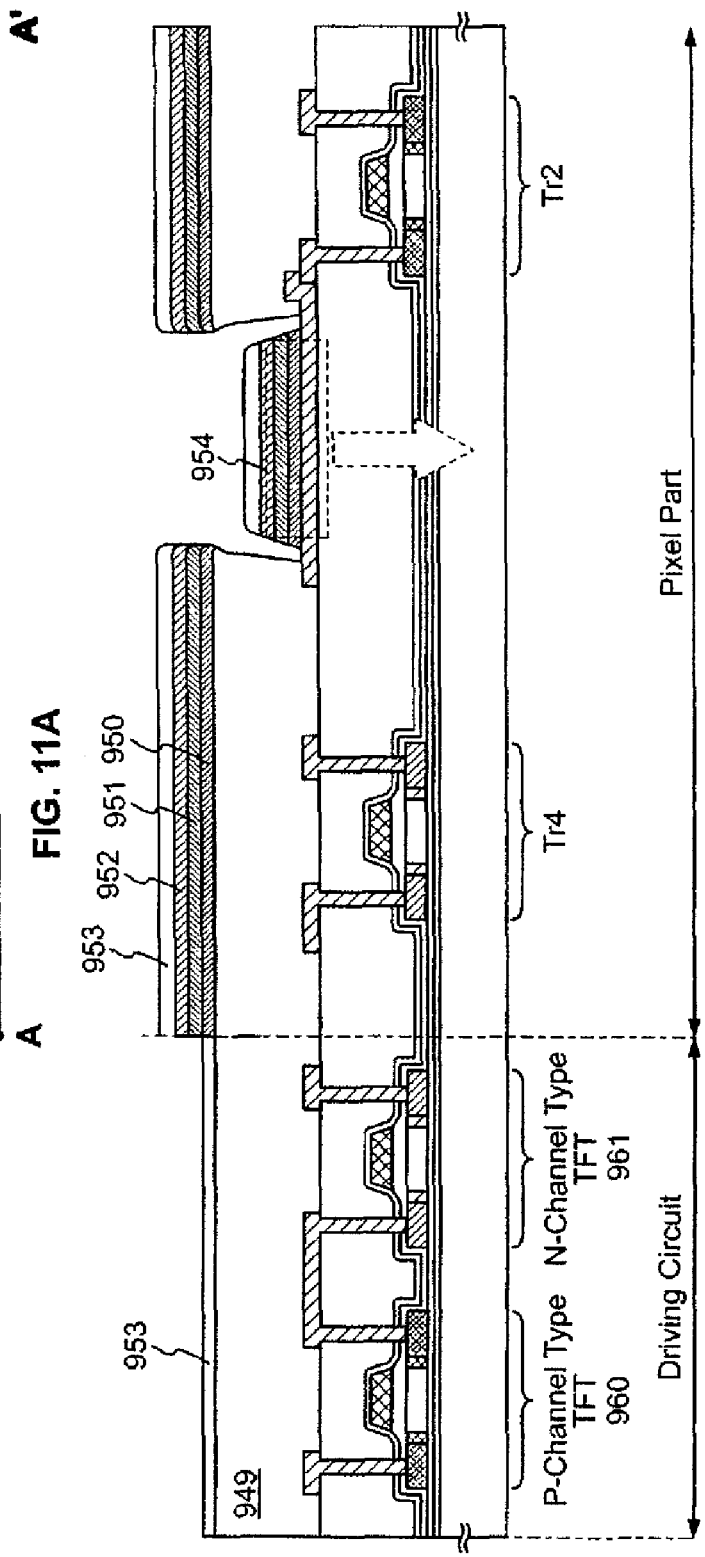

Next, as shown in FIG. 11B, the third interlayer insulated film 949 having an opening part at a position corresponding to the pixel electrode 947 is formed. The third interlayer insulated film 949 having the insulation property serves as a bank so as to play a roll of separating the organic light emitting layers of the adjacent pixels. In this example, the third interlayer insulated film 949 is formed using a resist.

In this example, the thickness of the third interlayer insulated film 949 is provided by about 1 µm, with the opening part formed in the so-called reverse tapered shape, widened toward the pixel electrode 947. This can be formed by covering except the part for forming the opening part after film formation of the resist, exposing the same by directing the UV light, and eliminating the exposed part by a developer.

Since the organic light emitting layers are divided for the adjacent pixels at the time of film formation of the organic light emitting layers in the following step by having the third insulated film 949 in the reverse tapered shape as in this example, even in the case the coefficients of thermal expansion of the organic light emitting layers and the third interlayer insulated film 949 are different, cracking or peel off of the organic light emitting layer can be restrained.

Although a resist film is used as the third interlayer insulated film in this example, in some cases, a polyimide, a polyamide, an acrylic, a BCB (benzocyclo butene), a silicon oxide film, or the like can be used as well. As long as it has the insulation property, either organic or inorganic third interlayer insulated film 949 can be used.

Next, an organic light emitting layer 950 is formed by the deposition method, and further, a cathode (MgAg electrode) 951 and a protection electrode 952 are formed by the deposition method. At the time, it is preferable to apply a heat treatment to the pixel electrode 947 for completely eliminating the moisture content prior to the formation of the organic light emitting layer 950 and the cathode 951. Although the MgAg electrode is used as the OLED cathode in this example, another known material can be used as well.

As the organic light emitting layer 950, a known material can be used. Although a two layer structure comprising a hole transporting layer and a light emitting layer is provided as the organic light emitting layer in this example, in some cases any of a hole injecting layer, an electron injecting layer, or an electron transporting layer is provided. Accordingly, various examples of combinations have already been reported, and any configuration can be used.

In this example, a polyphenylene vinylene is formed as the hole transporting layer by the deposition method. Moreover, as the light emitting layer, one having 30 to 40% of a 1,3,4-oxadiazol derivative molecularly dispersed in a polyvinyl carbazol is formed by the deposition method, with about 1% of a coumarin 6 added as a green light emission center.

Moreover, it is also possible to protect the organic light emitting layer 950 from the moisture content or the oxygen by the protection electrode 952, but it is further preferable to provide a protection film 953. IN this example, a 300 nm thickness silicon nitride film is provided as the protection film 953. The protection film can be formed continuously after the protection electrode 952 without release to the atmosphere.

Moreover, the protection electrode 952 is provided for preventing deterioration of the cathode 951, and a metal film having an aluminum as the main component is representative thereof. Of course, another material can be used as well. Moreover, since the light emitting layer 950 and the cathode 951 are extremely weak to the moisture content, it is preferable to form continuously to the protection electrode 952 without release to the atmosphere for protecting the organic light emitting layer from the outside air.

The film thickness of the organic light emitting layer 950 can be provided by 10 to 400 [nm] (typically 60 to 150 [nm]), and the thickness of the cathode 951 can be provided by 80 to 200 [nm] (typically 100 to 150 [nm]).

Accordingly, a light emitting device having the structure shown in FIG. 11B can be completed. The part 954 with the pixel electrode 947, the organic light emitting layer 950, and the cathode 951 superimposed corresponds to the OLED.

The p channel type TFT 960 and the n channel type TFT 961 are a TFT of the driving circuit, which provides a CMOS. The transistor Tr2 and the transistor Tr4 are a TFT of the pixel part, and the TFT of the driving circuit and the TFT of the pixel part can be formed on the same substrate.

In the case of a light emitting device using an OLED, since the voltage of the power source of the driving circuit is sufficiently about 5 to 6V, and about 10V at most, a problem of deterioration by the hot electron in the TFT is not involved. Moreover, since the driving circuit needs to be operated at a high speed, it is preferable that the TFT gate capacity is small. Therefore, as in this example, a configuration with the second impurity area 929 of the semiconductor layer of the TFT and the fourth impurity area 933b not superimposed with the gate electrodes, 918, 919 is preferable.

The production method for a light emitting device according to the present invention is not limited to the production method explained in this example, and a light emitting device of the present invention can be produced using a known method.

Example 2

In this example, a production method for a light emitting device, different from that of the example 1 will be explained.

Figure 14A:
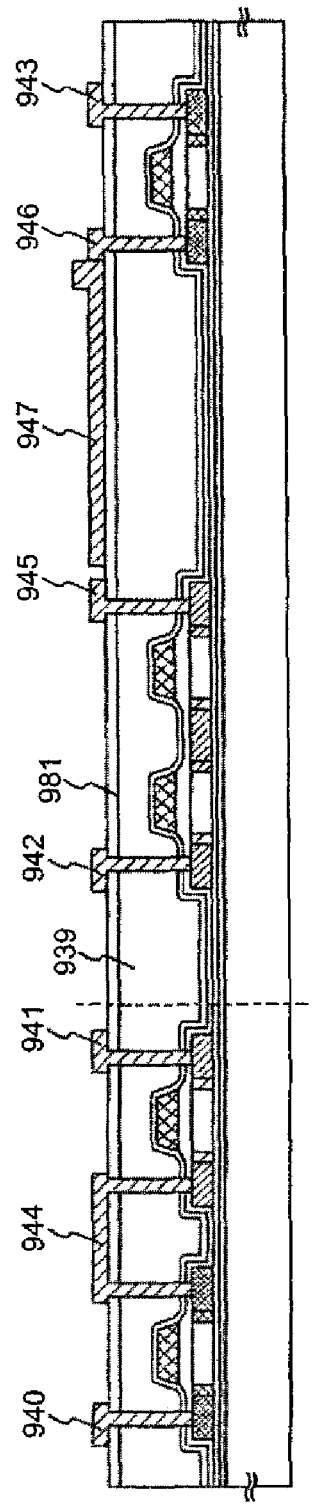
FIGS. 14A and 14B are diagrams showing a production method for a light emitting device of the present invention.

The steps to the formation of the second interlayer insulated film 939 are same as those in the example 5. As shown in FIG. 14A, a passivation film 981 is formed in contact with the second interlayer film 939 after formation of the second interlayer insulated film 981.

The passivation film 981 is effective for preventing entrance of the moisture content contained in the second interlayer insulated film 939 to the organic light emitting layer 950 via the pixel electrode 947 or the third interlayer insulated film 982. In the case the second interlayer insulated film 939 includes an organic resin material, since the organic resin material contains a large amount of the moisture content, it is particularly effective to provide the passivation film 981.

In this example, as the passivation film 981, a silicon nitride film was used.

Thereafter, a resist mask of a predetermined pattern is formed, and a contact hole etching to the source area or the drain area formed in each semiconductor layer is formed. The contact hole is formed by the dry etching method. In this case, first the passivation film 981 is etched using a gas mixture of a $CF_4$ and $O_2$ as the etching gas, next the second interlayer insulated film 939 made of an organic resin material is etched using a gas mixture of a $CF_4$, an $O_2$, and an He as the etching gas, and then subsequently the first interlayer insulated film 937 is etched using a $CF_4$, and $O_2$ as the etching gas. Furthermore, in order to improve the selection ratio with respect to the semiconductor layer, a contact hole can be formed by etching the gate electrode 906 of the third shape with the etching gas changed to a $CHF_3$.

Then, source wirings 940 to 943 and drain wirings 944 to 946 are formed by forming a conductive metal film by the sputtering method or the vacuum deposition method, patterning with a mask, and etching. Although it is not shown in the figure, in this specification, the connection wirings are formed as a laminated film of a Ti film of a 50 nm film thickness, and an alloy film (an alloy film of an Al and a Ti) of a 500 nm film thickness.

Next, a pixel electrode 947 is formed by providing a transparent conductive film thereon by a 80 to 120 nm thickness, and patterning (FIG. 14A). In this example, an indium-tin oxide (ITO) film or a transparent conductive film having 2 to 20[%] of a zinc oxide (ZnO) added to an indium oxide is used as the transparent electrode.

Moreover, the pixel electrode 947 can be connected electrically with the drain area of the transistor Tr2 by forming the same superimposed and connected with the drain wiring 946.

Figure 14B:
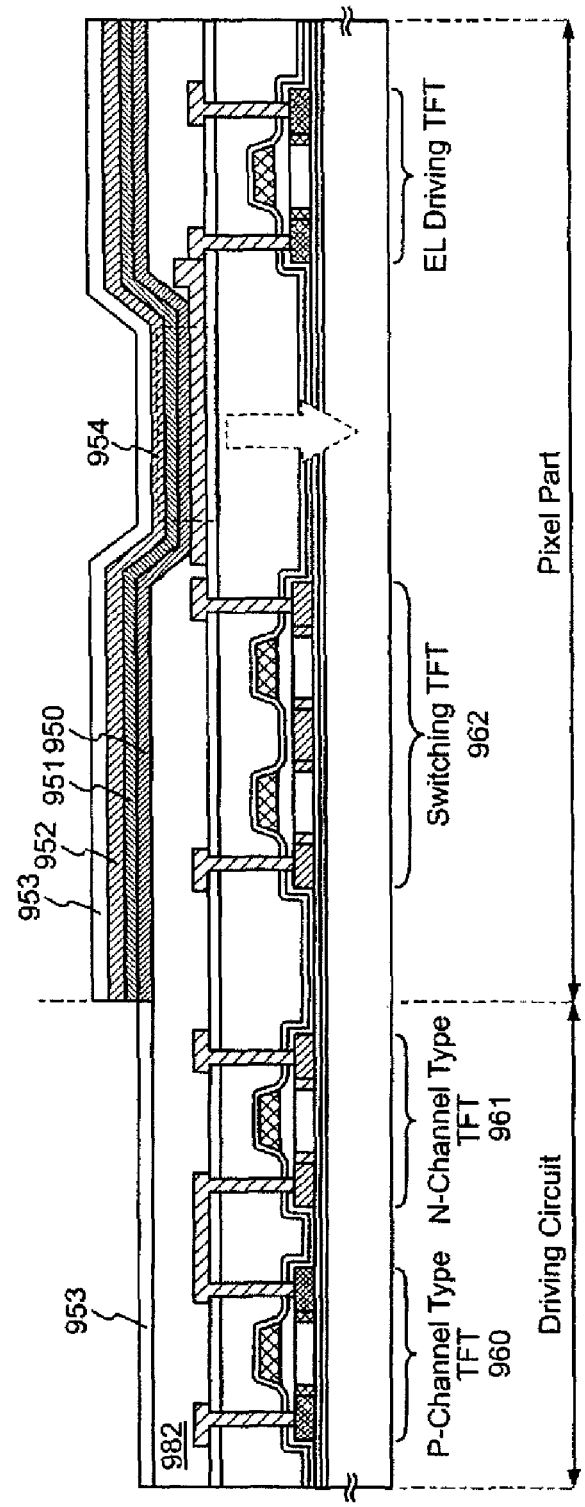

Next, as shown in FIG. 14B, the third interlayer insulated film 982 having an opening part at a position corresponding to the pixel electrode 947 is formed. In this example, a side wall of a tapered shape was provided by using the wet etching method at the time of forming the opening part. Unlike the case of the example 1, since the organic light emitting layer formed on the third interlayer insulated film 982 is not divided, deterioration of the organic light emitting layer derived from a grade difference can involve a significant problem unless the side wall of the opening part is sufficiently smooth, attention should be paid thereto.

In this example, as the third interlayer insulated film 982, in some cases, an organic resin film made of a polyimide, a polyamide, an acrylic, BCB (benzocyclo butene), or the like can be used as well.

It is preferable to have the surface of the third interlayer insulated film 982 densed by applying a plasma process using an argon on the surface of the third interlayer insulated film 982 before forming the organic light emitting layer on the third interlayer insulated film 982. According to the above-mentioned configuration, entrance of the moisture content from the third interlayer insulated film 982 to the organic light emitting layer 950 can be prevented.

Next, an organic light emitting layer 950 is formed by the deposition method, and further, a cathode (MgAg electrode) 951 and a protection electrode 952 are formed by the deposition method. At the time, it is preferable to apply a heat treatment to the pixel electrode 947 for completely eliminating the moisture content prior to the formation of the organic light emitting layer 950 and the cathode 951. Although the MgAg electrode is used as the OLED cathode in this example, another known material can be used as well.

As the organic light emitting layer 950, a known material can be used. Although a two layer structure comprising a hole transporting layer and a light emitting layer is provided as the organic light emitting layer in this example, in some cases any of a hole injecting layer, an electron injecting layer, or an electron transporting layer is provided. Accordingly, various examples of combinations have already been reported, and any configuration can be used.

In this example, a polyphenylene vinylene is formed as the hole transporting layer by the deposition method. Moreover, as the light emitting layer, one having 30 to 40% of a 1,3,4-oxadiazol derivative molecularly dispersed in a polyvinyl carbazol is formed by the deposition method, with about 1% of a coumarin 6 added as a green light emission center.

Moreover, it is also possible to protect the organic light emitting layer 950 from the moisture content or the oxygen by the protection electrode 952, but it is further preferable to provide a protection film 953. IN this example, a 300 nm thickness silicon nitride film is provided as the protection film 953. The protection film can be formed continuously without release to the atmosphere after the protection electrode 952.

Moreover, the protection electrode 952 is provided for preventing deterioration of the cathode 951, and a metal film having an aluminum as the main component is representative thereof. Of course, another material can be used as well. Moreover, since the light emitting layer 950 and the cathode 951 are extremely weak to the moisture content, it is preferable to form continuously to the protection electrode 952 without release to the atmosphere for protecting the organic light emitting layer from the outside air.

The film thickness of the organic light emitting layer 950 can be provided by 10 to 400 [nm] (typically 60 to 150 [nm]), and the thickness of the cathode 951 can be provided by 80 to 200 [nm] (typically 100 to 150 [nm]).

Accordingly, a light emitting device having the structure shown in FIG. 14B can be completed. The part 954 with the pixel electrode 947, the organic light emitting layer 950, and the cathode 951 superimposed corresponds to the OLED.

The p channel type TFT 960 and the n channel type TFT 961 are a TFT of the driving circuit, which provides a CMOS. The transistor Tr2 and the transistor Tr4 are a TFT of the pixel part, and the TFT of the driving circuit and the TFT of the pixel part can be formed on the same substrate.

The production method for a light emitting device according to the present invention is not limited to the production method explained in this example, and a light emitting device of the present invention can be produced using a known method.

Example 3

Figure 15:
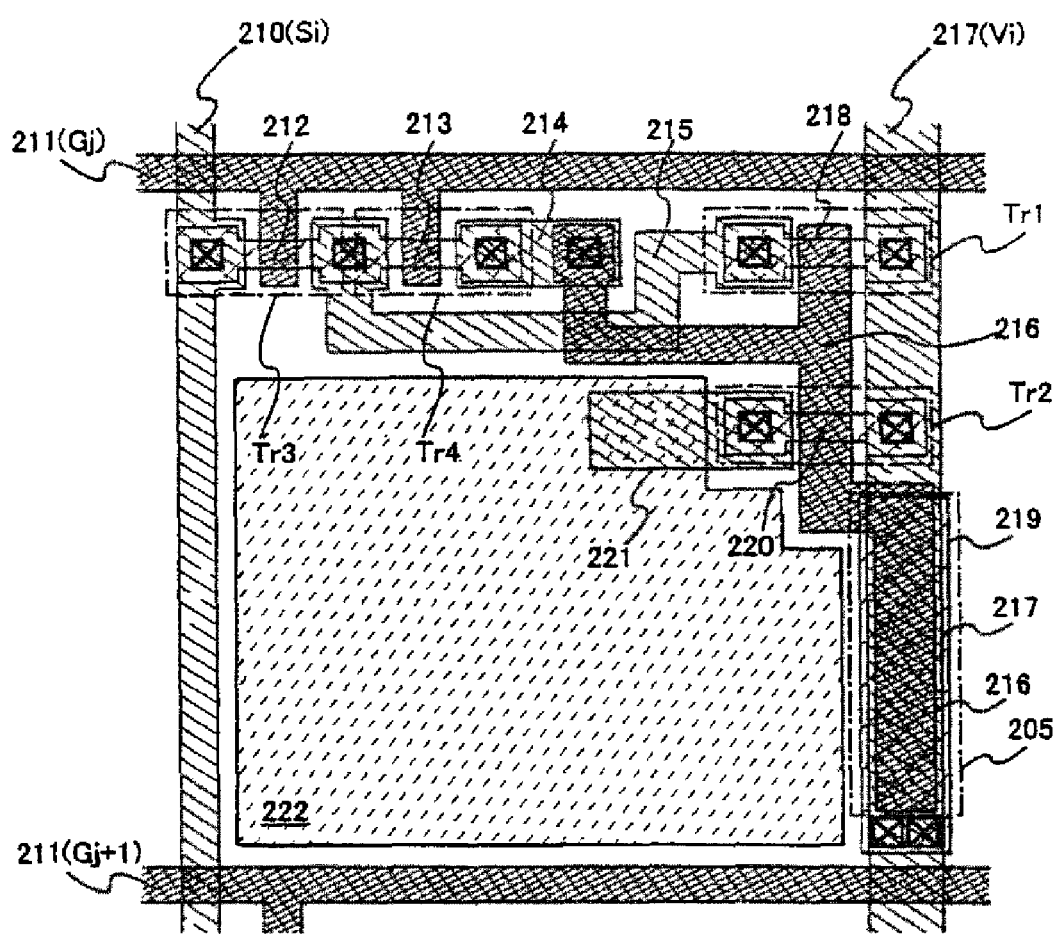
FIG. 15 is a top view of a pixel of a light emitting device of the present invention.

In this example, a top view of the pixel shown in FIG. 7 will be explained. FIG. 15 is a top view of the pixel of this example. In order to clarify the position of the wiring and the position of the semiconductor layer, the insulated films such as the interlayer insulated films and the gate insulated films are omitted. Moreover, the wirings formed in the same layer are shown by the same hatching. Furthermore, FIG. 15 corresponds to a top view of the pixel after formation of the pixel electrode and before formation of the organic light emitting layer.

The pixel shown in FIG. 15 has each one set of a scanning line 211, a signal line 210, and a power source line 217. Then, parts 212, 213 of the scanning line 211 each correspond to the gate electrodes of the transistor Tr3 and the transistor Tr4.

One of the source area and the drain area of the transistor Tr3 is connected with the signal line 210, and the other one is connected with the drain area of the transistor Tr1 via the connection wiring 215. Moreover, one of the source area and the drain area of the transistor Tr4 is connected with the drain area of the transistor Tr1 via the connection wiring 215, and the other one is connected with the capacity wiring 216 via the connection wiring 214.

Parts 218, 220 of the capacity wiring 216 correspond to the gate electrodes of the transistor Tr1 and the transistor Tr2. The source area of the transistor Tr1 is connected with the power source line 217. Moreover, the source area of the transistor Tr2 is connected with the power source line 217. Then, the drain area of the transistor Tr2 is connected with the pixel electrode 222 via the connection wiring 221.

The numeral 219 denotes an active layer for forming a maintaining capacity. The capacity wiring 216 is formed on the active layer 219 for forming a maintaining capacity with the gate insulated filth (not shown) interposed therebetween. The part with the active layer 219 for forming a maintaining capacity, the gate insulated film, and the capacity wiring 216 interposed corresponds to the maintaining capacity 205. The power source line 217 is formed on the capacity wiring 216 with the interlayer insulated film (not shown) interposed therebetween. The capacity formed in the part with the capacity wiring 216, the interlayer insulated film, and the power source line 217 superimposed may be used as the maintaining capacity 205.

The top view of the pixel shown in this example is merely an example of the configuration of the present invention, and thus the top view of the pixel shown in FIG. 7 is not limited to the configuration shown in this example. This example can be executed freely as a combination with the example 1 or the example 2.

Example 4

Figure 16:
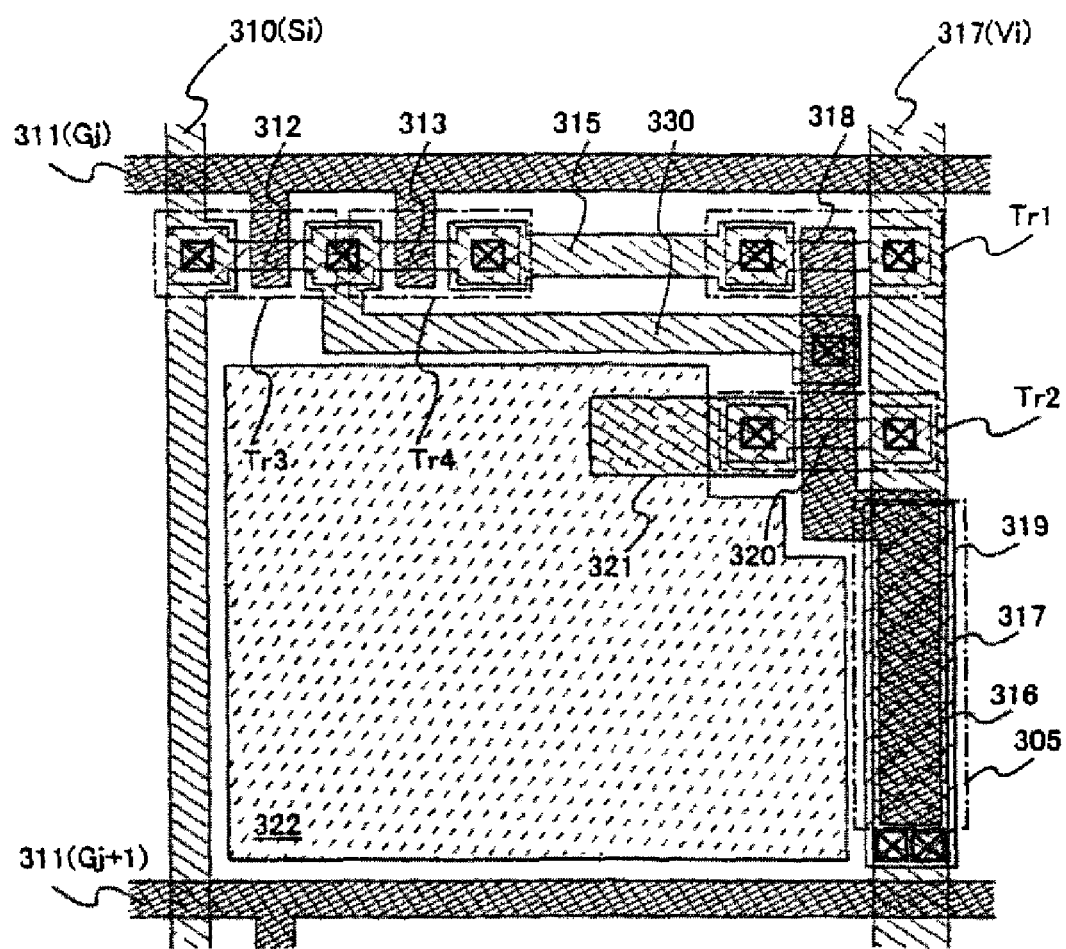
FIG. 16 is a top view of a pixel of a light emitting device of the present invention.

In this example, a top view of the pixel shown in FIG. 8 will be explained. FIG. 16 is a top view of the pixel of this example. In order to clarify the position of the wiring and the position of the semiconductor layer, the insulated films such as the interlayer insulated films and the gate insulated films are omitted. Moreover, the wirings formed in the same layer are shown by the same hatching. Furthermore, FIG. 16 corresponds to a top view of the pixel after formation of the pixel electrode and before formation of the organic light emitting layer.

The pixel shown in FIG. 16 has each one set of a scanning line 311, a signal line 310, and a power source line 317. Then, parts 312, 313 of the scanning line 311 each correspond to the gate electrodes of the transistor Tr3 and the transistor Tr4.

One of the source area and the drain area of the transistor Tr3 is connected with the signal line 310, and the other one is connected with the capacity wiring 316 via the connection wiring 330. Moreover, one of the source area and the drain area of the transistor Tr4 is connected with the capacity wiring 316 via the connection wiring 330, and the other one is connected with the drain area of the transistor Tr1 via the connection wiring 315.

Parts 318, 320 of the capacity wiring 316 correspond to the gate electrodes of the transistor Tr1 and the transistor Tr2. The source area of the transistor Tr1 is connected with the power source line 317. Moreover, the source area of the transistor Tr2 is connected with the power source line 317. Then, the drain area of the transistor Tr2 is connected with the pixel electrode 322 via the connection wiring 321.

The numeral 319 denotes an active layer for forming a maintaining capacity. The capacity wiring 316 is formed on the active layer 319 for forming a maintaining capacity with the gate insulated film (not shown) interposed therebetween. The part with the active layer 319 for forming a maintaining capacity, the gate insulated film, and the capacity wiring 316 interposed corresponds to the maintaining capacity 305. The power source line 317 is formed on the capacity wiring 316 with the interlayer insulated film (not shown) interposed therebetween. The capacity formed in the part with the capacity wiring 316, the interlayer insulated film, and the power source line 317 superimposed may be used as the maintaining capacity 305.

The top view of the pixel shown in this example is merely an example of the configuration of the present invention, and thus the top view of the pixel shown in FIG. 8 is not limited to the configuration shown in this example. This example can be executed freely as a combination with the example 1 or the example 2.

Example 5

In this example, a light emitting device with a configuration different from that of the example 1 will be explained.

Figure 27:
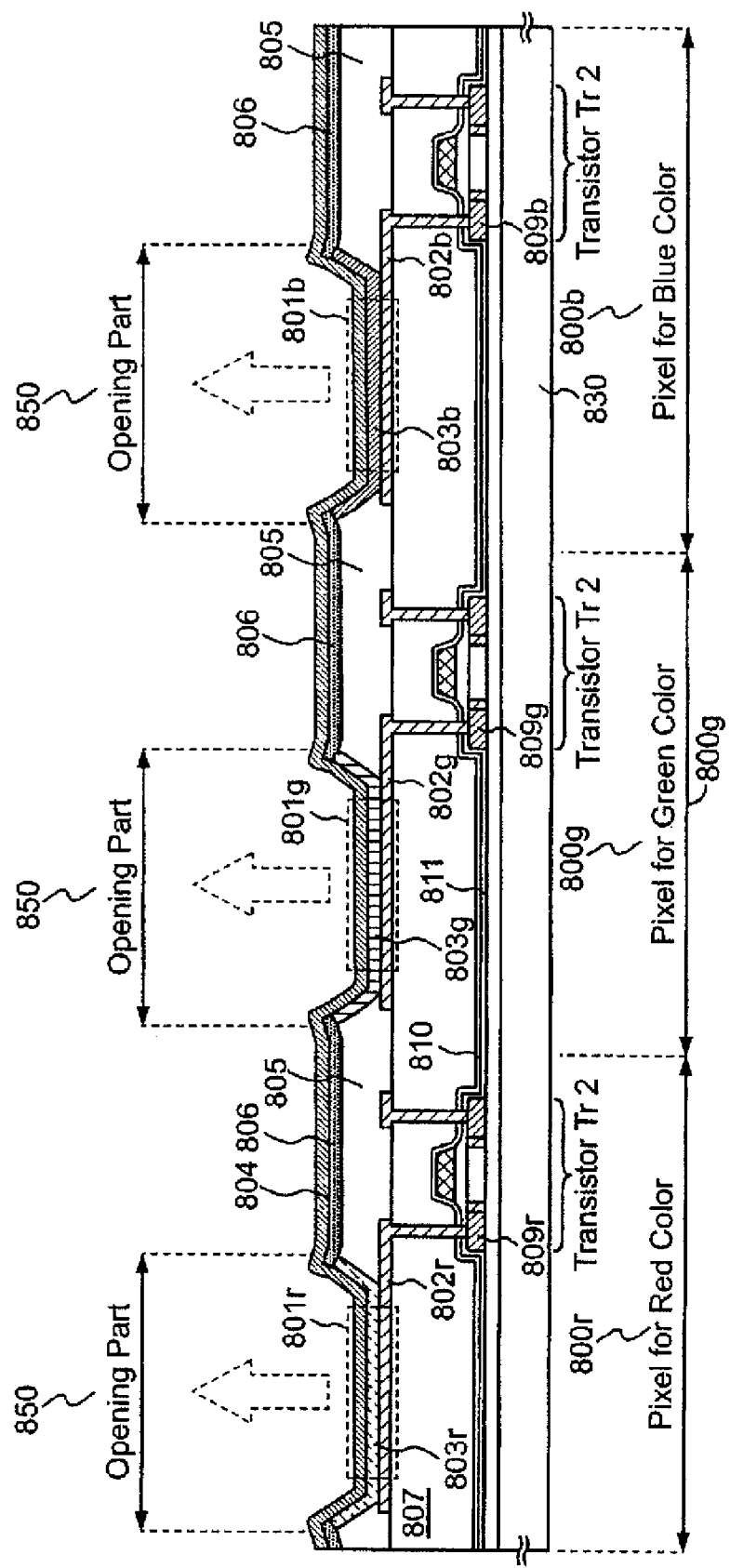
FIG. 27 is a cross-sectional view of a pixel of a light emitting device of the present invention.

FIG. 27 is a cross-sectional view of a pixel part of the light emitting device according to this example. The light emitting device shown in FIG. 27 has a pixel for a red color (pixel for R) 800r, a pixel for a green color (pixel for G) 800g, and a pixel for a blue color (pixel for B) 800b. The configuration of this example can be used not only for a color display light emitting device, but also for a light emitting device for displaying a monochrome image.

For the pixel of each color, the transistor Tr2 is formed on a substrate 830. Although the transistors Tr1, Tr2, Tr3, Tr4 are formed for each pixel in the light emitting device of the present invention, only the transistor Tr2 is shown in FIG. 27.

The pixel electrodes 802r, 802g, 802b (all together referred to as the pixel electrodes 802) are each connected with the drain areas 809r, 809g, 809b of the transistor Tr2 via the contact hole formed in the gate insulated film 811, the first interlayer insulated film 810, and the second interlayer insulated film 807.

In this example, the pixel electrodes are a cathode, and they to not allow the light transmission. Although an MgAg electrode is used as the cathode for the OLED in this example, another known material can be used as well.

Then, the third interlayer insulated film 805 having an opening part at a position superimposed with the pixel electrodes 802r, 802g, 802b is formed covering the pixel electrodes 802r, 802g, 802b and the second interlayer insulated film 807. Although a silicon oxide film is used as the third interlayer insulated film 805 in this example, in some cases, an organic resin film made of a polyimide, a polyamide, an acrylic, a BCB (benzocyclo butane), a silicon oxide film, or the like can be used as well.

Next, at the opening part of the third interlayer insulated film 805, the organic light emitting layers 803r, 803g, 803b (all together referred to as the organic light emitting layers 803) are formed in contact with the pixel electrodes 802r, 802g, 802b. At the time, the organic light emitting layers 803r, 8903g, 803b are formed using a metal mask by the deposition method successively per each color. Although it is conceivable that the organic light emitting layers 803r, 803g, 803b are formed to some extent in a part other than the opening part of the third interlayer insulated film 805 at the time of the deposition, they are formed only at the opening part of the third interlayer insulated film 805 as much as possible.

Next, a conductive layer 806 having a metal is formed at the part other than the opening part in the third interlayer insulated film 805 using the deposition method. As the material for the conductive layer 806, a metal with a low resistance is preferable. Moreover, it is also possible to laminate conductive layers in a plurality of layers so as to be used as a conductive layer. Although a copper is used in this example, the conductive layer 806 material is not limited thereto, and a known metal material having a resistance lower than that of the counter electrode can be used. Since the resistance of the counter electrode to be formed later can be lowered by forming the conductive layer 806 in this example, it is suitable for enlargement of the substrate.

Next, a counter electrode 804 comprising a transparent conductive film is formed covering the organic light emitting layers 803r, 803g, 803b and the conductive layer 806. In this example, an ITO is used as the transparent conductive film. The ITO can be formed by the deposition method. In this example, the case of forming by the ion plating method will be explained.

The ion plating method is one of the gas phase surface treatment techniques classified in the deposition method. It is a method for adhering a deposition substance evaporated by some means to a substrate by ionizing or exciting the same by a high frequency plasma or vacuum discharge, and accelerating the ion by providing a negative potential to the substrate to be deposited.

As the specific condition for forming the counter electrode using the ion plating method, it is preferable to deposit with the substrate temperature maintained at 100 to 300° C. in a 0.01 to 1 Pa inert gas atmosphere. Furthermore, it is preferable to use the ITO as the evaporation source having a 70% or more sintering density. The optimum condition at the time of using the ion plating method can be selected optionally by the operator.

Moreover, since the ionizing ratio or exciting ratio of the deposition substance can be improved by ionizing or exciting the deposition substance using the high frequency plasma as well as the ionized or excited deposition substance is in a high energy state, it can be bonded with the oxygen sufficiently with a high evaporation rate still maintained. Therefore, a good quality film can be formed at a high speed.

In this example, the counter electrode 804 comprising a transparent conductive film was formed by a 80 to 120 nm thickness using the above-mentioned ion plating method. In this example, an indium-tin oxide (ITO) film or a transparent conductive film having 2 to 20 [%] of a zinc oxide (ZnO) added to an indium oxide is used as the transparent electrode.

The method for forming the counter electrode of this example is not limited to the above-mentioned ion plating method. However, since the film formed by the ion plating method has a high close contact property and it can form an ITO film with a high crystallization property even at a relatively low temperature, it can lower the resistance of the ITO as well as it can allow even film formation in a relatively wide area, and thus it is suitable for enlargement of the substrate.

In each pixel, an OLED for R 801r, an OLED for G 801g, and an OLED for B 801b are completed. Each OLED has the pixel electrodes 802r, 802g, 802b, the organic light emitting layers 803r, 803g, 803b, and the counter electrode 804.

Figure 28:
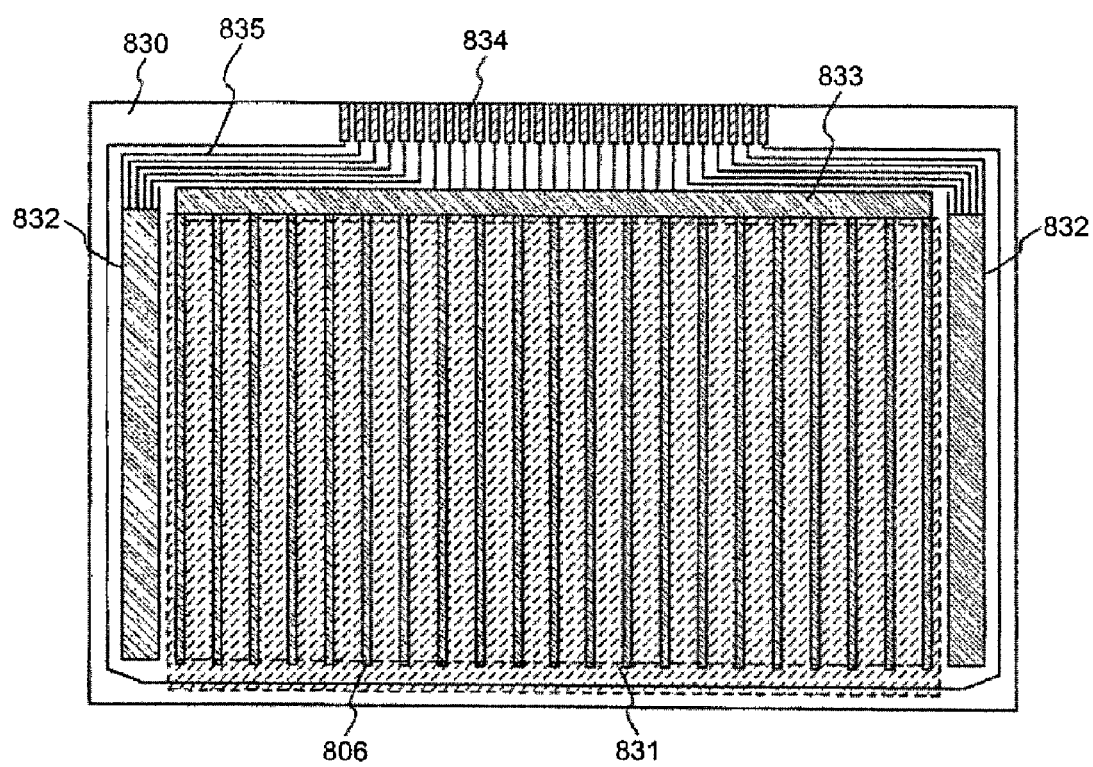
FIG. 28 is a top view of an element substrate of a light emitting device of the present invention.

FIG. 28 is a top view of the substrate with the TFT formed (element substrate) of this example. It shows the state with the pixel part 831, the scanning line driving circuit 832, the signal line driving circuit 833, and the terminal 834 formed in the substrate 830. The terminal 834 and each driving circuit, and the power source line formed in the pixel part and the counter electrode are connected by a lead wiring 835.

Moreover, as needed, an IC chip with a CPU, a memory, or the like formed, can be mounted on the element substrate by the COG (chip on glass) method, or the like.

Figure 29:
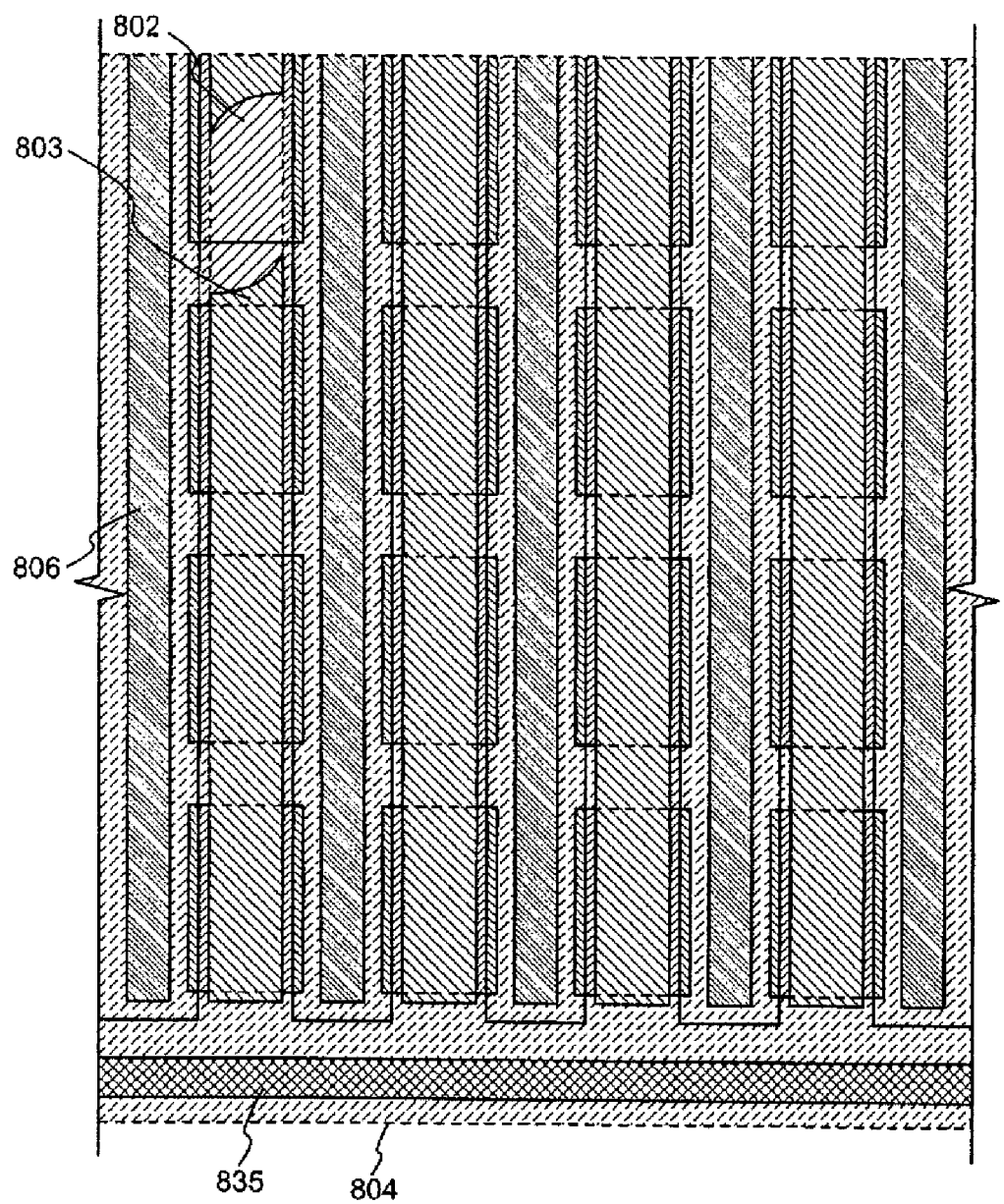
FIG. 29 is an enlarged diagram of the element substrate of the light emitting device of the present invention.

The OLED is formed between the conductive layers 806. The structure thereof is shown in FIG. 29. The pixel electrode 802 is an electrode corresponding to each pixel, formed between the conductive layers 806. In the upper layer thereof, an organic compound layer 803 is formed between the conductive layers 806, continuously in a stripe-like form across a plurality of the pixel electrodes 802.

The counter electrode is formed in the upper layer of the organic compound layer 803 and the conductive layer 806 such that it is also in contact with the conductive layer 806.

The lead line 835 is formed in the same layer as the scanning line (not shown) without direct contact with the conductive layer 806. Then, the lead line 835 and the counter electrode 804 has the contact in the superimposed part.

The configuration of this example can be executed freely as a combination with the example 3 or 4.

Example 6

In this example, the configuration of driving circuits (a signal driving circuit and a scanning line driving circuit) of a light emitting device driven by a digital driving method of the present invention.

Figure 17:
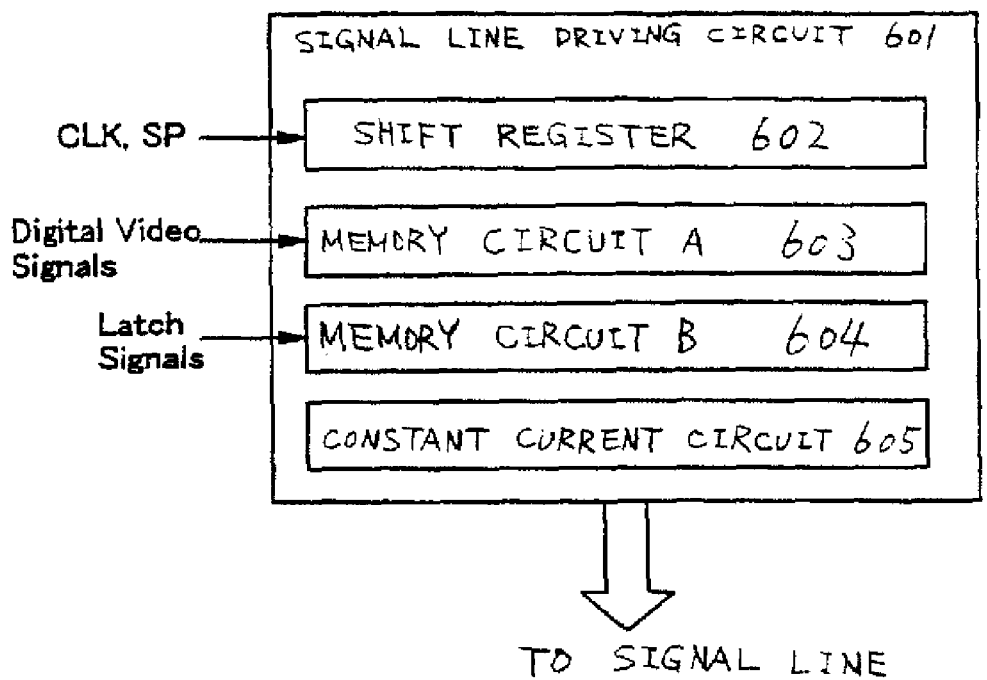
FIG. 17 is a block diagram of a signal line driving circuit.

FIG. 17 is a block diagram showing the configuration of a signal line driving circuit 601. The numeral 602 is a shift resistor, the numeral 603 a memory circuit A, the numeral 604 a memory circuit B, and the numeral 605 a constant current circuit.

To the shift resistor 602, a clock signal CLK and a start pulse signal SP are inputted. Moreover, to the memory circuit A 603, a digital video signal is inputted. And to the memory circuit B 604, a latch signal is inputted. A constant signal current Ic outputted from the constant current circuit 604 is inputted to the signal line.

Figure 18:
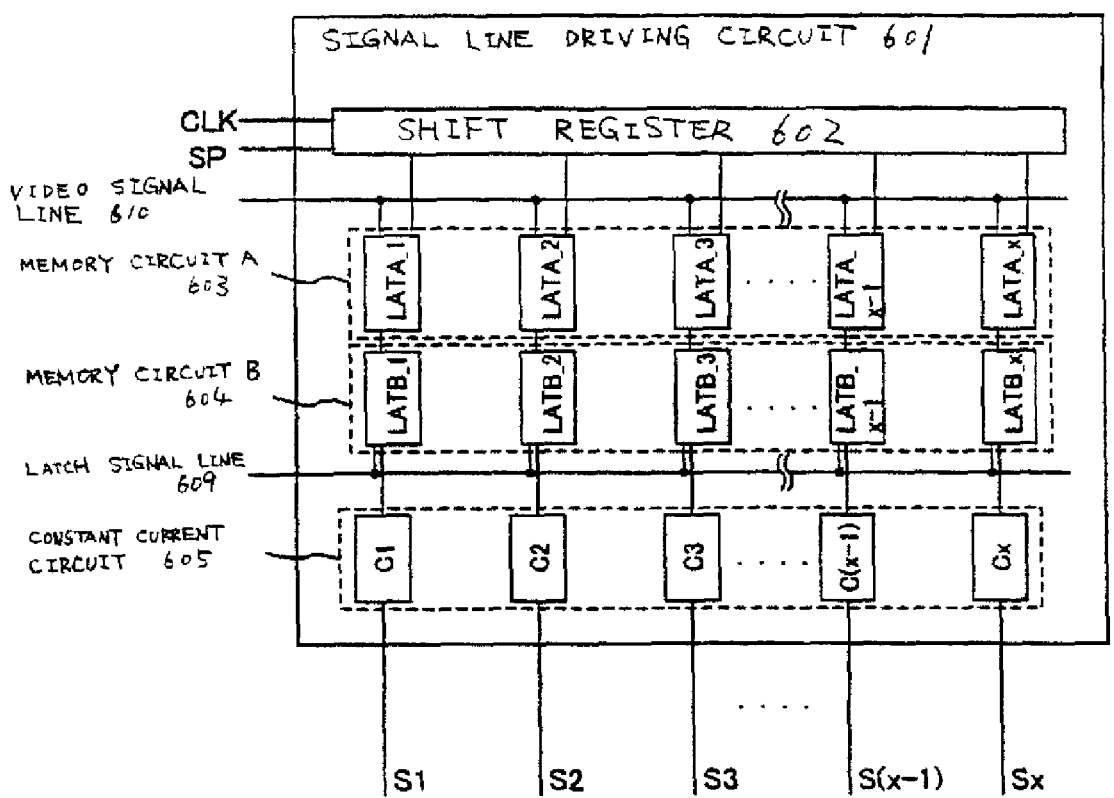
FIG. 18 is a detailed chart of a signal line driving circuit in a digital driving method.

FIG. 18 shows a further detailed configuration of the signal line driving circuit 601.

According to the input of the clock signal CLK and the start pulse signal SP from a predetermined wiring to the shift resistor 602, a timing signal is produced. The timing signal is inputted each to a plurality of latches A (LATA-1 to LATA-x) of the memory circuit A 603. At the time, it is also possible to input the timing signal produced by the shift resistor 602 each to a plurality of the latches A (LATA-1 to LATA-x) of the memory circuit A 603 after buffer amplification by a buffer, or the like.

In the case the timing signal is inputted to the memory circuit A 603, a digital video signal for one bit to be inputted to the video signal line 610 is written successively to each of the plurality of the latches A (LATA-1 to LATA-x) synchronously with the timing signal so as to be stored.

Although the digital video signal is inputted successively to the plurality of the latches A (LATA-1 to LATA-x) of the memory circuit A 603 at the time of taking the digital video signal to the memory circuit A 603 in this embodiment, the present invention is not limited to this configuration. It is also possible to execute the so-called divided drive of driving latches of a plurality of stages of the memory circuit A 603 into several stages, and inputting a digital video signal simultaneously for each group. The number of the groups at the time is called the division number. For example, in the case latches are divided into groups for 4 stages, it is called the four division divided drive.

The time needed for finishing each writing operation of a digital video signal to the latches of all the stages of the memory circuit A 603 is called the line period. In the real situation, the period with the horizontal retrace line period added to the line period may be referred to as the line period.

In the case one line period is finished, a latch signal is supplied to a plurality of latches B (LATB-1 to LATB-x) of the memory circuit B 604 via the latch signal line 609. At the moment, the digital video signals stored in the plurality of the latches A (LATA-1 to LATA-x) of the memory circuit A 603 are written and stored in the plurality of the latches B (LATB-1 to LATB-x) of the memory circuit B 604 all together.

A digital video signal for the next one bit is written in the memory circuit A 603 after sending out the digital video signals to the memory circuit B 604, based on the timing signal from the shift registor 602 successively.

In the second one line period, the digital video signals written and stored in the memory circuit B 604 are inputted to the constant current circuit 605.

The constant current circuit 605 has a plurality of current setting circuits (C1 to Cx). In the case a digital video signal is inputted to each of the current setting circuits (C1 to Cx), based on the information of 1 or 0 of the digital video signal, either supply of a constant current Ic in the signal line, or application of a potential of the power source lines V1 to Vx to the signal line, is selected.

Figure 19:
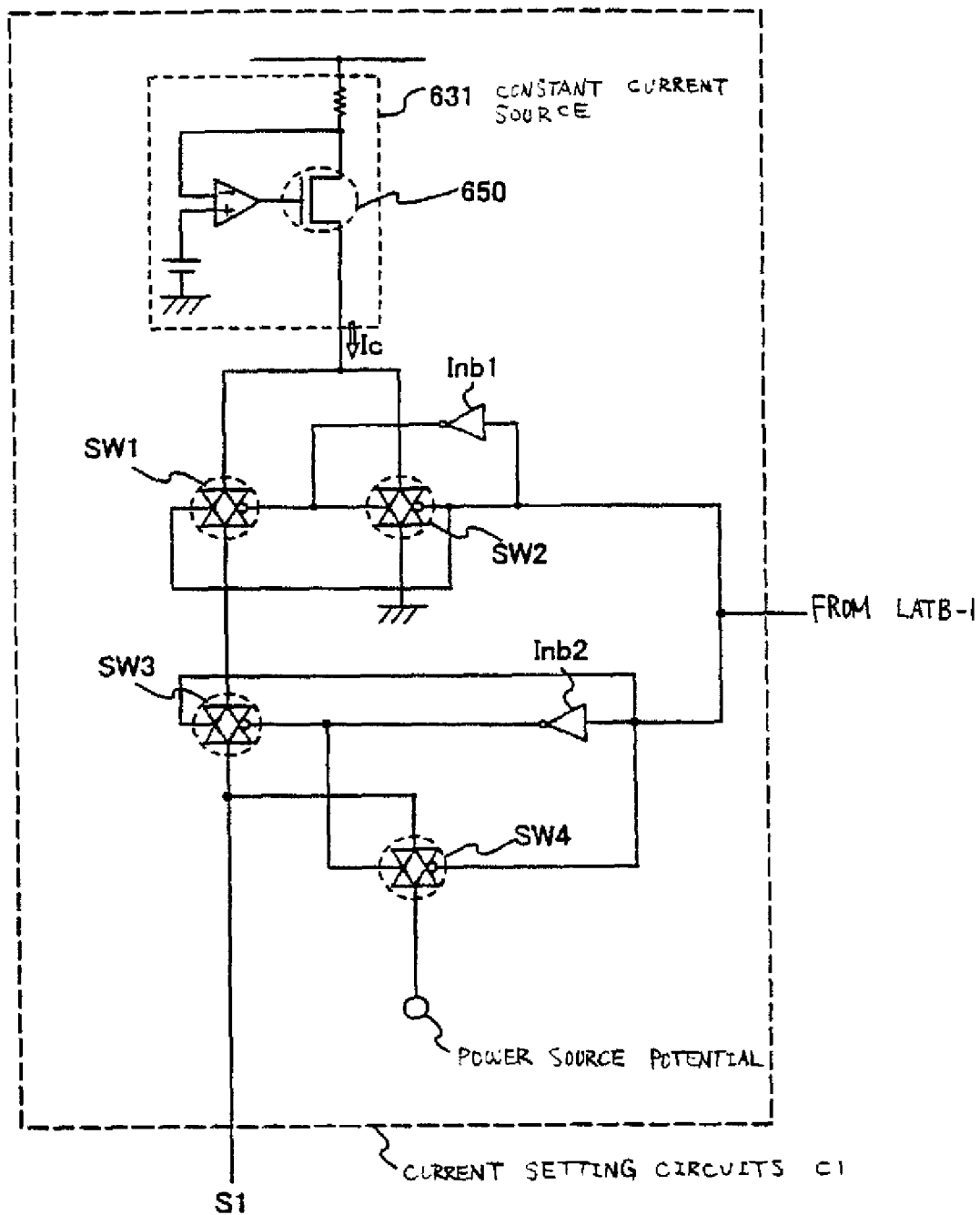
FIG. 19 is a circuit diagram of a current setting circuit in a digital driving method.

FIG. 19 shows an example of a specific configuration of the current setting circuit C1. The current setting circuits C2 to Cx have the same configuration.

The current setting circuit C1 has a constant current source 631, four transmission gates SW1 to SW4, and two inverters Inb1, Inb2. The polarity of the transistor 650 of the constant current source 631 is same as the polarity of the transistors Tr1 and Tr2 of the pixel.

According to the digital video signal outputted from the LATE-1 of the memory circuit B 604, the switching operation of SW1 to SW4 is controlled. The digital video signals inputted to SW1 and SW3 and the digital video signals inputted to SW2 and SW4 are inverted by Inb1, Inb2. Therefore, in the case SW1 and SW3 are on, SW2 and SW4 are off, and in the case SW1 and SW3 are off, SW2 and SW4 are on.

In the case SW1 and SW3 are on, a current Ic of a predetermined value except 0 is inputted from the constant current source 631 to the signal line S1 via SW1 and SW3.

In contrast, in the case SW2 and SW4 are on, the current IC from the constant current source 631 is provided to the ground via SW2. Moreover, the power source potential from the power source lines V1 to Vx is provided to the signal line S1 via SW4 so as to be Ic≈0.

With reference to FIG. 18, the above-mentioned operation is executed simultaneously in a one line period for all the current setting circuits (C1 to Cx) of the constant current circuit 605. Therefore, the value of the signal current Ic inputted to all the signal lines is selected by the digital video signals.

Next, the configuration of the scanning line driving circuit will be explained.

Figure 20:
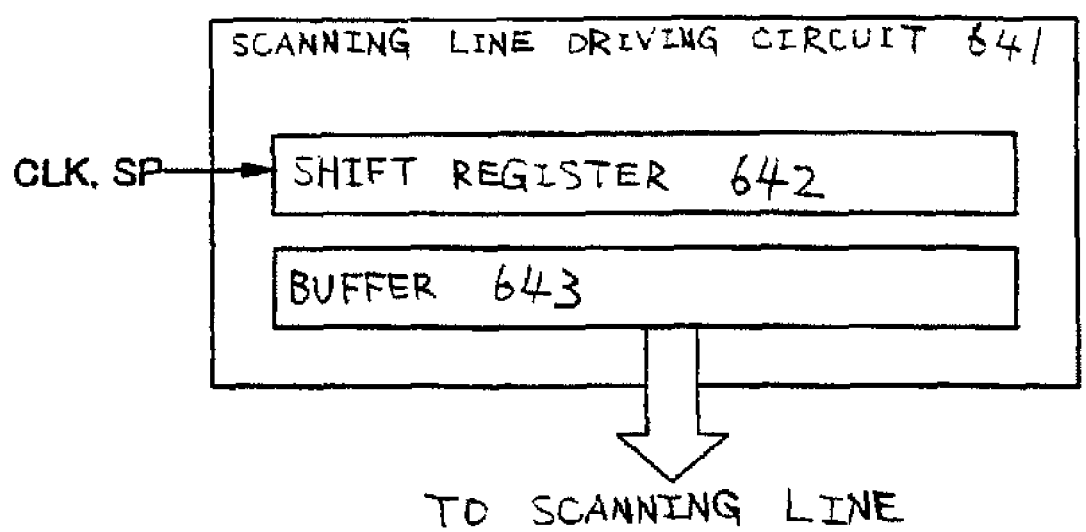
FIG. 20 is a block diagram of a scanning line driving circuit.

FIG. 20 is a block diagram showing the configuration of the scanning line driving circuit 641.

The scanning line driving circuit 641 each has a shift registor 642, and a buffer 643. In some cases, a level shifter may be provided as well.

In the scanning line driving circuit 641, by inputting the clock CLK and the start pulse signal SP to the shift registor, a timing signal is produced. The produced timing signal is buffer-amplified by the buffer 643 so as to be supplied to a corresponding scanning line.

The scanning line is connected with the gate electrodes of the first switching TFT and the second switching TFT for a pixel of one line. Since the first switching TFT and the second switching TFT for a pixel of one line should be switched on simultaneously, one capable of supplying a large amount of the current is used as the buffer 643.

The driving circuit used in the present invention is not limited to the configuration shown in this example. The constant current circuit shown in this example is not limited to the configuration shown in FIG. 19. The constant current circuit used in the present invention can have any configuration as long as either one of the binary of the signal current Ic can be selected by the digital video signal, and the signal current of the selected value can be provided to the signal line.

The configuration of this example can be executed freely as a combination with the examples 1 to 5.

Example 7

In this example, the order of appearance of the sub frame periods SF1 to SFn in the driving method for a light emitting device according to the present invention corresponding to a digital video signal of n bits will be explained.

Figure 21:
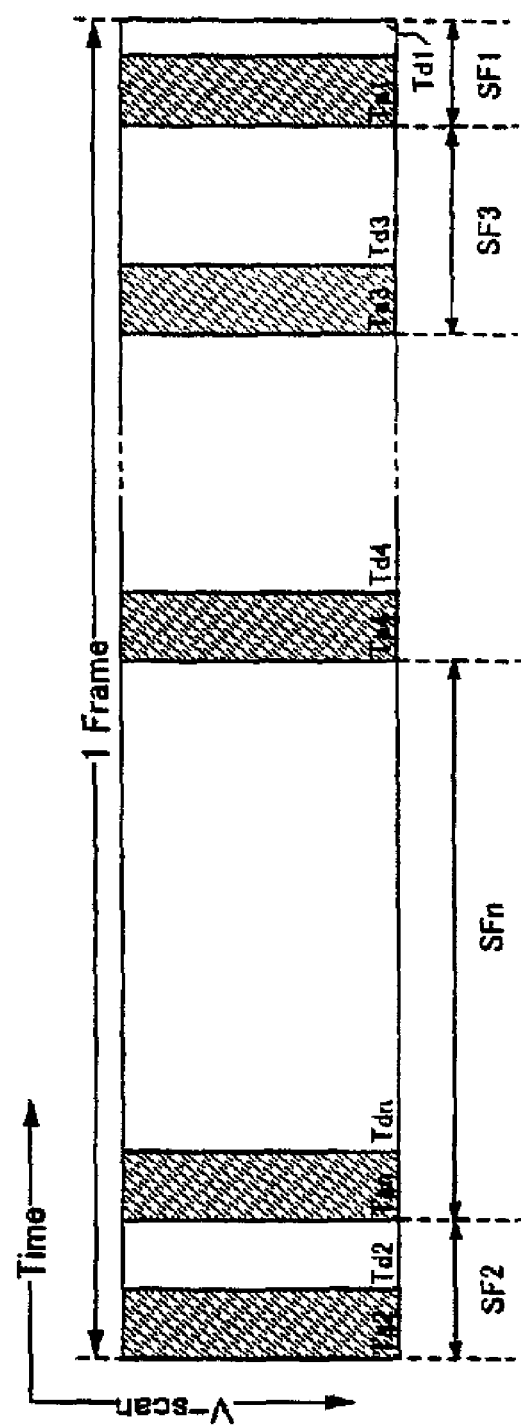
FIG. 21 is a chart showing the timing of a writing period and a display period appearing in a digital driving method.

FIG. 21 shows a timing n sets of writing periods (Ta1 to Tan) and n sets of display periods (Td1 to Tdn) appearing in one frame period. The lateral axis represents the time and the vertical axis represents the position of the scanning line of the pixel. As to the detailed operation of each pixel, the embodiments can be referred to, and thus it is omitted here.

In the driving method of this example, the sub frame period (in this example, SFn) having the longest display period in the one frame period is not provided at the first and the last of the one frame period. In other words, another sub frame period contained in the same frame period appears before and after the sub frame period having the longest display period in the one frame period.

According to the above-mentioned configuration, display irregularity derived from the successive arrangement of the display periods for emitting a light in the adjacent frame periods in the middle gradient display can hardly be recognized by human eyes.

The configuration of this example is effective in the case of n≧3. Moreover, the configuration of this example can be executed freely as a combination with the examples 1 to 6.

Example 8

In this example, an example of driving the light emitting device of the present invention using a digital video signal of 6 bits will be explained.

Figure 22:
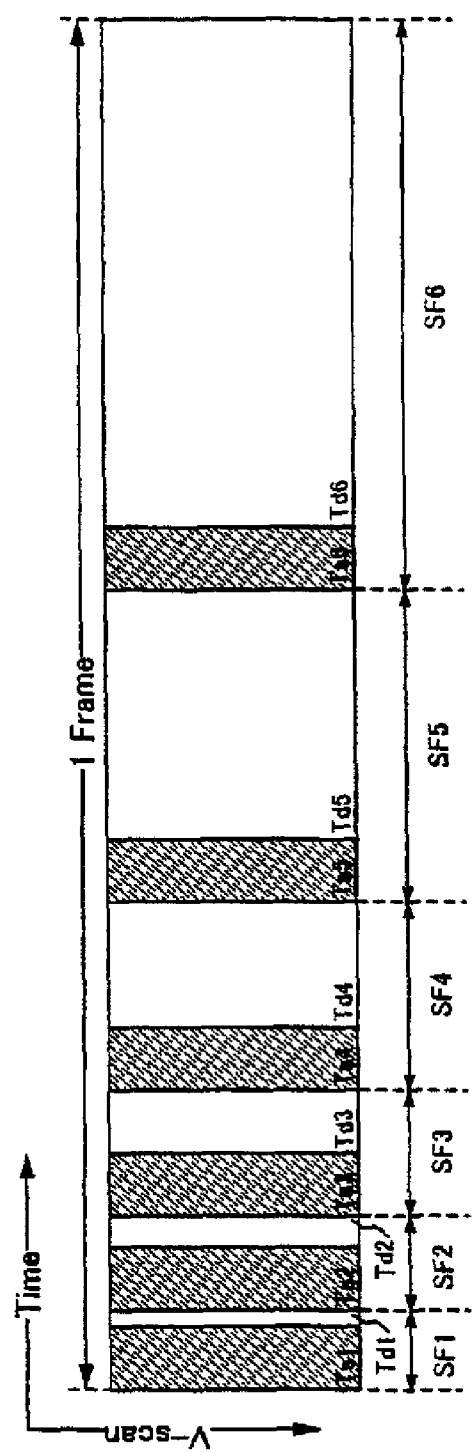
FIG. 22 is a chart showing the timing of a writing period and a display period appearing in a digital driving method.

FIG. 22 shows a timing of 6 sets of writing periods (Ta1 to Ta6) and 6 sets of display periods (Td1 to Td6) appearing in one frame period. The lateral axis represents the time and the vertical axis represents the position of the scanning line of the pixel. As to the detailed operation of each pixel, the embodiments can be referred to, and thus it is omitted here.

In the case of the drive using a digital video signal of 6 bits, at least 6 sets of sub frame periods SF1 to SF6 are provided in the one frame period.

The sub frame periods SF1 to SF6 correspond to each bit of the digital signal of 6 bits. The sub frame periods SF1 to SF6 have 6 sets of the writing periods (Ta1 to Ta6) and 6 sets of the display periods (Td1 to Td6).

The sub frame period having the writing period Tam and the display period Tdm corresponding to the m-th bit (m is an optional number of 1 to 6) is SFm. After the writing period Tam, the display period corresponding to the same bit number, in this case, Tdm appears.

By repeated appearance of the writing period Ta and the display period Td in the one frame period, an image can be displayed.

The length of the display periods SF1 to SF6 satisfies $SF1:SF2:\ldots:SF6=2^0:2^1:\ldots:2^5$.

According to the driving method of the present invention, the gradient is displayed by controlling the sum of the length of the display period with the light emission in the one frame period.

The configuration of this example can be executed freely as a combination with the examples 1 to 7.

Example 9

In this example, an example of the driving method using a digital video signal of n bits, which is different from that of FIG. 6 and FIG. 21.

Figure 23:
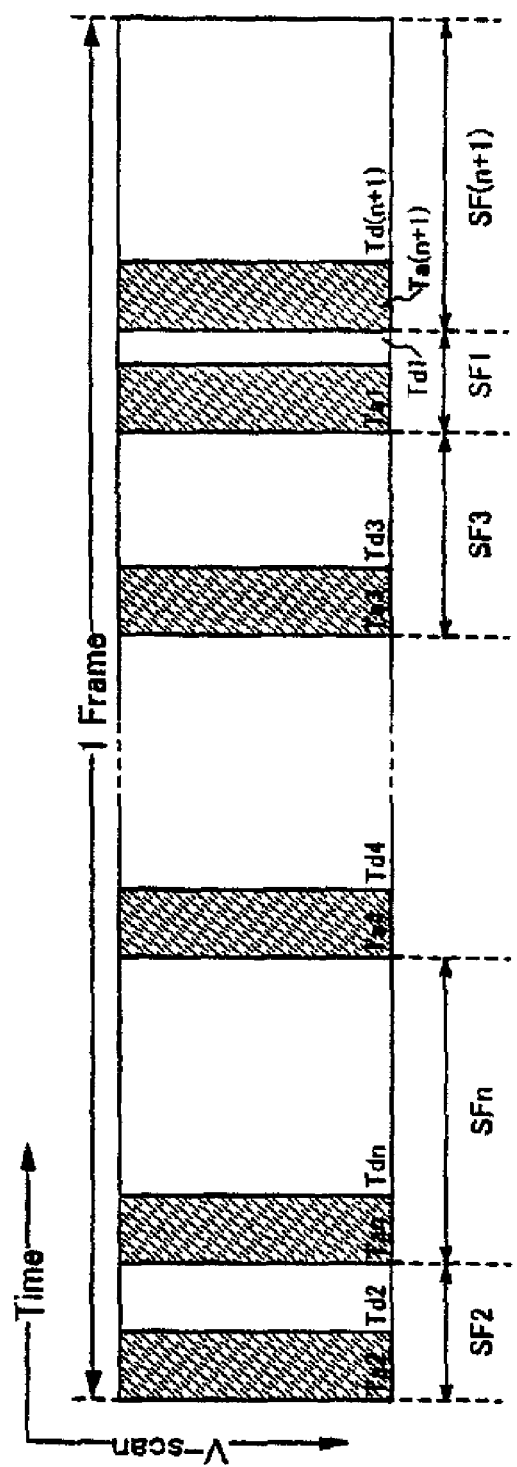
FIG. 23 is a chart showing the timing of a writing period and a display period appearing in a digital driving method.

FIG. 23 shows a timing of n+1 sets of writing periods (Ta1 to Ta(n+1)) and n+1 sets of display periods (Td1 to Td(n+1)) appearing in one frame period. The lateral axis represents the time and the vertical axis represents the position of the scanning line of the pixel. As to the detailed operation of each pixel, the embodiments can be referred to, and thus it is omitted here.

In this example, corresponding to the n bit digital video signal, n+1 sets of sub frame periods SF1 to SFn+1 are provided in the one frame period. Then, the sub frame periods SF1 to SFn+1 have n+1 sets of the writing periods (Ta1 to Ta(n+1)) and n+1 sets of the display periods (Td1 to Td(n+1)).

The sub frame period having the writing period Tam and the display period Tdm (m is an optional number of 1 to n+1) is SFm. After the writing period Tam, the display period corresponding to the same bit number, in this case, Tdm appears.

The sub frame periods SF1 To SFn−1 correspond to each bit of the digital signal of 1 to (n−1) bits. The sub frame periods SFn and SF(n+1) correspond to the digital video signal of the n-th bit.

Moreover, in this example, the sub frame periods SFn and SF(n+1) corresponding to the digital video signal of the same bit do not appear continuously. In other words, another sub frame period is provided between the sub frame periods SFn and SF(n+1) corresponding to the digital video signal of the same bit.

By repeated appearance of the writing period Ta and the display period Td in the one frame period, an image can be displayed.

The length of the display periods SF1 to SFn+1 satisfies $SF1:SF2:\ldots:(SFn+SF(n+1))=2^0:2^1:\ldots:2^{(n-1)}$.

According to the driving method of the present invention, the gradient is displayed by controlling the sum of the length of the display period with the light emission in the one frame period.

In this example, according to the above-mentioned configuration, display irregularity derived from the successive arrangement of the display periods for emitting a light in the adjacent frame periods in the middle gradient display can hardly be recognized by human eyes.

Although the case with two sub frame periods corresponding to the same bit has been explained in this example, the present invention is not limited thereto. Sub frame periods corresponding to the same bit in one frame period can be provided three or more.

Moreover, although a plurality of sub frame periods corresponding to the digital video signal of the uppermost position bit have been provided in this example, the present invention is not limited thereto. Sub frame periods corresponding to a digital video signal of a bit other than the bit of the uppermost position can be provided in a plurality. Furthermore, the bit provided with a plurality of the corresponding sub frame periods is not limited to one, and a configuration having a plurality of sub frame periods each to several bits can be adopted as well.

The configuration of this example is effective in the case of n=2. Moreover, the configuration of this example can be executed freely as a combination with the examples 1 to 8.

Example 10

In this example, the configuration of a signal line driving circuit of a light emitting device according to the present invention driven by an analog driving method will be explained. As to the configuration of the scanning line driving circuit, one described in the example 6 can be adopted, explanation is omitted here.

Figure 31A:
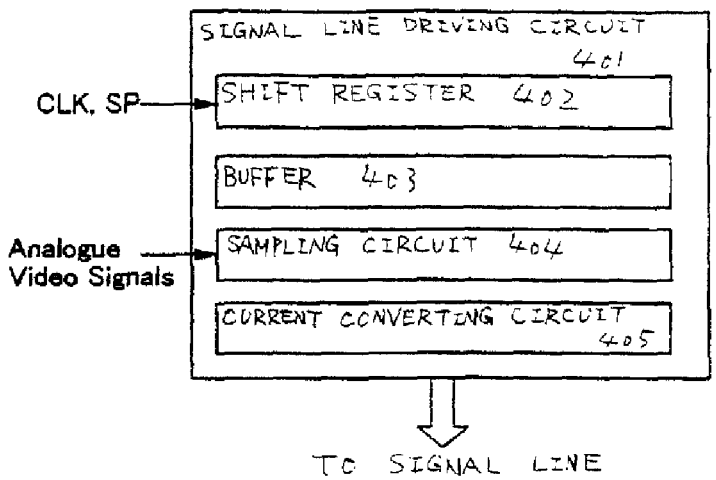
FIGS. 31A and 31B are a detailed chart of a signal line driving circuit in a digital driving method.

FIG. 31A is a block diagram of a signal line driving circuit 401 of this example. The numeral 402 is a shift resistor, the numeral 403 a buffer, the numeral 404 a sampling circuit, and the numeral 405 is a current converting circuit.

To the shift register 402, a clock signal (CLK), and a start pulse signal (SP) are inputted. In the case the clock signal (CLK) and the start pulse signal (SP) are inputted to the shift resistor 402, a timing signal is produced.

The produced timing signal is amplified or buffer-amplified by the buffer 403 so as to be inputted to the sampling circuit 404. Moreover, the timing signal can be amplified by providing a level shifter instead of the buffer. Furthermore, both the buffer and the level shifter can be provided.

Figure 31B:
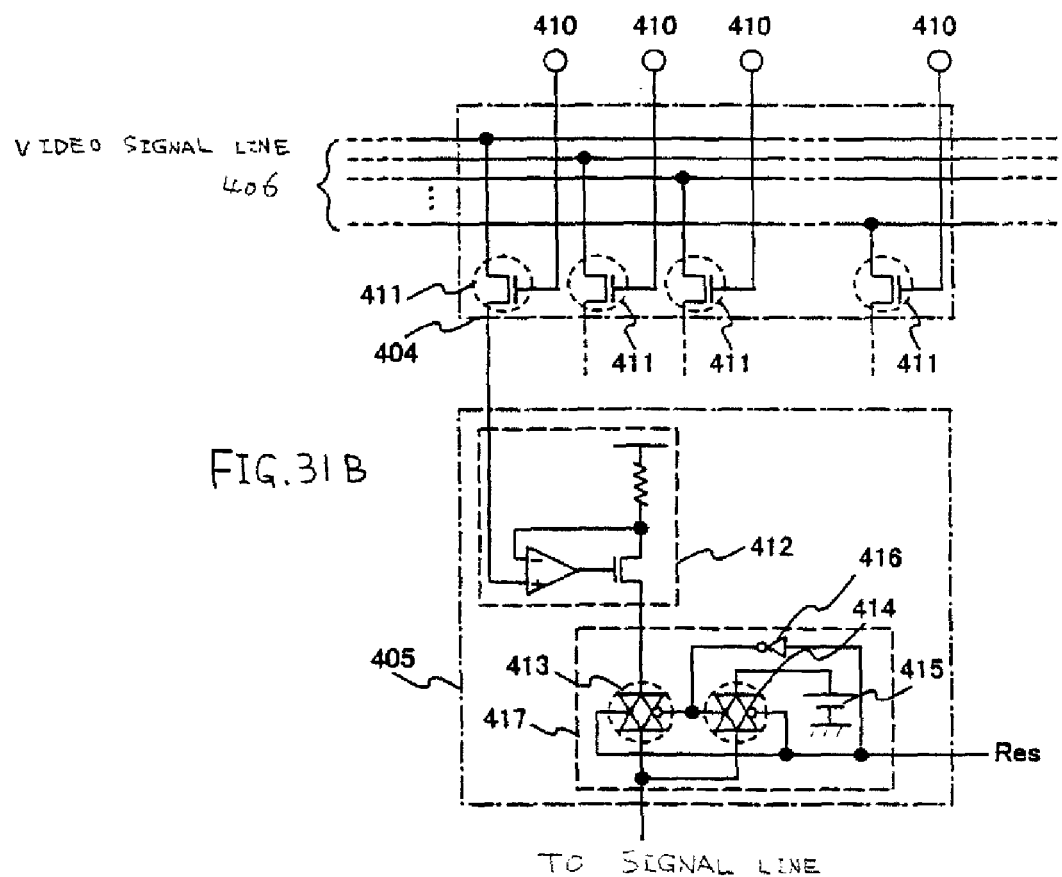

FIG. 31B shows a specific configuration of the sampling circuit 404 and the current converting circuit 405. The sampling circuit 404 is connected with the buffer 403 at the terminal 410.

The sampling circuit 404 is provided with a plurality of switches 411. Furthermore, an analog video signal is inputted from the video signal line 406 to the sampling circuit 404. The switch 411 samples the analog video signal synchronously with the timing signal so as to input the same to the current converting circuit 405 in the later stage. Although FIG. 31B shows only the configuration of the current converting circuit 405 connected with one of the switches 411 of the sampling circuit 404, the current converting circuit 405 as shown in FIG. 31B is connected in the later stage of each switch 411.

Although only one transistor is used for the switch 411 in this example, any switch capable of sampling the analog video signal synchronously with the timing signal can be adopted as the switch 411, and thus it is not limited to the configuration of this example.

The sampled analog video signal is inputted to a current output circuit 412 of the current converting circuit 405. The current output circuit 412 outputs a current (signal current) of a value corresponding to the voltage of the inputted video signal. Although a current output circuit is provided using an amplifier and a TFT in FIG. 31, the present invention is not limited to the configuration, and any circuit capable of outputting the current of a value corresponding to the voltage of the inputted signal can be adopted.

The signal current is inputted to a reset circuit 417 of the current converting circuit 405. The reset circuit has two analog switches 413, 414, an inverter 416, and a power source 415.

A reset signal (Res) is inputted to the analog switch 414, and a reset signal (Res) inverted by the inverter 416 is inputted to the analog switch 413. Then, the analog switch 413 and the analog switch 414 are operated synchronously each with the inverted reset signal and the reset signal such that when one is on, the other is off.

In the case the analog switch 413 is on, the signal current is inputted to the corresponding signal line. In contrast, in the case the analog switch 414 is on, the potential of the power source 415 is provided to the signal line so that the signal line is reset. It is preferable that the potential of the power source 415 is at substantially same height as the potential of the power source line provided to the pixel. And the current supplied to the signal line when the signal line is reset is preferably close to 0 as much as possible.

It is preferable that the signal line is reset in the retrace line period. However, it is possible to reset in a period other than the retrace line period as needed as long as it is not a period showing an image.

The configuration of the signal line driving circuit and the scanning line driving circuit for driving the light emitting device of the present invention is not limited to that shown in this example. The configuration of this example can be executed freely as a combination with the examples 1 to 9.

Example 11

In this example, by using an organic light emitting material capable of utilizing the phosphorescence from a triplet exciton to the light emission, the external light emission quantum efficiency can dramatically be improved. Thereby, a low power consumption, a long life, and a light weight of the OLED can be achieved.

Here, a report of improvement of the external light emission quantum efficiency utilizing the triplet exciton will be shown. (T. Tsutsui, C. Adachi, S. Saito, Photochemical Processes In organized Molecular Systems, ed. K. Honda, (Elsevier Sci. Pub., Tokyo, 1991) p. 437.)

A molecular formula of the organic light emitting material (coumarin pigment) reported in the above-mentioned article is shown below.

[Chemical formula 1]

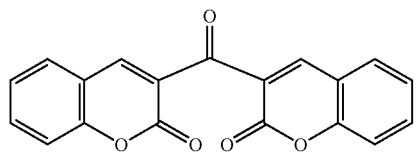

(M. A. Baldo, D., F. O'Brien, Y. You, A. Shoustikov, S. Sibley, M. E. Thompson, S. R. Forrest, Nature 395 (1998) p. 151.)

A molecular formula of the organic light emitting material (Pt complex) reported in the above-mentioned article is shown below.

[Chemical formula 2]

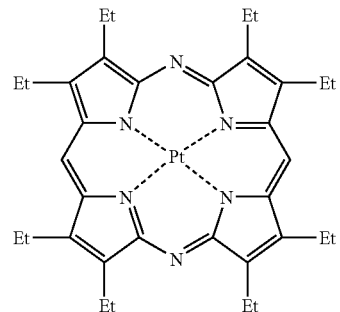

(M. A. Baldo, S. Lamansky, P. E. Burrrows, M. E. Thompson, S. R. Forrest, Appl. Phys. Lett., 75 (1999) p. 4.) (T. Tsutsui, M. J.-Yang, M. Yahiro, K. Nakamura, T. Watanabe, T. Tsuji, Y. Fukuda, T. Wakimoto, S. Mayaguchi, Jpn. Appl. Phys., 38 (12B) (1999) L1502.)

A molecular formula of the organic light emitting material (Ir complex) reported in the above-mentioned article is shown below.

[Chemical formula 3]

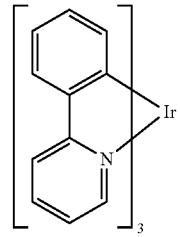

In the case the phosphorescence light emission from the triplet excitor can be utilized as mentioned above, in principle, a high external light emission quantum efficiency three to four times as much as the case of utilizing the fluorescence light emission from a singlet excitor can be realized.

The configuration of this example can be executed freely as a combination with any of the examples 1 to 10.

Example 12

An example of producing a light emitting device using the present invention will be explained in this example with reference to FIG. 24.

Figure 24A:
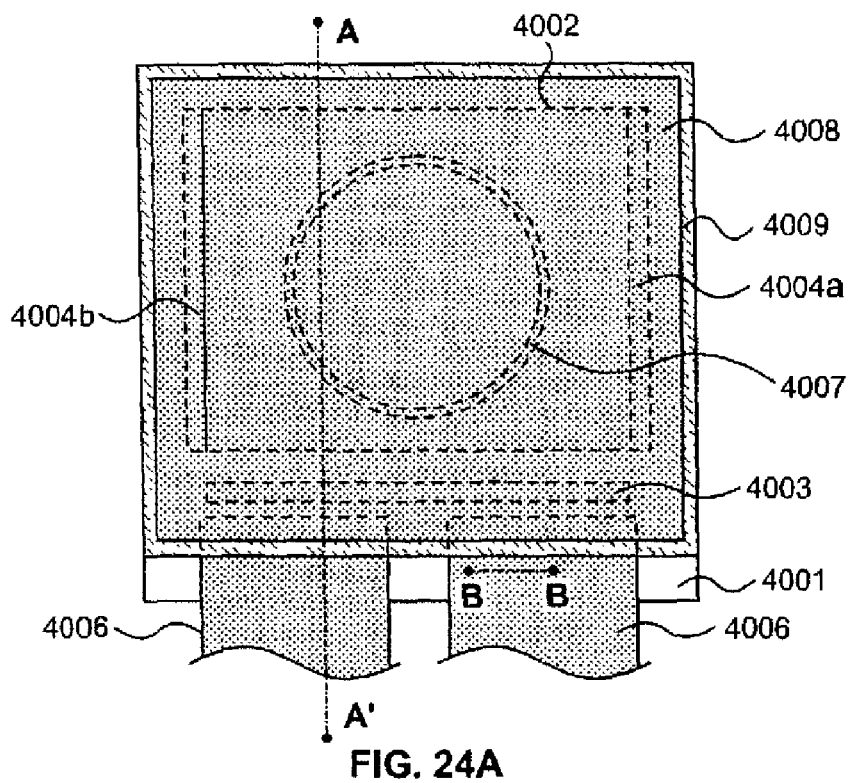
FIGS. 24A to 24C are an external appearance diagram and cross-sectional views of a light emitting device of the present invention.
Figure 24B:
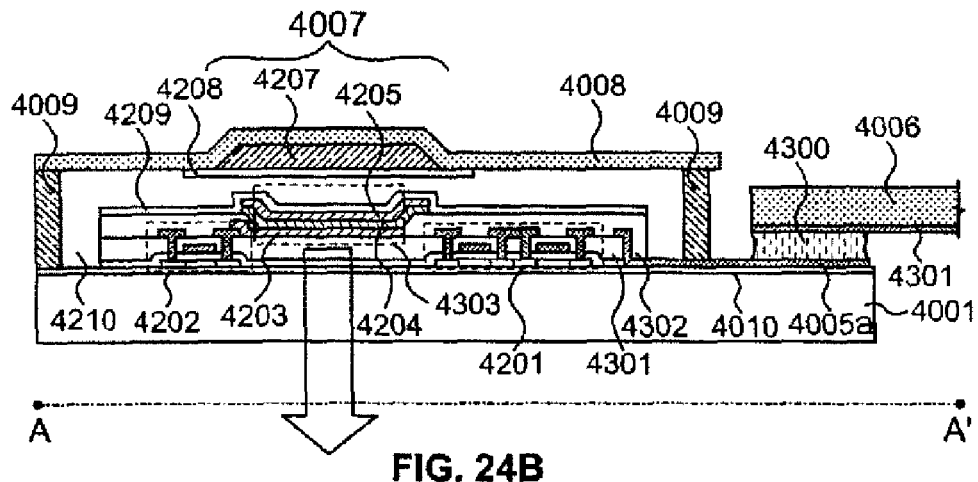
Figure 24C:
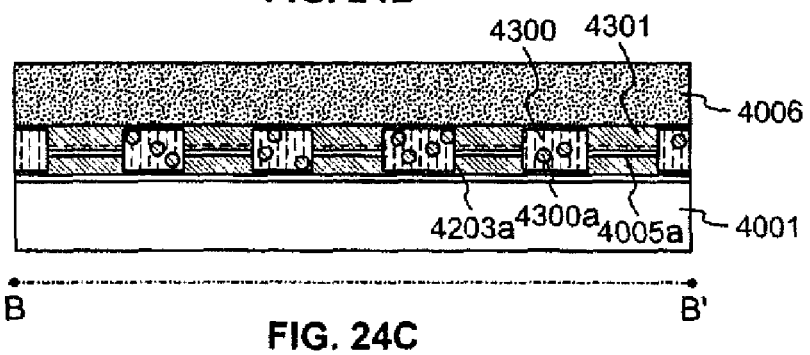

FIG. 24 is a top view of a light emitting device formed by sealing the element substrate with the TFT formed by a sealing material. FIG. 24B is a cross-sectional view taken on the line A-A' in FIG. 24A, and FIG. 24C is a cross-sectional view taken on the line B-B' of FIG. 24A.

A sealing material 4009 is provided surrounding a pixel part 4002 provided on a substrate 4001, a signal line driving circuit 4003, and first and second scanning line driving circuits 4004a, b. Moreover, a sealing material 4008 is provided on the pixel part 4002, the signal line driving circuit 4003, and the first and second scanning line driving circuits 4004a, b. Accordingly, the signal pixel part 4002, the signal line driving circuit 4003, and the first and second scanning line driving circuits 4004a, b are sealed in a filling material 4210 by the substrate 4001, the sealing material 4009 and the sealing material 4008.

Moreover, the pixel part 4002 provided on the substrate 4001, the signal line driving circuit 4003, and the first and second scanning line driving circuits 4004*a, b* have a plurality of TFTs. FIG. 24B shows representatively a driving TFT included in the signal line driving circuit 4003, formed on the base film 4010 (here, the n channel type TFT and the p channel TFT) 4201, and a current controlling TFT (transistor Tr2) included in the pixel part 4002.

In this example, the p channel type TFT or the n channel TFT produced by a known method is used for the driving TFT 4201, and a p channel type TFT produced by a known method is used for the current controlling TFT 4202. Moreover, the pixel part 4002 is provided with a maintaining capacity (not shown) connected with the gate of the current controlling TFT 4202.

An interlayer insulated film (flattening film) 4301 is formed on the driving TFT 4201 and the current controlling TFT 4202, with a pixel electrode (anode) 4203 electrically connected with the drain of the current controlling TFT 4202 formed thereon. As the pixel electrode 4203, a transparent conductive film having a large work function is used. As the transparent conductive film, a compound of an indium oxide and a tin oxide, a compound of an indium oxide and a zinc oxide, a zinc oxide, or an indium oxide can be used. Moreover, the above-mentioned transparent conductive film with a gallium added can be used as well.

Furthermore, the insulated film 4302 is formed on the pixel electrode 4203, and the insulated film 4302 has an opening part formed on the pixel electrode 4203. At the opening part, an organic light emitting layer 4204 is formed on the pixel electrode 4203. For the organic light emitting layer 4204, a known organic light emitting material or inorganic light emitting material can be used. Moreover, the organic light emitting material includes both a low molecular type (monomer type) and high molecular type (polymer type) materials, and either one can be used.

As to the method for forming the organic light emitting layer 4204, a known deposition technique or application method technique can be used. Moreover, as to the organic light emitting layer structure, a laminated structure or a single layer structure provided by a free combination of a hole injecting layer, a positive hole transporting layer, a light emitting layer, an electron transporting layer, and an electron injecting layer.

A cathode 4205 made of a conductive film having the light blocking property (representatively a conductive film containing as the main component an aluminum, a copper, or a silver, or a laminated film of them and another conductive film) is formed on the organic light emitting layer 4204. Moreover, it is preferable to exclude the moisture content or the oxygen existing on the interface between the cathode 4205 and the organic light emitting layer 4204 as much as possible. Therefore, a scheme of forming the organic light emitting layer 4204 with a nitrogen or a rare gas atmosphere so that the cathode 4205 can be formed without contact with the oxygen or the moisture content, is necessary. In this example, the above-mentioned film formation is enabled by using a multi chamber method (cluster tool method) film forming device. A predetermined voltage is applied to the cathode 4205.

As mentioned above, the OLED 4303 comprising the pixel electrode (anode) 4203, the organic light emitting layer 4204, and the cathode 4205 can be formed. Furthermore, a protection film 4303 is formed on the insulated film 4302 so as to cover the OLED 4303. The protection film 4303 is effective for preventing entrance of the oxygen, the moisture content, or the like to the OLED 4303.

The numeral 4005*a* is a lead wiring connected with the power source supply line, connected electrically with the source area of the current controlling TFT 4202. The lead line 4005*a* disposed between the sealing material 4009 and the substrate 4001 is connected electrically with the FPC wiring 4301 of the FPC 4006 via the anisotropic conductive film 4300.

For the sealing material 4008, a glass material, a metal material (representatively, a stainless steel material), a ceramic material, or a plastic material (including a plastic film) can be used. For the plastic material, an FRP (fiberglass-reinforced plastics) plate, a PVF (polyvinyl fluoride) film, a Mylar film, a polyester film, or an acrylic resin film can be used. Moreover, a sheet with a structure with an aluminum foil interposed by PVF films or Mylar films can be used as well.

However, in the case the light radiation direction from the OLED is toward the cover material side, the cover material should be transparent. In this case, a transparent substance, such as a glass plate, a plastic plate, a polyester film, or an acrylic film is used.

Moreover, for the filling material 4210, in addition to an inert gas such as a nitrogen and an argon, an ultraviolet ray hardening resin or a thermosetting resin can be used. Examples thereof include a PVC (polyvinyl chloride), an acrylic, a polyimide, an epoxy resin, a silicon resin, a PVB (polyvinyl butylal), or an EVA (ethylene vinyl acetate). In this example, as the filling material, a nitrogen was used.

Furthermore, in order to expose the filling material 4210 to a moisture absorbing substance (preferably a barium oxide) or a substance capable of adsorbing the oxygen, a recess part 4007 is provided in the sealing material 4008 on the substrate 4001 side for disposing a moisture absorbing substance or a substance capable of absorbing the oxygen 4207. Then, in order to prevent scattering of the moisture absorbing substance or the substance capable of absorbing the oxygen 4207, the moisture absorbing substance or the substance capable of absorbing the oxygen 4207 is kept in the recess part 4007 by a recess part cover material 4208. The recess part cover material 4208 has a fine mesh-like shape such that passage of the air or the moisture content is allowed but passage of the moisture absorbing substance or the substance capable of absorbing the oxygen 4207 is not allowed. By providing the moisture absorbing substance or the substance capable of absorbing the oxygen 4207, deterioration of the OLED 4303 can be restrained.

As shown in FIG. 24C, simultaneously with the formation of the pixel electrode 4203, a conductive film 4203*a* is formed in contact with the lead wiring 4005*a*.

Moreover, the anisotropic film 4300 has a conductive filler 4300*a*. By thermally pressing the substrate 4001 and the FPC 4006, the conductive film 4203*a* on the substrate 4001 and the wiring for the FPC 4301 on the FPC 4006 can be connected electrically by the conductive filler 4300*a*.

The configuration of this example can be executed freely as a combination with any of the examples 1 to 11.

Example 13

In this example, an example of the configuration of the pixel of the light emitting device of the present invention different from that of FIG. 2, 7, or 8 will be explained.

Figure 30A:
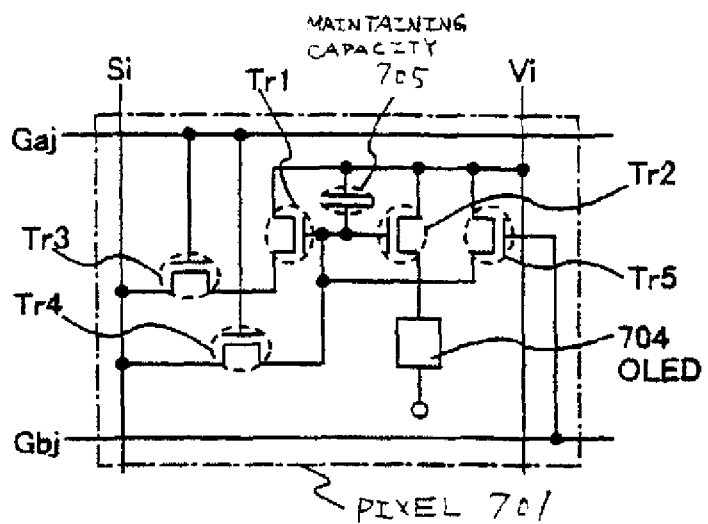
FIGS. 30A to 30C are circuit diagrams of a pixel of a light emitting device of the present invention.

FIG. 30A shows the configuration of the pixel of this example. The pixel 701 shown in FIG. 30A has a signal line Si (one of the S1 to Sx), the first scanning line Gaj (one of the Ga1 to Gay), the second scanning line Gbj (one of the Gb1 to Gby), and a power source line Vi (one of the V1 to Vx). The number of the first scanning lines and the second scanning lines provided in the pixel part need not to be always the same number.

Moreover, the pixel 701 has at least a transistor Tr1 (the first current driving transistor or the first transistor), a transistor Tr2 (the second current driving transistor or the second transistor), a transistor Tr3 (first switching transistor or the third transistor), a transistor Tr4 (second switching transistor or the fourth transistor), a transistor Tr5 (transistor for erasure, or the fifth transistor), an OLED 704 and a maintaining capacity 705.

The gate electrodes of the transistor Tr3 and the transistor Tr4 are both connected with the first scanning line Gaj.

One of the source area and the drain area of the transistor Tr3 is connected with the signal line Si, and the other one is connected with the drain area of the transistor Tr1. Moreover, one of the source area and the drain area of the transistor Tr4 is connected with the signal line Si, and the other one is connected with the gate electrode of the transistor Tr1.

The gate electrodes of the transistor Tr1 and the transistor Tr2 are connected with each other. Moreover, the source areas of the transistor Tr1 and the transistor Tr2 are both connected with the power source line Vi.

The drain area of the transistor Tr2 is connected with a pixel electrode of the OLED 704.

The gate electrode of the transistor Tr5 is connected with the second scanning line Gbj. Moreover, one of the source area and the drain area of the transistor Tr5 is connected with the power source line Vi, and the other one is connected with the gate electrodes of the transistor Tr1 and the transistor Tr2.

The potential of the power source line Vi (power source potential) is maintained at a constant level. Moreover, the potential of the counter electrode is maintained at a constant level as well.

The transistor Tr3 and the transistor Tr4 may either be an n channel type TFT or a p channel type TFT. However, the polarity of the transistor Tr3 and the transistor Tr4 is same.

Moreover, the transistor Tr1 and the transistor Tr2 may either be an n channel type TFT or a p channel type TFT. However, the polarity of the transistor Tr1 and the transistor Tr2 is same. In the case the anode is used as the pixel electrode and the cathode is used as the counter electrode, the transistor Tr1 and the transistor Tr2 are used as the p channel type TFT. In contrast, in the case the anode is used as the counter electrode and the cathode is used as the pixel electrode, the transistor Tr1 and the transistor Tr2 are used as the n channel type TFT.

Moreover, the transistor Tr5 may either be the n channel type TFT or the p channel type TFT.

The maintaining capacity 705 is formed between the gate electrodes of the transistor Tr1 and the transistor Tr2 and the power source line Vi. Although the maintaining capacity 705 is provided for maintaining more securely the voltage (gate voltage) between the gate electrodes of the transistor Tr1 and the transistor Tr2 and the source area, it is not always necessarily provided.

Figure 30B:
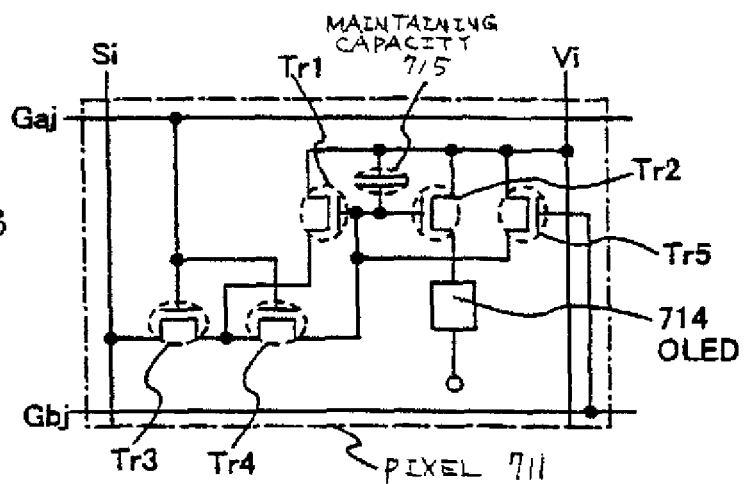

FIG. 30B shows another configuration of the pixel of this example. The pixel 711 shown in FIG. 30B has a signal line Si (one of the S1 to Sx), the first scanning line Gaj (one of the Ga1 to Gay), the second scanning line Gbj (one of the Gb1 to Gby), and a power source line Vi (one of the V1 to Vx).

Moreover, the pixel 711 has at least a transistor Tr1 (the first current driving transistor), a transistor Tr2 (the second current driving transistor), a transistor Tr3 (first switching transistor), a transistor Tr4 (second switching transistor), a transistor Tr5 (transistor for erasure, or the fifth transistor), an OLED 714 and a maintaining capacity 715.

The gate electrodes of the transistor Tr3 and the transistor Tr4 are both connected with the first scanning line Gaj.

One of the source area and the drain area of the transistor Tr3 is connected with the signal line Si, and the other one is connected with the drain area of the transistor Tr1. Moreover, one of the source area and the drain area of the transistor Tr4 is connected with the drain area of the transistor Tr1, and the other one is connected with the gate electrode of the transistor Tr1.

The gate electrodes of the transistor Tr1 and the transistor Tr2 are connected with each other. Moreover, the source areas of the transistor Tr1 and the transistor Tr2 are both connected with the power source line Vi.

The drain area of the transistor Tr2 is connected with a pixel electrode of the OLED 714. The potential of the power source line Vi (power source potential) is maintained at a constant level. Moreover, the potential of the counter electrode is maintained at a constant level as well.

The gate electrode of the transistor Tr5 is connected with the second scanning line Gbj. Moreover, one of the source area and the drain area of the transistor Tr5 is connected with the power source line Vi, and the other one is connected with the gate electrodes of the transistor Tr1 and the transistor Tr2.

The transistor Tr3 and the transistor Tr4 may either be an n channel type TFT or a p channel type TFT. However, the polarity of the transistor Tr3 and the transistor Tr4 is same.

Moreover, the transistor Tr1 and the transistor Tr2 may either be an n channel type TFT or a p channel type TFT. However, the polarity of the transistor Tr1 and the transistor Tr2 is same. In the case the anode is used as the pixel electrode and the cathode is used as the counter electrode, it is preferable that the transistor Tr1 and the transistor Tr2 are used as the p channel type TFT. In contrast, in the case the anode is used as the counter electrode and the cathode is used as the pixel electrode, it is preferable that the transistor Tr1 and the transistor Tr2 are used as the n channel type TFT.

Moreover, the transistor Tr5 may either be the n channel type TFT or the p channel type TFT.

The maintaining capacity 715 is formed between the gate electrodes of the transistor Tr1 and the transistor Tr2 and the power source line Vi. Although the maintaining capacity 715 is provided for maintaining more securely the voltage (gate voltage) between the gate electrodes of the transistor Tr1 and the transistor Tr2 and the source area, it is not always necessarily provided.

Figure 30C:
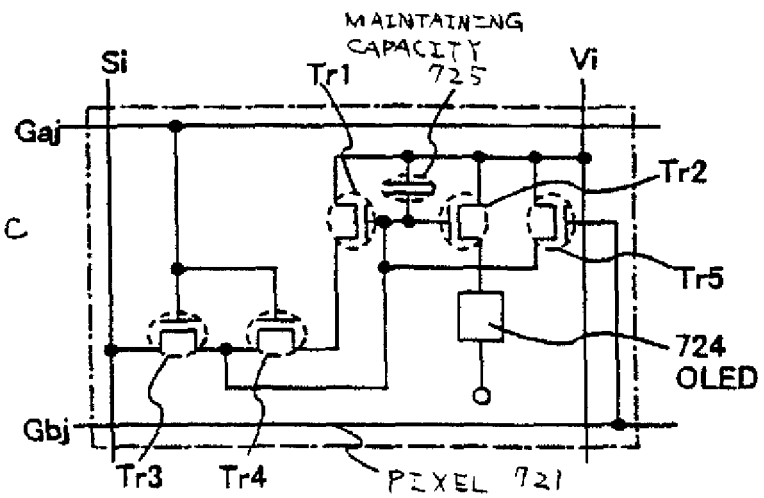

FIG. 30C shows another configuration of the pixel of this example. The pixel 721 shown in FIG. 30C has a signal line Si (one of the S1 to Sx), the first scanning line Gaj (one of the Ga1 to Gay), the second scanning line Gbj (one of the Gb1 to Gby), and a power source line Vi (one of the V1 to Vx).

Moreover, the pixel 721 has at least a transistor Tr1 (the first current driving transistor), a transistor Tr2 (the second current driving transistor), a transistor Tr3 (first switching transistor), a transistor Tr4 (second switching transistor), a transistor Tr5 (transistor for erasure, or the fifth transistor), an OLED 724 and a maintaining capacity 725.

The gate electrodes of the transistor Tr3 and the transistor Tr4 are both connected with the first scanning line Gaj.

One of the source area and the drain area of the transistor Tr3 is connected with the signal line Si, and the other one is connected with the gate electrode of the transistor Tr1. Moreover, one of the source area and the drain area of the transistor Tr4 is connected with the drain area of the transistor Tr1, and the other one is connected with the gate electrode of the transistor Tr1.

The gate electrodes of the transistor Tr1 and the transistor Tr2 are connected with each other. Moreover, the source areas of the transistor Tr1 and the transistor Tr2 are both connected with the power source line Vi.

The drain area of the transistor Tr2 is connected with a pixel electrode of the OLED 724. The potential of the power source line Vi (power source potential) is maintained at a constant level. Moreover, the potential of the counter electrode is maintained at a constant level as well.

The gate electrode of the transistor Tr5 is connected with the second scanning line Gbj. Moreover, one of the source area and the drain area of the transistor Tr5 is connected with the power source line Vi, and the other one is connected with the gate electrodes of the transistor Tr1 and the transistor Tr2.

The transistor Tr3 and the transistor Tr4 may either be an n channel type TFT or a p channel type TFT. However, the polarity of the transistor Tr3 and the transistor Tr4 is same.

Moreover, the transistor Tr1 and the transistor Tr2 may either be an n channel type TFT or a p channel type TFT. However, the polarity of the transistor Tr1 and the transistor Tr2 is same. In the case the anode is used as the pixel electrode and the cathode is used as the counter electrode, it is preferable that the transistor Tr1 and the transistor Tr2 are used as the p channel type TFT. In contrast, in the case the anode is used as the counter electrode and the cathode is used as the pixel electrode, it is preferable that the transistor Tr1 and the transistor Tr2 are used as the n channel type TFT.

Moreover, the transistor Tr5 may either be the n channel type TFT or the p channel type TFT.

The maintaining capacity 725 is formed between the gate electrodes of the transistor Tr1 and the transistor Tr2 and the power source line Vi. Although the maintaining capacity 725 is provided for maintaining more securely the voltage (gate voltage) between the gate electrodes of the transistor Tr1 and the transistor Tr2 and the source area, it is not always necessarily provided.

The driving method for alight emitting device having a pixel, shown in FIGS. 30A, 30B, 30C is limited only to the digital driving method. Furthermore, in the pixel shown in FIGS. 30A, 30B, 30C, by switching on the transistor Tr5 by controlling the potential of the second scanning line Gbj when the OLED 704, 714, 724 is emitting a light, the OLED 704, 714, 724 can be in a non-light emitting state. Therefore, since the display period of each pixel can be finished forcibly simultaneously with the input of the digital video signal to the pixel, the display period can be made shorter than the writing period so that it is suitable for driving with a digital video signal of a high bit number.

The configuration of this example can be executed freely as a combination with the configuration shown in the examples 1, 2, 5, 6, 7, 8, 9, 11, 12.

Example 14

Since the light emitting device using the OLED is a spontaneous light emitting type, compared with a liquid crystal display, it has a superior visibility in a bright place, and a wide view angle. Therefore, it can be used for the display part of various kinds of electronic appliances.

As the electronic appliances using the light emitting device of the present invention, a video camera, a digital camera, a goggle type display (head mount display) a navigation system, a sound reproducing device (car audio, audio component, or the like), a lap top type personal computer, a game appliance, a portable information terminal (mobile computer, portable phone, portable type game machine, electronic book, or the like), an image reproducing device comprising a memory medium (specifically, a device for reproducing a memory medium such as a DVD: digital versatile disc, or the like, comprising a display for displaying the image), or the like, can be presented. In particular, since the width of the view angle is important for a portable information terminal with a lot of opportunities for viewing the screen from the oblique direction, it is preferable to use a light emitting device. A specific example of the electronic appliances is shown in FIG. 25.

Figure 25A:
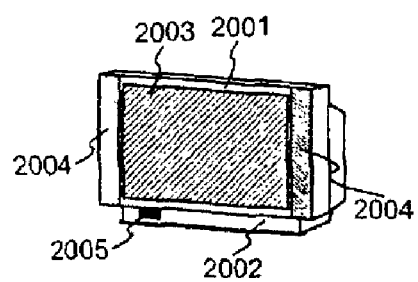
FIGS. 25A to 25H are diagrams of an electronic appliance using the light emitting device of the present invention.

FIG. 25A shows an OLED display device, comprising a housing 2001, a supporting base 2002, a display part 2003, a speaker part 2004, a video input terminal 2005, or the like. The light emitting device of the present invention can be used for the display part 2003. Since the light emitting device is of a spontaneous light emitting type, backlighting is not necessary, and thus a display part thinner than a liquid crystal display can be provided. The OLED display device includes all the display devices for displaying information, such as a personal computer, a TV broadcast receipt, and an advertisement display.

Figure 25B:
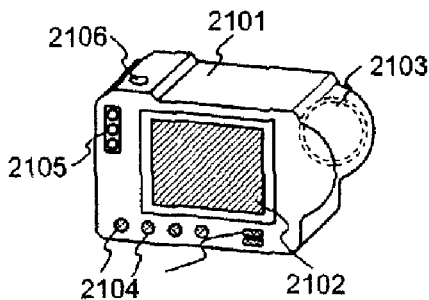

FIG. 25B shows a digital still camera, comprising a main body 2101, a display part 2102, an image receiving part 2103, an operation key 2104, an outside connection port 2105, a shutter 2106, or the like. The light emitting device of the present invention can be used for the display part 2102.

Figure 25C:
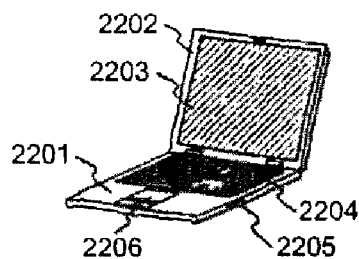

FIG. 25C shows a lap top type personal computer, comprising a main body 2201, a housing 2202, a display part 2203, a key board 2204, an outside connection port 2205, a pointing mouse 2206, or the like. The light emitting device of the present invention can be used for the display part 2203.

Figure 25D:
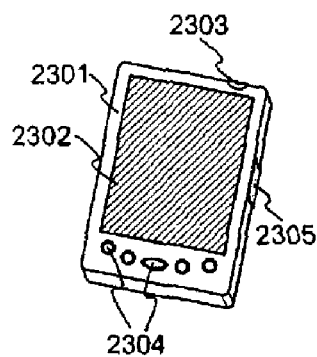

FIG. 25D shows a mobile computer, comprising a main body 2301, a display part 2302, a switch 2303, an operation key 2304, an infrared ray port 2305, or the like. The light emitting device of the present invention can be used for the display part 2302.

Figure 25E:
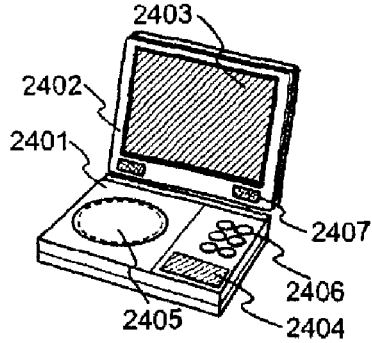

FIG. 25E shows a portable type image reproducing device comprising a memory medium (specifically, a DVD reproducing device), comprising a main body 2401, a housing 2402, a display part A 2403, a display part B 2404, a memory medium (DVD, or the like), a reading part 2405, an operation key 2406, a speaker 2407, or the like. The display part A 2403 displays mainly the image information, and the display part B 2404 displays mainly the character information. The light emitting device of the present invention can be used for the display parts A, B 2403, 2404. The image reproducing device comprising the memory medium includes a domestic game appliance.

Figure 25F:
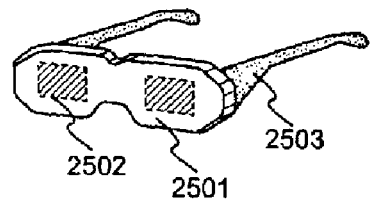

FIG. 25F shows a goggle type display (head mount display), comprising a main body 2501, a display part 2502, and an arm part 2503. The light emitting device of the present invention can be used for the display part 2502.

Figure 25G:
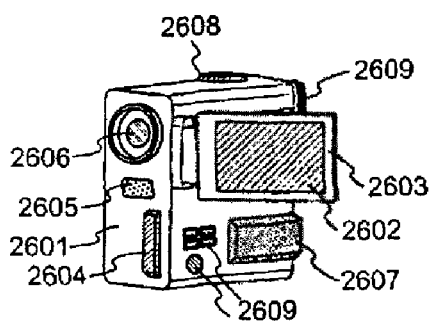

FIG. 25G shows a video camera, comprising a main body 2601, a display part 2602, a housing 2603, an outside connection port 2604, a remote control receiving part 2605, an image receiving part 2606, a battery 2607, a sound input part 2608, an operation key 2609, or the like. The light emitting device of the present invention can be used for the display part 2602.

Figure 25H:
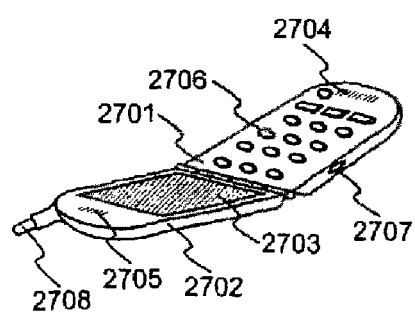
Figure 26:
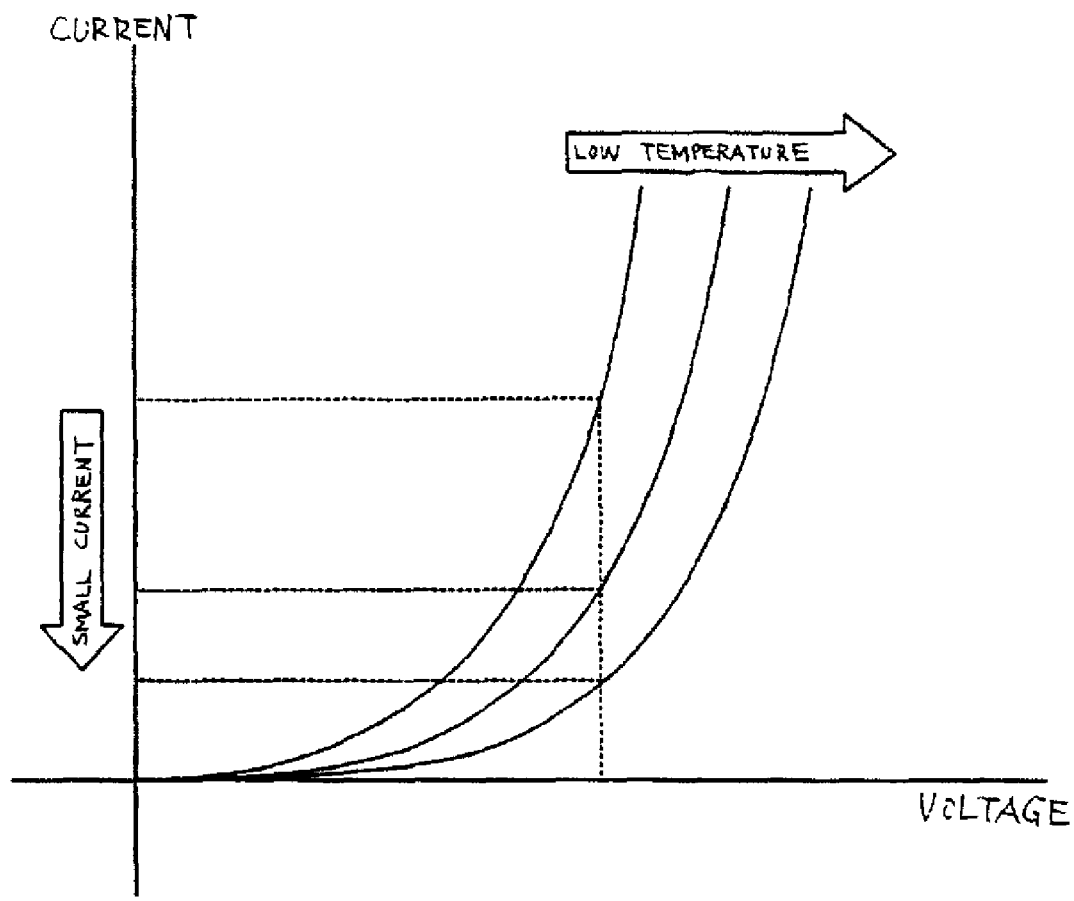
FIG. 26 is a graph showing the voltage current characteristics of the OLED.

Here, FIG. 25H shows a portable phone, comprising a main body 2701, a housing 2702, a display part 2703, a sound input part 2704, a sound output part 2705, an operation key 2706, an outside connection port 2707, an antenna 2708, or the like. The light emitting device of the present invention can be used for the display part 2703. By displaying white characters on a black background in the display part 2703, the current consumption can be restrained for the portable phone.

In the case the light emitting luminance of the organic light emitting material is made higher in the future, it can be used also in a front type or rear type projector by enlarging and projecting a light including the outputted image information by a lens, or the like.

Moreover, in the above-mentioned electronic appliances, the information provided through an electronic communication network, such as the internet and a CATV (cable television) is displayed often, in particular, the opportunities for displaying video information are increased. Since the response speed of the organic light emitting material is extremely high, the light emitting device is preferable for the video display.

Furthermore, since a part emitting a light in the light emitting device consumes the electric power, it is preferable to display the information with the light emitting part reduced to the minimum level. Therefore, in the case the light emitting device is used for the display part mainly having the character information, such as a portable information terminal, in particular, a portable phone, and a sound reproducing device, it is preferable to drive such that the character information is provided as a light emitting part with a non-light emitting part provided as the background.

As heretofore explained, the present invention can be adopted in an extremely wide range, and thus it can be used for the electronic appliances in all the fields. Moreover, the electronic appliance of this example can employ the light emitting device of any configuration shown in the examples 1 to 13.

According to the above-mentioned configuration, the light emitting device of the present invention can obtain a certain luminance without the influence by the temperature change. Moreover, in the color display, even in the case an OLED having different organic light emitting materials for each color is provided, inability of obtaining a desired color by individual change of the OLED luminance of each color due to the temperature can be prevented.

What is claimed is:

1. A method for driving a light emitting device comprising:
   selecting a scanning line to turn on a third transistor and a fourth transistor whose gate electrodes are connected with the scanning line;
   flowing a constant current through a signal line connected with one of a source and a drain of the third transistor and connected with one of a source and a drain of the fourth transistor;
   determining a gate voltage of a first transistor by a value Ic of the constant current wherein a drain of the first transistor is connected with the other of the source and the drain of the third transistor, and a gate of the first transistor is connected with the other of the source and the drain of the fourth transistor;
   determining a gate voltage of a second transistor from the gate voltage of the first transistor wherein a gate of the second transistor is connected with the gate of the first transistor, and a source of the second transistor is connected with a source of the first transistor;
   keeping a drain current of the second transistor same as a drain current of the first transistor;
   flowing the drain current of the second transistor through a light emitting layer in a writing period;
   turning off the third transistor and the fourth transistor;
   keeping the drain of the first transistor floating;
   keeping the gate voltage of the second transistor from the writing period to a display period; and
   keeping the drain current of the second transistor from the writing period to the display period.

2. A method for driving a light emitting device according to claim 1 wherein the third transistor has a same polarity as the fourth transistor.

3. A method for driving a light emitting device according to claim 1 wherein the first transistor has a same polarity as the second transistor.

4. A method for driving a light emitting device according to claim 1 wherein the light emitting device is incorporated into one selected from the group consisting of a digital still camera, a personal computer, a mobile computer, an image reproducing device, a goggle type display, a video camera, and a portable phone.

5. A method for driving a light emitting device according to claim 1 wherein the light emitting layer is provided between a pixel electrode and a counter electrode.

6. A method for driving a light emitting device according to claim 5 wherein the pixel electrode serves as an anode, and the counter electrode serves as a cathode, and the first and second transistors are p channel type TFTs.

7. A method for driving a light emitting device according to claim 5 wherein the pixel electrode serves as a cathode, and the counter electrode serves as an anode, and the first and second transistors are n channel type TFTs.

8. A method for driving a light emitting device according to claim 1 wherein the light emitting layer comprises an organic light emitting layer.

9. A method for driving a light emitting device comprising:
   selecting a scanning line to turn on a third transistor and a fourth transistor whose gate electrodes are connected with the scanning line;
   flowing a constant current through a signal line connected with one of a source and a drain of the third transistor and connected with one of a source and a drain of the fourth transistor;
   determining a gate voltage of a first transistor by a value Ic of the constant current wherein a drain of the first transistor is connected with the other of the source and the drain of the third transistor, and a gate of the first transistor is connected with the other of the source and the drain of the fourth transistor;
   determining a gate voltage of a second transistor from the gate voltage of the first transistor wherein a gate of the second transistor is connected with the gate of the first transistor, and a source of the second transistor is connected with a source of the first transistor;
   keeping a drain current of the second transistor same as a drain current of the first transistor;
   flowing the drain current of the second transistor through a light emitting layer in a writing period;
   turning off the third transistor and the fourth transistor;
   keeping the drain of the first transistor floating;
   keeping the gate voltage of the second transistor from the writing period to a display period; and
   keeping the drain current of the second transistor from the writing period to the display period,
   wherein a capacity is connected between a power source line and the gate of the first transistor and between the power source line and the gate of the second transistor.

10. A method for driving a light emitting device according to claim 9 wherein the third transistor has a same polarity as the fourth transistor.

11. A method for driving a light emitting device according to claim 9 wherein the first transistor has a same polarity as the second transistor.

12. A method for driving a light emitting device according to claim 9 wherein the light emitting device is incorporated into one selected from the group consisting of a digital still camera, a personal computer, a mobile computer, an image reproducing device, a goggle type display, a video camera, and a portable phone.

13. A method for driving a light emitting device according to claim 9 wherein the light emitting layer is provided between a pixel electrode and a counter electrode.

14. A method for driving a light emitting device according to claim 13 wherein the pixel electrode serves as an anode, and the counter electrode serves as a cathode, and the first and second transistors are p channel type TFTs.

15. A method for driving a light emitting device according to claim 13 wherein the pixel electrode serves as a cathode, and the counter electrode serves as an anode, and the first and second transistors are n channel type TFTs.

16. A method for driving a light emitting device according to claim 9 wherein the light emitting layer comprises an organic light emitting layer.

\* \* \* \* \*

UNITED STATES PATENT AND TRADEMARK OFFICE
CERTIFICATE OF CORRECTION

PATENT NO. : 8,120,557 B2  
APPLICATION NO. : 12/760598  
DATED : February 21, 2012  
INVENTOR(S) : Jun Koyama It is certified that error appears in the above-identified patent and that said Letters Patent is hereby corrected as shown below:

Column 1, line 35, replace "alight" with -- a light --

Column 2, line 64, replace "DIED" with -- OLED --

Column 11, line 40, replace "far" with -- for --

Column 16, line 20, replace "polyimide" with -- polyamide --

Column 21, line 15, replace "Trivia" with -- Tr1 via --

Column 21, line 29, replace "filth" with -- film --

Column 22, line 64, replace "butane" with -- butene --

Column 25, line 46, replace "LATE-1" with -- LATB-1 --

Column 30, line 50, replace "alight" with -- a light --

Column 35, line 37, replace "alight" with -- a light --

Signed and Sealed this  
Twenty-eighth Day of August, 2012

David J. Kappos  
*Director of the United States Patent and Trademark Office*